United States Patent
Tomishima et al.

(10) Patent No.: US 6,314,042 B1
(45) Date of Patent: *Nov. 6, 2001

(54) FAST ACCESSIBLE SEMICONDUCTOR MEMORY DEVICE

(75) Inventors: Shigeki Tomishima; Tsukasa Ooishi; Hiroshi Kato, all of Hyogo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/181,675

(22) Filed: Oct. 29, 1998

(30) Foreign Application Priority Data

May 22, 1998 (JP) .................................. 10-141532

(51) Int. Cl.[7] ........................................... G11C 8/00
(52) U.S. Cl. ..................... 365/230.03; 365/63; 365/51
(58) Field of Search ............................. 365/230.03, 63, 365/51

(56) References Cited

U.S. PATENT DOCUMENTS

| | | | |
|---|---|---|---|
| 5,363,339 | 11/1994 | Fujita | 365/230.06 |
| 5,499,215 | * 3/1996 | Hatta | 365/230.03 |
| 5,590,086 | * 12/1996 | Park et al. | 365/230.03 |
| 5,774,408 | * 6/1998 | Shirley | 365/230.03 |

* cited by examiner

*Primary Examiner*—Richard Elms
*Assistant Examiner*—VanThu Nguyen
(74) *Attorney, Agent, or Firm*—McDermott, Will & Emery

(57) ABSTRACT

A memory array is divided into a plurality of memory sub blocks in row and column directions. A column selection line is provided in the column direction in a region between blocks. A block decoding circuit generating a local column selection signal is arranged corresponding to each of the memory sub blocks. A main I/O line pair group is provided for each of the memory sub blocks and each column of the memory sub block is connected to the corresponding main I/O line pair in accordance with the local column selection line. Thus, data with a desired bit width can be produced without any increase in area occupied by the array nor decrease in the speed of column access.

14 Claims, 31 Drawing Sheets

FAST ACCESSIBLE SEMICONDUCTOR MEMORY DEVICE

BACKGROUND OF THE INVENTION

1. Field of the Invention

The present invention relates to semiconductor memory devices, and more particularly, to an arrangement of a memory array readily allowing expansion of a data bit width and enabling fast data access.

2. Description of the Background Art

FIG. 52 is a diagram schematically showing an arrangement of an array mat of a conventional semiconductor memory device (a DRAM: a Dynamic Random Access Memory) having 64-M bit storage capacity. Referring to FIG. 52, a semiconductor memory device CH includes four memory mats MTa to MTd each having 16-M bit storage capacity. Peripheral circuits PHa to PHc each are arranged in a central region among memory mats MTa to MTd. Peripheral circuit PHa includes a circuit for controlling an access operation for memory mats MTa to MTd. Peripheral circuits PHb and PHc include a data input/output circuit and an external signal input circuit for producing an internal signal for peripheral circuit PHa.

As shown in FIG. 52, the memory array is so divided into four memory mats MTa to MTd as to reduce the lengths of word and bit lines respectively arranged corresponding to a row of and a column of memory cells, thereby enabling memory cell selection operation at high speed.

FIG. 53 is a diagram showing an arrangement of memory mats MTa to MTd shown in FIG. 52. One memory mat MT is shown in FIG. 53. As shown in FIG. 53, memory mat MT is divided into sixteen memory sub blocks MSB by word line shunt regions WS in a row direction, and also divided into thirty-two memory sub blocks MSB by sense amplifier bands SAB in a column direction. A column selection line CSL is provided extending from a column decoder CD arranged on one side of memory mat MT in the column direction, and shared by memory sub blocks MSB aligned in the column direction. A column selection signal from column decoder CD is transmitted onto column selection line CSL. Here, the word line shunt region corresponds to a region where a gate electrode layer formed of a material having a relatively high resistance such as polysilicon and having the memory cells connected thereto, and a low resistance conductive layer provided above the gate electrode layer and formed, for example, of aluminum are electrically connected. By connecting the upper low resistance conductive layer and the lower gate electrode layer in word line shunt region WS, a resistance of the word line is equivalently reduced. Sense amplifier band SAB includes sense amplifier circuits arranged corresponding to the columns of memory sub blocks MSB for sensing, amplifying and latching memory cell data of corresponding columns when activated.

Memory mat MT is divided into 16·32=512 memory sub blocks MSB. Memory sub blocks MSB includes 32K memory cells arranged in 256 rows·128 columns. By dividing memory mat MT into a plurality of memory sub blocks MSB, only the memory sub block that includes a selected memory cell is driven so that current consumption is reduced. In addition, the number of memory cells connected to a bit line (the memory cell column) in the selected memory sub block is reduced so that proportionate reduction in bit line capacitance is achieved, thereby increasing a read voltage appearing on the bit line at the time of memory cell selection.

FIG. 54 is a diagram showing in further detail the arrangement of memory mat MT shown in FIG. 53. In FIG. 54, two memory sub blocks MSBa and MSBb included in memory mat MT are shown. Local I/O line pairs LIOa to LIOd are provided which are shared by two memory sub blocks MSBa and MSBb aligned in the row direction. Local I/O line pairs LIOa to LIOd extend along memory sub blocks MSBa and MSBb in the column direction, and another local I/O line pair is provided for an adjacent memory sub block, which is not shown in the drawing.

Word line shunt region WS is provided between memory sub blocks MSBa and MSBb, in which main I/O line pairs MIOa to MIOd are arranged. These main I/O line pairs MIOa to MIOd are shared by memory sub blocks aligned in the column direction. The local I/O line pairs provided for the memory sub block selected by the row decoder, not shown, are connected to the main I/O line pairs.

A column selection signal from a column decoding circuit CDK included in column decoder CD is transmitted onto column selection line CSL arranged over the memory sub blocks in the column direction. Column selection line CSL is shared by the memory sub blocks aligned in the column direction, for transmitting the column selection signal to the memory sub blocks. Main amplifiers MAPa to MAPd are respectively provided for main I/O line pairs MIOa to MIOd, for performing amplification of data on the main I/O line pairs when activated.

In the arrangement shown in FIG. 54, when column selection line CSL is selected, the memory cells corresponding to four columns are selected in memory sub block MSBb. Thereafter, the columns are respectively connected to local I/O lines LIOa to LIOd, and then to main I/O line pairs MIOa to MIOd.

Eight such arrangements shown in FIG. 54 are provided in the row direction. In the case of a four way method where four sense amplifiers (columns) are selected by a single column selection line CSL and connected to the local I/O line pairs, eight memory sub blocks are connected to the main I/O line pairs through the local I/O line pairs in sixteen memory sub blocks, and 4·8=32-bit data can be simultaneously selected in total. In this case, 2K(=128·16) sense amplifiers are provided in the row direction and memory cell data is latched at each sense amplifier. Therefore, 32-bit data designated by a column address is selected out of 2-Kbit data.

As shown in FIG. 52, four memory mats MT are provided in the semiconductor memory device, so that 128-bit word data can be transferred in a chip. When the mat is used as a bank, data of 32-bit word per bank is input/output.

FIG. 55 is a diagram schematically showing an arrangement of a mat of a conventional 256-M bit DRAM. Referring to FIG. 55, the DRAM includes memory mats MT0 to MT7 aligned in the row direction and memory mats MT8 to MT15 arranged facing to memory mats MT0 to MT7. Peripheral circuitry PH is provided in the row direction between memory mats MT0 to MT7 and MT8 to MT15. Peripheral circuitry PH includes a data input/output circuit and an address signal and external control signal input circuit.

Each of memory mats MT0 to MT15 has 16-M bit storage capacity. Main word driver groups MWD are arranged between the adjacent memory mats. In the 256-M bit DRAM, in order to drive word lines into a selected state at high speed, a hierarchical structure of main and sub word lines is employed. A memory cell is connected to the sub word line, but not to the main word line. A sub word line driver is arranged between the main and sub word lines. The main word line of small load capacitance is driven into the selected state at high speed and, responsibly, the sub word line provided at the remote end thereof is also driven into the selection state at high speed.

Each of memory mats MT0 to MT15 shown in FIG. 55 is divided into a plurality of memory sub blocks MSB in the row and column directions as in the case of the above mentioned memory mats shown FIGS. 53 and 54. The memory sub block is increased in size with the provision of the sub word line drive circuit, so that it has 128-Kbit (512 rows·256 columns) storage capacity, or a double storage capacity of the arrangement shown in FIGS. 53 and 54. Thus, memory mat MT (MT0 to MT15) is divided into eight memory sub blocks in the row direction. The arrangements of the local I/O line pairs and global I/O line pairs are the same as those shown in FIG. 54. Accordingly, 4·4=16-bit memory cells are selected in a single mat for data input/output. When the DRAM shown in FIG. 55 has a four-bank structure, data of 64-bit word per bank can be input/output as a single bank is formed of four memory mats.

In the conventional semiconductor memory device (DRAM), data input/output is performed through the main I/O line pairs arranged in the word line shunt regions or the sub word line driver regions. To perform data transfer at high speed between the DRAM and a processor provided outside the DRAM, desirably, the data bit width is as wide as possible. A number of data words can be transferred in a single data transfer cycle. In the conventional DRAM, however, the bit width of the data word cannot be sufficiently wide.

Generally, an SDRAM (a Synchronous DRAM) has four banks, an RDRAM (a Rambus DRAM) with sixteen banks and an SLDRAM (a Sync Link DRAM) with eight banks. With these multiple-bank structures, increase in access time is prevented, which increase is caused by driving a selected word line into a non-selected state and then driving another word line (row) into a selection state at the time of page boundary access. More specifically, successive access is accomplished without any increase in access time at the time of page switching by sequentially driving a plurality of banks into an active state in an interleaved manner and accessing another bank at the time of page switching. If a large number of banks are provided, even when a plurality of clock cycles are required for row selection operation, bank access is performed for each clock cycle by sequentially driving the banks into the selected state, so that the DRAM can be operated in accordance with a clock signal at high speed.

Therefore, recently, the number of banks provided in the semiconductor memory device has been on the increase. When the number of banks increases, the number of memory cells allotted to a single bank is reduced, whereby allotting of a sufficient bit width to a single data becomes difficult (when the bit width increases, the number of words stored in a single bank is reduced). When the DRAM shown in FIG. 55 has a four-bank structure, 64-bit word data can be accessed for a single bank. In the case of an eight-bank structure, however, the memory cells are only selected from two memory mats, so that no more than 32-bit word data can be accessed for one bank.

To achieve high speed data transfer between the processor and the DRAM, generally, a plurality of data are internally prefetched. The prefetched data are sequentially transmitted in synchronization with a clock signal.

FIG. 56 is a diagram schematically showing an arrangement of a data reading portion of a conventional clock synchronous semiconductor memory device (a synchronous DRAM). Referring to FIG. 56, a plurality of data simultaneously read from a memory bank BK are latched at a latch circuit LK. Latch circuit LK sequentially applies the latched data to a transfer circuit TK in accordance with a selection signal $\phi$sel. Transfer circuit TK transfers data applied from latch circuit LK in synchronization with a clock signal CLK for outputting through an output circuit which in turn is not shown in the drawing.

Generally, the longest time is required for a path through which data is transferred from a sense amplifier in memory bank BK (one or a plurality of memory mats) to latch circuit LK, or a path for transmitting data latched at the sense amplifier to a main amplifier through an internal main I/O line pair. By simultaneously transferring a plurality of data to latch circuit LK and sequentially selecting and outputting them in synchronization with clock signal CLK, the longest delay due to data transfer from memory bank BK to latch circuit LK is apparently avoided. A number of data are desirably latched at latch circuit LK and sequentially transferred in order to increase the speed of data transfer. Especially in the recent clock synchronous DRAM, data input/output is performed in a DDR (Double Data Rate) method and external data is transferred in synchronization with both rising and falling edges of a clock signal. When data transfer is performed at a doubled speed of such clock signal, for example, two latch circuits LK are provided so that data are alternatively transferred to and latched at the latch circuits and then sequentially transferred. In this way, data transfer at high speed can be achieved without being affected by the path associated with the longest delay. In such high speed data transfer, in order to prefetch a number of data, the bit number of data word is limited as the number of main I/O line pairs remains constant. Therefore, the bit number of data word to be externally transferred in one clock cycle is limited and high speed transfer cannot be achieved.

In addition, although the development of the processing technique has allowed fine design rule, chip size is increasingly becoming large due to increase in storage capacity. In order to make the chip size as small as possible to achieve reduction in cost, division units of bit and word lines are increased for larger storage capacity of a memory sub block and the number of circuits other than the memory cells are reduced to achieve reduction in area occupied by a peripheral circuit. The increase in division units of bit and word lines equals to the reduction in number of the regions between the blocks, that is, the regions in which the main I/O line pairs are arranged. Therefore, even when the size of the memory mat, the number of sense amplifiers activated at a time and the data bit number latched at a time are increased, the data bit number which is allowed to be transferred outside the memory array is limited by the number of main I/O line pairs. To solve this problem, the number of interconnection lines can be increased by increasing the area for arranging the local and main I/O line pairs, that is, the layout area for the sense amplifier band, sub word line dliver, and such. In this case, however, it is apparent that the increase in chip size is inevitable due to the increase in layout area.

Therefore, the problem associated with the array arrangement of the conventional semiconductor memory device is that the data word with a sufficient bit width cannot be generated and high speed data transfer cannot be achieved.

Further, when storage capacity is increased, the size of the memory mat also increases in the column direction. Referring now to FIG. 57, a memory sub block MSB0 arranged farthest away from a column decoder and a memory sub block MSBn closest to the column decoder will be considered. These memory sub blocks MSB0 and MSBn are aligned in the column direction and shares a column selection line CSL transmitting a column selection signal from the column decoder, which column decoder is not shown in the drawing. Local I/O line pairs LIO0 and LIOn are respectively provided for memory sub blocks MSB0 and MSBn, and a main I/O line pair MIO is so arranged as to be shared by memory sub blocks MSB0 and MSBn. A main amplifier MAP and a write driver WRD are provided for main I/O line pair MIO.

In the synchronous semiconductor memory device, data reading/writing is performed by simultaneously applying a read/write command and a column address. In writing, data write driver WRD is activated for transmitting write data to main I/O line pair MIO. In writing data to memory sub block MSB0, data from write driver WRD is transmitted to a sense amplifier provided in memory sub block MSB0. Similarly, in writing data to memory sub block MSBn, write data from write driver WRD is transferred to a sense amplifier provided in memory sub block MSBn. A signal propagation delay Td is caused by interconnection line capacitance and resistance of main I/O line pair MIO. When the memory mat is increased in size in the column direction due to increase in storage capacity, there would be a proportionate increase in length of the main I/O line pair and in signal propagation delay Td. As the time required for data writing is determined in consideration of the worst case, write operation cannot be completed unless at least delay time Td is elapsed after write driver WRD is activated (actually, signal propagation delay caused between the sense amplifier and the main I/O line pair is also considered). A command designating next operation mode must be applied after the data writing is completed. This is the same in the case where read data is transmitted to main amplifier MAP at the time of data reading and the time required for data reading is determined by delay time Td, whereby the length of so-called CAS latency cannot be reduced. This means that the signal propagation time for a transfer path from memory bank BK to latch circuit LK is increased, not enabling high speed data reading.

SUMMARY OF THE INVENTION

An object of the present invention is to provide a semiconductor memory device enabling high speed data transfer.

Another object of the present invention is to provide a semiconductor memory device allowing significant increase in data bit number which can be simultaneously transferred inside a chip while preventing increase in chip size.

Still another object of the present invention is to provide a multiplebank semiconductor memory device enabling high speed transfer of a data word having an arbitrary bit width.

A semiconductor memory device according to the present invention includes: a memory array having a plurality of memory blocks aligned in and column directions and each having a plurality of memory cell arranged in a matrix; a plurality of column selection lines arranged outside the memory array and in regions each between the memory blocks and extending in the column direction for transmitting column selection signals; a plurality of internal data lines arranged over the memory blocks in the column direction and grouped corresponding to the column blocks; and a column selection circuit arranged corresponding to the memory blocks, each for selecting a column of a corresponding memory block in accordance with the column selection signal on the column selection line for connecting it to an internal data line of a corresponding group.

By providing column selection lines in the region between the memory blocks and the region outside the memory array and providing the internal data lines extending over the memory array, the number of the internal data lines can be increased without any increase in area occupied by the array and the corresponding increase in the data bit number can be achieved. As a column selection line connects the memory cell columns to a number of internal data lines arranged over the memory blocks, the number of column selection lines is reduced so that increase in the area of the region between the memory blocks can be prevented.

In addition, as the semiconductor memory device is structured to have a plurality of banks and data is pre-read onto the internal data lines, at the time of data writing/reading, write/read circuitry provided for the internal data lines needs only be driven, thereby eliminating the need for accessing inside of the memory blocks. Thus, fast access and high speed data transfer can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
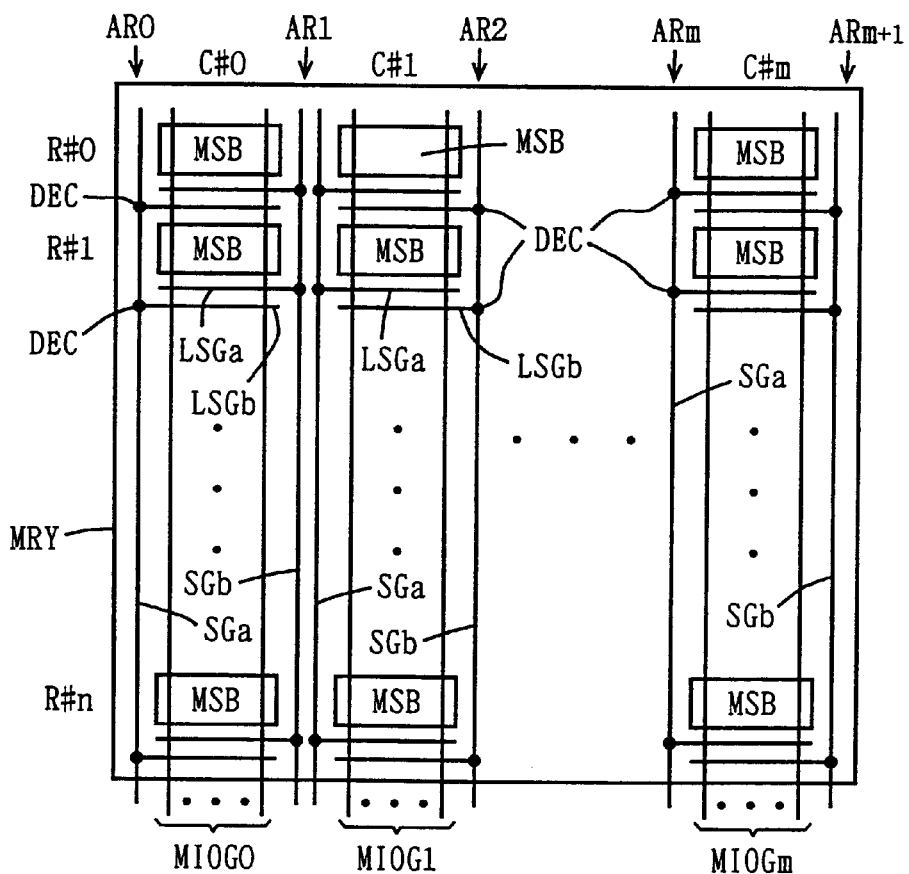
FIG. 1 is a diagram schematically showing an arrangement of an array of a semiconductor memory device in accordance with a first embodiment of the present invention.

Referring to FIG. 1, a memory array MRY includes a plurality of memory sub blocks MSB aligned in row and column directions. Memory sub blocks MSB aligned in the row direction form a row block R#i (i=0 to n), while memory sub blocks MSB aligned in the column direction form a column block C#j (j=0 to m). Each of memory sub blocks MSB has a plurality of memory cells arranged in a matrix of rows and columns.

Main column selection lines SGa and SGb for transmitting column selection signals from a column decoder, not shown, are arranged in regions outside the memory array AR0 and ARn+1 and regions between memory blocks AR1 to ARm. Column selection lines SGa and SGb are arranged extending in the column direction and shared by the memory sub blocks of the corresponding column blocks.

Local column selection lines LSGa and LSGb are provided for each of memory sub blocks MSB. Local column selection lines LSGa and LSGb are provided extending in the row direction only in the region in which the corresponding memory sub blocks are arranged. Local column selection lines LSGa and LSGb are connected to corresponding main column selection lines SGa and SGb through a decoder DEC provided in regions outside array AR0 and ARn+1 and regions between memory blocks AR1 to ARm.

In each of column blocks C#0 to C#m, main I/O line pair groups MIOG0 to MIOGm are arranged extending over memory sub blocks MSB in the column direction. A plurality of columns (sense amplifiers), which are simultaneously selected by local column selection lines LSGa and LSGb, are connected to the corresponding main I/O line pair groups.

What is connected to main column selection lines SGa and SGb is only decoders DEC, but not IO gates for memory cell column selection. Thus, a column selection signal can be transmitted to a farthest end of memory array MRY at high speed because of the small load capacitance of main column selection lines SGa and SGb.

In addition, as the main I/O line pairs are arranged over the memory sub blocks, the required number of main I/O line pairs can be arranged without any increase in area occupied by memory array MRY, thereby increasing data bit number.

Figure 2:
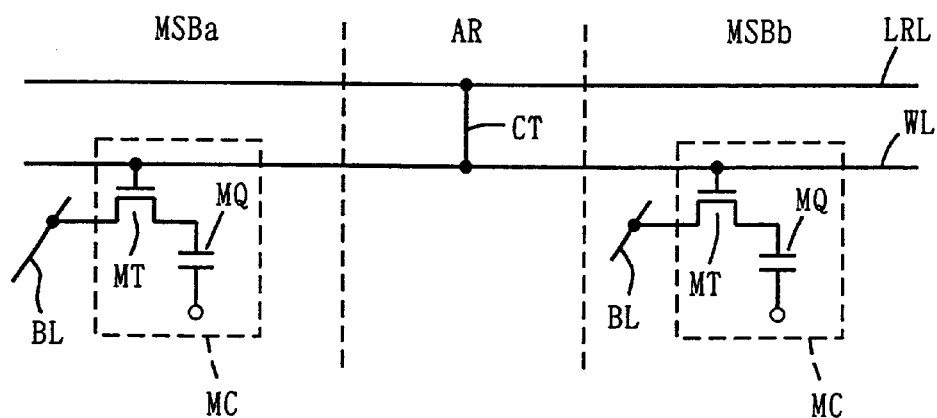
FIG. 2 is a diagram schematically showing an arrangement of a region between memory blocks shown in FIG. 1.

FIG. 2 is a diagram schematically showing an arrangement of a region AR between memory blocks. Inter-block region AR between two memory sub blocks MSBa and MSBb is representatively shown in FIG. 2. Memory cells MC are arranged in a matrix in each of memory sub blocks MSBa and MSBb. Word lines WL are provided corresponding to the rows of the memory cells and bit lines BL (and /BL) are provided corresponding to the columns of the memory cells. In the arrangement shown in FIG. 2, word line WL is shared by the memory sub blocks included in the row block. Memory cell MC includes a capacitor MQ storing information in the form of electric charges, and an access transistor MT responsive to a signal voltage of a corresponding word line WL for connecting capacitor MQ to a corresponding bit line BL (or /BL). Access transistor MT has its gate connected to word line WL (generally, a first level polysilicon layer forming word line WL serves as a control electrode of access transistor MT).

A low resistance interconnection conductor LRL is provided in a layer above word line WL in parallel thereto. Low resistance interconnection conductor LRL is electrically connected to word line WL through a contact CT in inter-block region AR. Thus, a resistance of word line WL is equivalently reduced. Inter-block region AR is generally called a word line shunt region. In the word line shunt region, low resistance interconnection conductor LRL and word line WL are electrically connected, and a memory cell MC is not provided. Therefore, main column selection lines SGa and SGb and decoders DEC can be provided in a relatively sufficient space.

Figure 3:
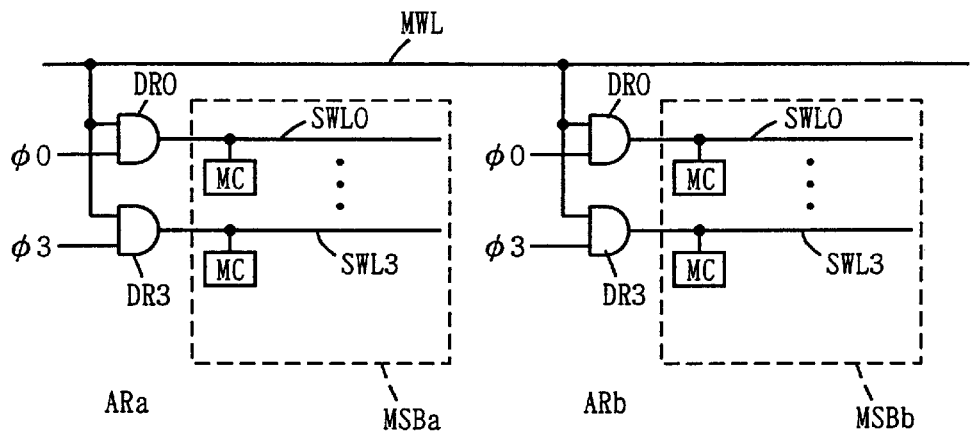
FIG. 3 is a diagram schematically showing another arrangement of the region between blocks shown in FIG. 1.

FIG. 3 is a diagram showing another arrangement of the region between memory blocks. Two memory sub blocks MSBa and MSBb are representatively shown in FIG. 3. A main word line MWL is shared by memory sub blocks MSBa and MSBb aligned in the row direction. Main word line MWL is shared by the memory sub blocks included in the same row block. Sub word lines SWL0 to SWL3 are provided in each of memory sub blocks MSBa and MSBb corresponding to main word line MWL. To each of sub word lines SWL0 to SWL3 memory cells MC of one row in the corresponding memory sub block.

Sub word line drivers DR0 to DR3 are provided respectively corresponding to sub word line SWL0 to SWL3 and receive a signal on main word line MWL and group selection signals φ0 to φ3. At the time of the selection of main word line MWL, four sub word lines SWL0 to SWL3 are designated, one of which is selected by group selection signals φ0 to φ3. Sub word line drivers DR0 to DR3 are arranged in regions ARa and ARb outside memory sub blocks MSBa and MSBb. A main column selection line is provided extending in the column direction in regions ARa and ARb. Decoder DEC, for connecting a main column selection line and a local column selection line, is arranged in a portion where a region between the memory blocks adjacent to each other in the column direction (a sense amplifier band region) and inter-block AR intersect. Decoder DEC can be arranged in a sufficient space as the sub word line driver is not provided in this region.

It is noted that in the arrangement of the array shown in FIG. 3, the sub word line drivers may alternately provided on both sides of the memory sub blocks. Further, one sub word line may be provided corresponding to one main word line MWL in each of the memory sub blocks, so that the word line driver without a decoding function drives the corresponding sub word line.

Inter-block regions AR1 to ARm and regions outside array AR0 and ARn+1 may be any of the word line shunt region shown in FIG. 2 and the sub word line driver arranging region shown in FIG. 3. The inter-memory block region (or inter-block region) will hereinafter refer to any of these regions.

Figure 4:
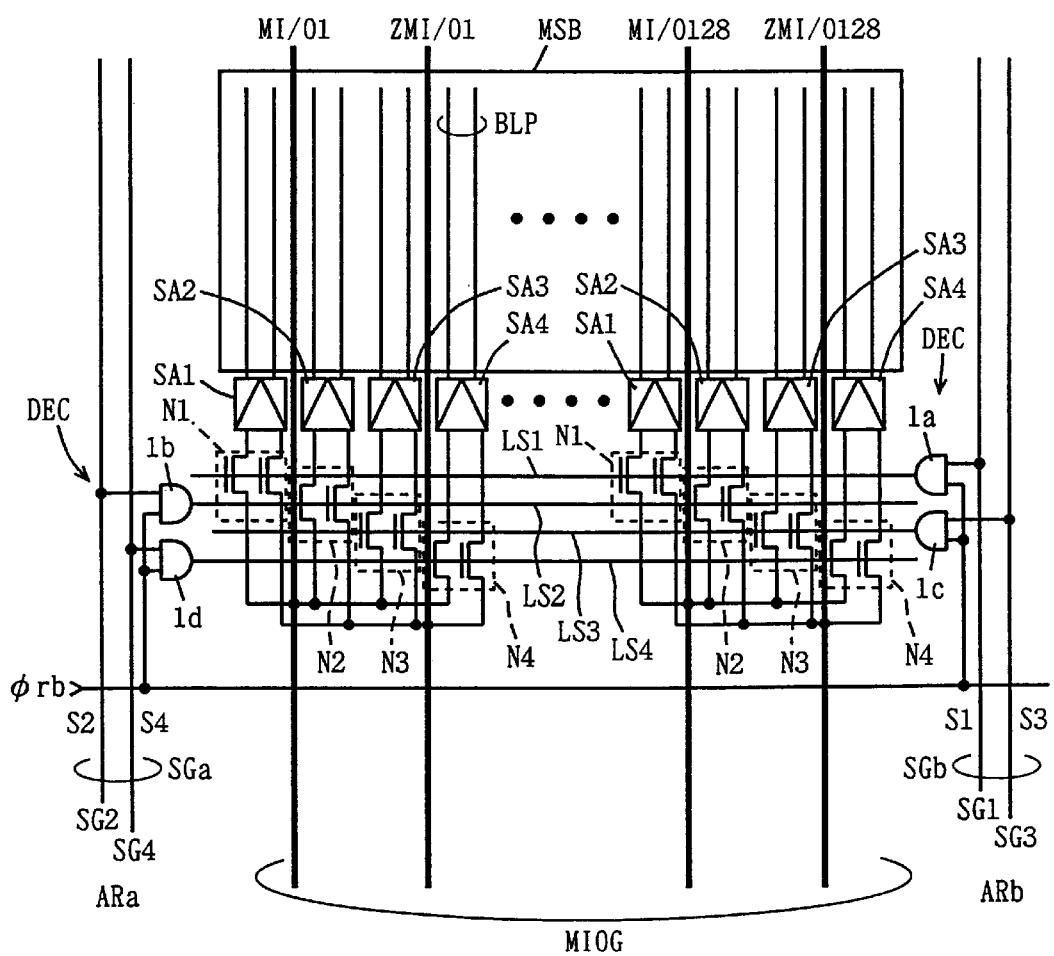
FIG. 4 is a diagram specifically showing an arrangement of a memory sub block of the semiconductor memory device shown in FIG. 1.

FIG. 4 is a diagram schematically showing an arrangement of a portion related to one memory sub block. Referring to FIG. 4, a sense amplifier SA is arranged corresponding to a bit line pair BLP of memory sub block MSB. Sense amplifiers SA are divided into four groups and adjacent sense amplifiers SA1 to SA4 form a set of amplifiers. Sense amplifiers SA1 to SA4 in the set belong to different groups. Main I/O line pairs MI/O1, ZMI/O1 to MI/O128, ZMI/O128 are arranged corresponding to the sets of sense amplifiers. A pair of main I/O lines MI/Oi, ZMI/Oi transmit mutually complementary data.

In the arrangement shown in FIG. 4, 512 sense amplifiers are provided. To select a group of the sense amplifiers, inter-block region ARa includes as decoding circuits DEC: a decoding circuit 1b receiving a column selection signal S2 on a main column selection line SG2 and a row block selection signal φrb for producing a local column selection signal LS2; and a decoding circuit 1d receiving row block selection signal φrb and a column selection signal S4 on a main column selection line SG4 for producing a local column selection signal LS4. Inter-block region ARb includes as decoding circuits DEC: a decoding circuit 1a receiving a column selection signal S1 on a main column selection line SG1 and row block selection signal signal φrb; and a decoding circuit 1c receiving a column selection signal S3 on a main column selection line SG3 and row block selection signal φrb for producing local column selection signal LS3. Row block selection signal φrb selects the row block and is shared by the memory sub blocks included in one row block.

Sense amplifiers SA1 to SA4 are respectively provided with: an I/O selection gate N1 rendered conductive in response to local column selection signal LS1 for connecting corresponding sense amplifier SA1 to the corresponding main I/O line pair; an I/O selection gate N2 rendered conductive in response to local column selection signal LS2 for connecting corresponding sense amplifier SA2 to the corresponding main I/O line pair; an I/O selection gate N3 rendered conductive in response to local column selection signal LS3 for connecting corresponding sense amplifier SA3 to the corresponding main I/O line pair; and an I/O selection gate N4 rendered conductive in response to local column selection signal LS4 for connecting corresponding sense amplifier SA4 to the main I/O line pair.

One of sense amplifiers SA1 to SA4 in a set is selected in accordance with local column selection signals from decoding circuits 1a to 1d and connected to 128 main I/O line pairs MI/O1, ZMI/O1 to MI/O128, ZMI/O128. 128-bit memory cells can be simultaneously selected in one column block and connected to the main I/O line pairs. Main I/O line pairs MI/O1, ZMI/O1 to MI/O128, ZMI/O128 are arranged extending in the column direction and connected to main amplifiers and write drivers provided outside the array.

One memory sub block is divided into four groups and only four main column selection lines are required for a single memory sub block. Thus, the main column selection lines can be provided in a region between memory blocks with a sufficient margin.

It is noted that in the arrangement shown in FIG. 4, memory sub block MSB is divided into four groups, and one of four groups is selected. However, the memory sub block may also be divided into eight, sixteen or two groups and the number of groups is suitably determined in accordance with a data bit number.

Modification

Figure 5:
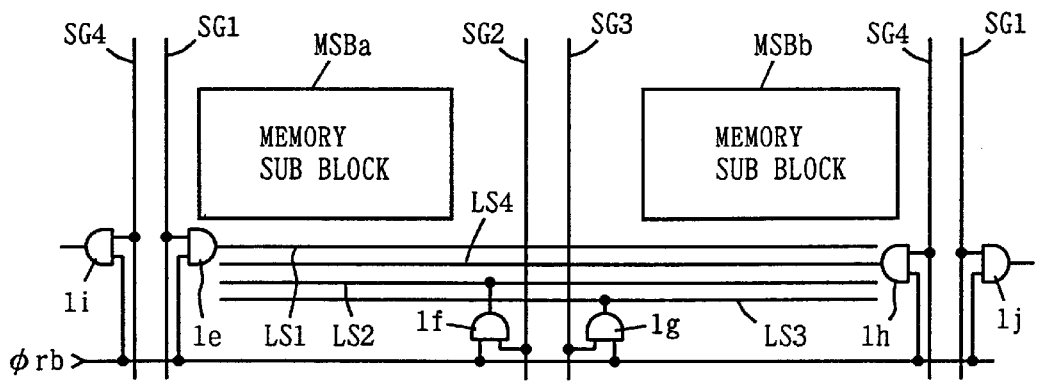
FIG. 5 is a diagram schematically showing a structure for two memory sub blocks shown in FIG. 4.

FIG. 5 is a diagram showing an arrangement of a modification of the semiconductor memory device in accordance with the first embodiment of the present invention. FIG. 5 shows the arrangement of the portion related to two memory sub blocks MSBa and MSBb. In the arrangement shown in FIG. 5, main column selection lines SG1 to SG4 are shared by two memory sub blocks. A decoding circuit 1e produces a local column selection signal LS1 in accordance with a column selection signal on a main column selection line SG1 and a row block selection signal φrb, while a decoding circuit 1f produces a local column selection signal LS2 in accordance with a column selection signal on main column selection line SG2 and row block selection signal φrb. A decoding circuit 1g produces a local column selection signal LS3 in accordance with a column selection signal on main column selection line SG3 and row block selection signal φrb, while a decoding circuit 1h produces a local column selection signal LS4 in accordance with a column selection signal on a main column selection line SG4 and row block selection signal φrb. These local column selection signals LS1 to LS4 are shared by two memory sub blocks MSBa and MSBb. In FIG. 5, decoding circuits 1i and 1j respectively producing local column selection signals LS4 and LS1 for the adjacent memory sub blocks (not shown) are also shown.

In the arrangement shown in FIG. 5, decoding circuits 1e to 1h must drive local column selection signal lines provided extending in the row direction for two memory sub blocks MSBa and MSBb. According to the arrangement, however, the number of the decoding circuits can be reduced to half. The number of the main column selection lines can also be reduced to half. Thus, increase in area occupied by the array can be prevented.

It is noted that in the arrangement shown in FIG. 5, the arrangement of main I/O line pair groups, sense amplifiers and I/O selection gates are the same as those shown in FIG. 4.

As in the foregoing, according to the first embodiment of the present invention, the main I/O line pair is provided extending over the memory sub blocks and the main column selection line is arranged in an inter-block region, whereby data with an arbitrary bit width can be produced without any increase in array area.

In addition, as column selection for a memory sub block is performed in accordance with a decoding result of the column selection signal and the row block selection signal, the I/O selection gate is not connected to the main column selection line, so that reduction in load capacitance is achieved and the main column selection line can be driven into the selected state at high speed.

Second Embodiment

Figure 6:
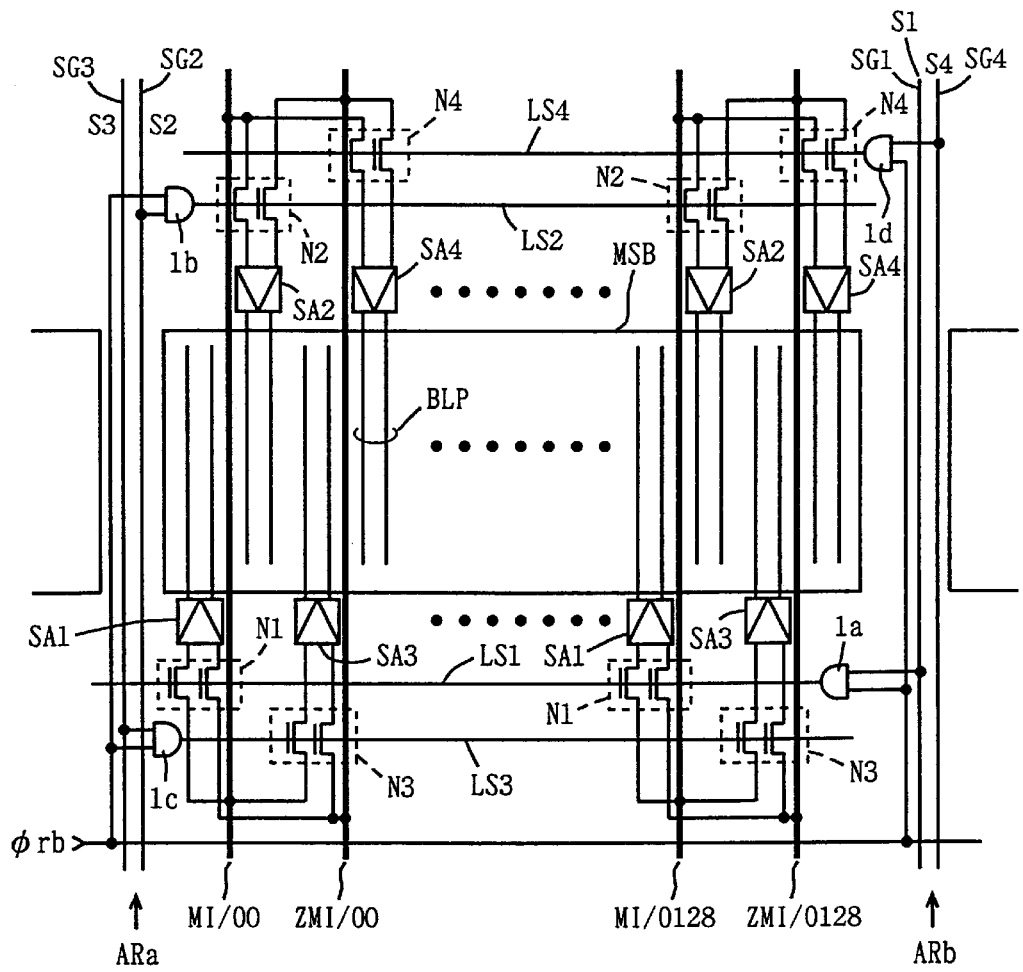
FIG. 6 is a diagram schematically showing an arrangement of a main portion of a semiconductor memory device in accordance with second embodiment of the present invention.

In FIG. 6, an arrangement of a portion related to a single memory sub block is shown. In the arrangement shown in FIG. 6, sense amplifier groups are alternately arranged on either side of memory sub block MSB in the column direction. More specifically, sense amplifiers SA1 and SA3 are provided on the lower side in the column direction of memory sub block MSB, whereas sense amplifiers SA2 and SA4 are arranged on the upper side in the column direction of memory sub block MSB. A set of sense amplifiers includes sense amplifiers SA1 to SA4. Main I/O line pairs MI/O0, ZMI/O0 to MI/O128, ZMI/O128 are provided corresponding to respective sets of sense amplifiers.

Decoding circuits 1a to 1d are distributed corresponding to the alternating arrangement of the sense amplifiers. More specifically, in inter-block region ARa, decoding circuit 1b receiving a row block selection signal φrb and a column selection signal on a main column selection line SG2 for producing a local column selection signal LS2 is provided on the upper side in the column direction of memory sub block MSB and, decoding circuit 1c receiving row block selection signal φrb and a column selection signal S3 on a main column selection line SG3 for producing a local column selection signal LS3 is provided on the lower side in the column direction of memory sub block MSB.

In an inter-block region ARb, decoding circuit 1d receiving a column selection signal S4 on a main column selection line SG4 and row block selection signal φrb for producing a local column selection signal LS4 is provided on the upper side in the column direction of memory sub block MSB and, decoding circuit 1a receiving row block selection signal φrb and a column selection signal S1 on a main column selection line SG1 for producing a local column selection signal LS1 is provided on the lower side in the column direction of a memory sub block MSB.

As decoding circuits 1a to 1d are arranged distributedly for a single memory sub block MSB, a pitch between the decoding circuits in the column direction equals to the size of memory sub block MSB in the column direction. Thus, the decoding circuits can be arranged in inter-block regions ARa and ARb with a sufficient margin.

Figure 7:
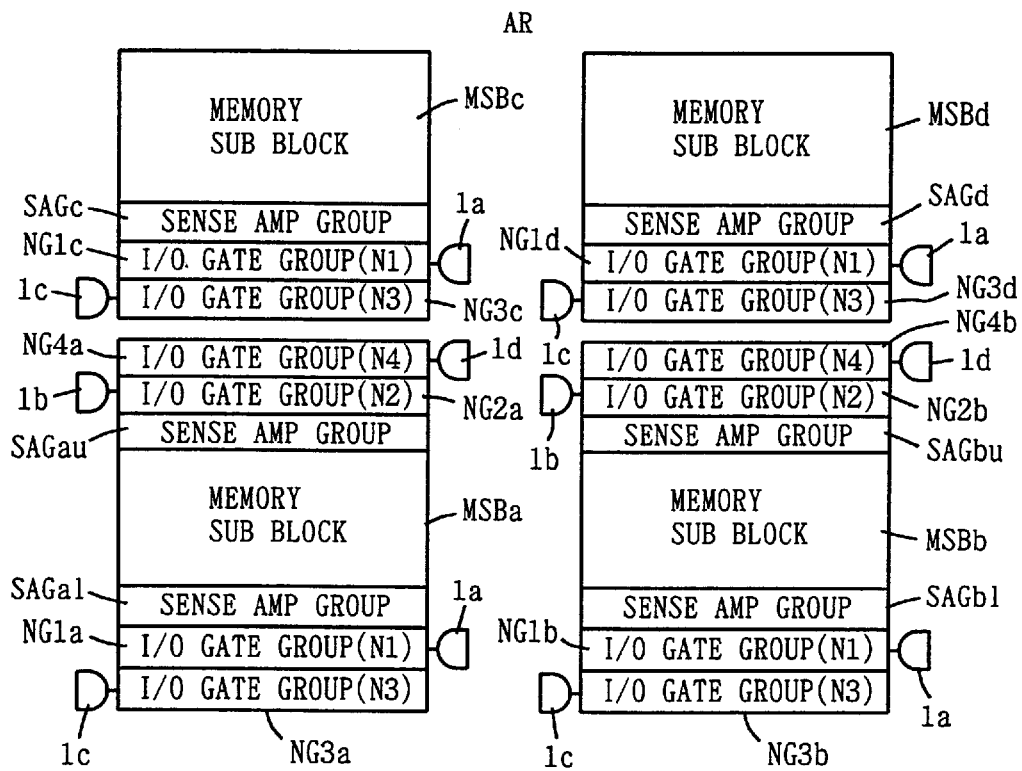
FIG. 7 is a diagram schematically showing an arrangement of a portion related to four memory sub blocks of the semiconductor memory device in accordance with the second embodiment of the present invention.

FIG. 7 is a diagram showing an arrangement of a portion related to memory sub blocks arranged in two rows and two columns. Referring to FIG. 7, a memory sub block MSBa has a sense amplifier group SAGal, an I/O selection gate group (N1) NG1a and an I/O selection gate group (N3) NG3a on its lower side in the column direction, and has a sense amplifier group SAGau, an I/O selection gate group (N2) NG2a and an I/O selection gate group (N4) NG4a on its upper side in the column direction. Decoding circuits 1a to 1d are arranged respectively corresponding to I/O selection gate groups NG1a to NG4a.

For a memory sub block MSBb adjacent to memory sub block MSBa in the column direction, a sense amplifier group SAGb1, an I/O selection gate group (N1) NG1b and an I/O selection gate group (N3) NG3b are provided on its lower side in the column direction, and a sense amplifier group SAGbu, an I/O selection gate group (N2) NG2b and an I/O selection gate group (N4) NG4b are provided on its upper side in the column direction.

A sense amplifier group SAGc, an I/O selection gate group (N1) NG1c and an I/O selection gate group (N3) NG3c are provided on the lower side in the column direction of a memory sub block MSBc which in turn is aligned with memory sub block MSBa in the row direction. A sense amplifier group SAGd, an I/O selection gate group (N1) NG1d and an I/O selection gate group (N3) NG3d are provided on the lower side in the column direction of memory sub block MSBd which in turn is aligned with memory sub block MSBc in the row direction. Decoding circuits 1a to 1d are also provided for each of memory sub blocks MSBb to MSBd respectively corresponding to I/O selection gate groups NG1b to NG4d.

In inter-block region AR, decoding circuits 1a and 1d are alternately arranged in the column direction, and decoding circuits 1c and 1b are also alternately arranged in the column direction. In the region between the memory sub blocks which are aligned in the column direction (hereinafter referred to as a sense amplifier band region), a sense amplifier group and an I/O selection gate group are arranged.

While the decoding circuits are arranged corresponding to the I/O selection gate groups, the length of the I/O selection gate group in the column direction is determined by a pitch condition of the decoding circuits. Therefore, as shown in FIG. 7, the pitch between the decoding circuits can be made sufficiently large by alternately providing the decoding circuits in the column direction and distributing them on both sides of a memory sub block. For memory sub blocks MSBc and MSBd, in particular, the decoding circuits are arranged with a single I/O selection gate group therebetween. However, the decoding circuits can be arranged in a sufficient space in the sense amplifier band region as compared with a case where two decoding circuits are provided for each of the two memory sub blocks aligned in the column direction.

Accordingly, increase in the area occupied by the sense amplifier band region as well as increase in array area can be prevented.

As described above, according to the second embodiment of the present invention, as the decoding circuits producing the column selection signals are arranged distributedly with respect to the memory sub blocks, the pitch condition of the decoding circuits can be alleviated, so that the decoding circuits can be arranged in the sufficient space. Especially, when the memory cell blocks are increased in number, the effect obtained by the alleviation of the pitch condition would be more remarkable.

In the arrangements shown in FIGS. 7 and 6, each decoding circuit produces only local column selection signal for a single memory sub block. However, a similar effect can be obtained when the decoding circuit is shared by two memory sub blocks adjacent to each other in the row direction.

Modification

Figure 8:
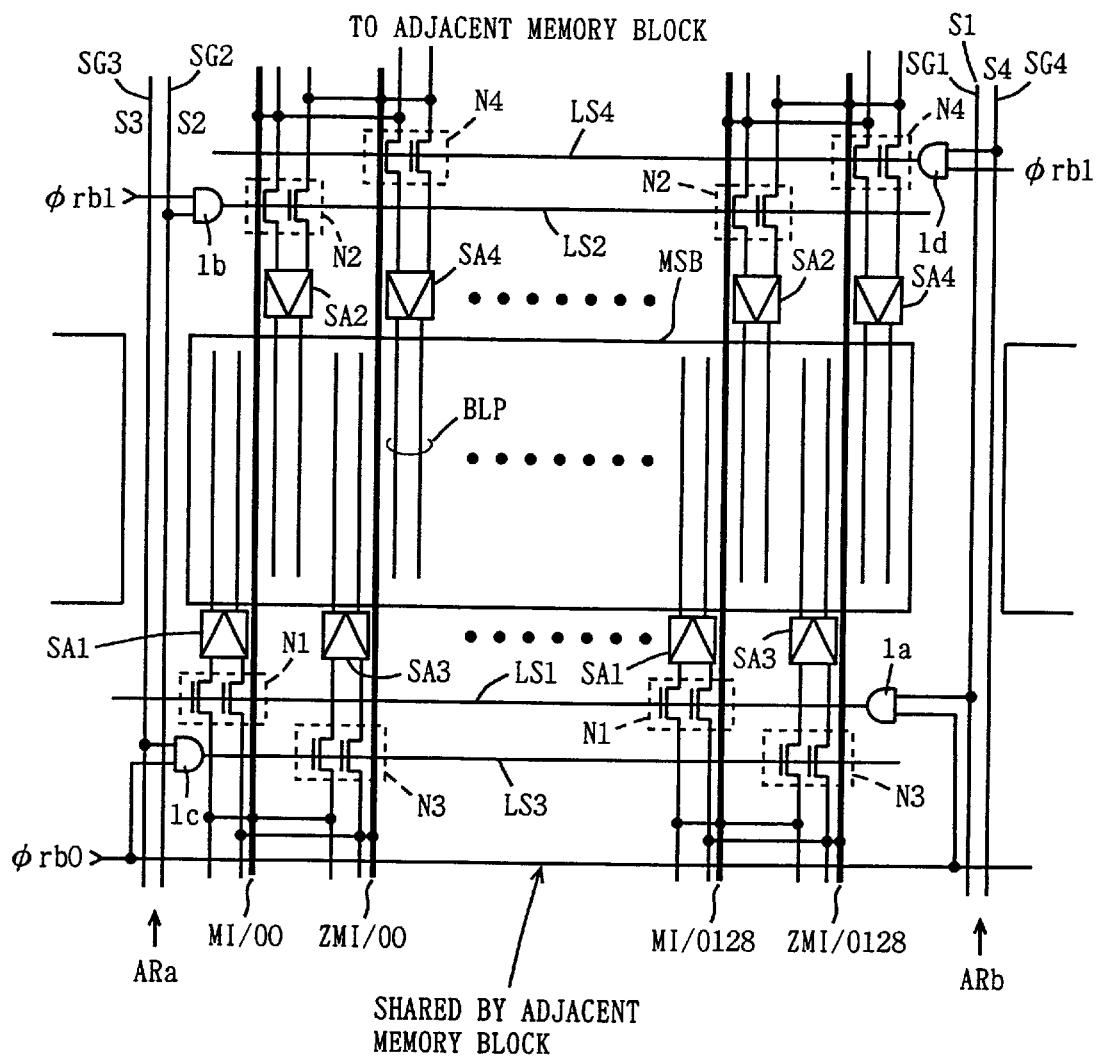
FIG. 8 shows a modification of the second embodiment.

FIG. 8 shows an arrangement of decoding circuits for a memory block MSB according to a modification of the second embodiment. In the arrangement of FIG. 8, sense amplifiers SA1–SA4 are arranged into a so-called alternately arranged shared sense amplifier configuration. More specifically, sense amplifiers SA2 and SA4 are shared between the memory block MSB and a memory block adjacent at an upper side in the column block, while sense amplifiers SA1 and SA3 are shared between memory block MSB and a memory block adjacent at a lower side in the column direction.

I/O selection gates N1 provided for sense amplifiers SA1 receive an output signal from a decoding circuit 1a, which in turn is arranged at the lower side in an inter-block region ARb and receives a row block selection signal ϕrb0 and a column selection signal on a main column selection line SG1.

I/O selection gates N3 provided for sense amplifiers SA3 receive an output signal of decoding circuit 1c, which in turn is arranged in an inter-block region ARa at the lower side and receives row block selection signal ϕrb0 and a column selection signal S3 on a main column selection line SG3.

I/O selection gates N2 provided for sense amplifiers SA2 receive an output signal of a decoding circuit 1b which in turn is arranged at the upper side in inter-block region ARa and receives a row block selection signal ϕrb1 and a column selection signal S2 on a main column selection line SG2.

I/O selection gates N4 provided for sense amplifiers SA4 receive an output signal of a decoding circuit 1d which in turn is arranged at the upper side in inter-block region ARb and receives a row block selection signal ϕrb1 and a column selection signal S4 on a main column selection line SG4.

Main column selection lines SG2 and SG3 extend in the column direction in inter-block region ARa, while main column selection lines SG1 and SG4 extend in the column direction in inter-block region ARb.

Row block selection signal ϕrb0 is activated when memory block MSB or an adjacent memory block is selected, while row block selection signal ϕrb1 is activated when memory block MSB or an adjacent memory block at the upper side is selected. Since the sense amplifiers SA1–SA4 are shared between memory blocks adjacent in the column direction, the area occupied by sense amplifiers can be reduced.

Figure 9:
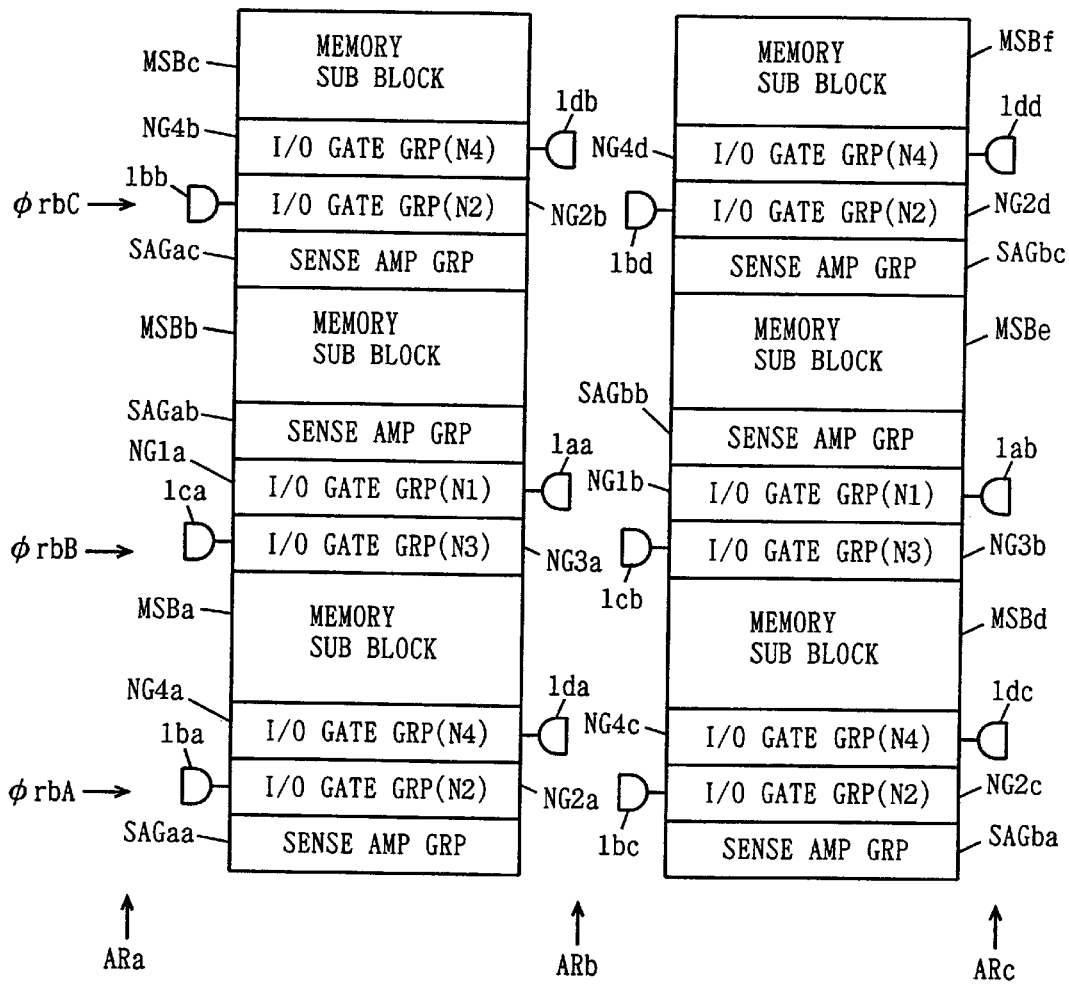
FIG. 9 shows an arrangement of six memory sub blocks according to the arrangement of FIG. 8.

FIG. 9 shows an array arrangement according to the modification 1 of the second embodiment. Referring to FIG. 9, memory sub blocks MSBa-MSBc are arranged alignedly in the column direction, and memory sub blocks MSBd-MSBf are arranged alignedly in the column direction. Sense amplifier group (amp grp) SABab and I/O gate groups (grp) NG1a and NG3a are arranged between memory sub blocks MSBa and MSBb, and sense amplifier group SAGac and I/O gate groups NG2b and NG4b are arranged between memory sub blocks MSBb and MSBc. Memory sub block MSBa is also coupled, at a lower side in the column direction, to a sense amplifier group SAGaa through I/O gate groups NG2a and NG4a.

Decoding circuits 1ba, 1ca and 1bc are provided corresponding to I/O gate groups NG2a, NG3a and NG2b, respectively, in an inter-block region ARa, while decoding circuits 1da, 1aa and 1db are provided corresponding to respective I/O gate groups NG4a, NG1a and NG4b in an inter-block region ARb.

Sense amplifier group SAGbb and I/O gate groups NG3b and NG1b are arranged between memory sub blocks MSBd and MSBe, while sense amplifier group SAGbc and I/O gate groups NG2d and NG4d are arranged between memory sub blocks MSBd and MSBe. Memory sub block MSBd is further provided with a sense amplifier group SAGba and I/O gate groups NG2c and NG4d at a lower side in the column direction.

Decoding circuits 1bc, 1cb and 1bd are provided corresponding to respective I/O gate groups NG2c, NG3b and NG2d in inter-block region ARb, while decoding circuits 1dc, 1ab and 1dd are provided corresponding to respective I/O gate groups NG4c, NG1b and NG4d in an inter-block region ARc.

Decoding circuits 1ba, 1da, 1bc and 1dc are enabled when a row block selection signal φrbA is made active to select memory sub blocks MSBa and MSBd or not shown adjacent memory sub blocks at a lower side.

Decoding circuits 1ca, 1aa, 1cb and 1ab are enabled when a row block selection signal φrbB is made active to select memory sub blocks MSBa and MSBd or memory sub blocks MSBb and MSBe.

Decoding circuits 1bb, 1db, 1bd and 1dd are enabled when a row block selection signal φrbC is made active to select memory sub blocks MSBb and MSBe or memory sub blocks MSB and MSBf.

I/O gate groups NG1a and NG1b include I/O selection gates N1, I/O gate groups NG2a, NG2b, NG2c and NG2d include I/O selection gates N2, I/O gate groups NG3a and NG3b include I/O selections gates N3, and I/O gate groups NG4a, NG4b, NG4c and NG4d include I/O selection gates N4.

In the arrangement of FIG. 9, sense amplifiers are shared between adjacent memory blocks, leading to reduction in memory array occupying area.

Further, in the arrangement of FIG. 9, when memory sub blocks MSBb and MSBe include a selected word line, row block selection signals φrbB and φrbC are made active to enable decoding circuits 1ca, 1aa, 1cb, 1ab, 1bb, 1db, 1bd, and 1dd. Date latched by sense amplifier groups SAGab, SAGac, SAGbb and SAGbc are selected and read out.

When memory sub blocks MSBa and MSBd are selected, row selection signals φrbA and φrbB are made active to enable decoding circuits 1ba, 1da, 1bc, 1dc, 1ca, 1aa, 1cb and 1ab. Data latched by sense amplifier groups SAGaa, SAGba, SAGab and SAGbb are selected for reading out.

Figure 10:
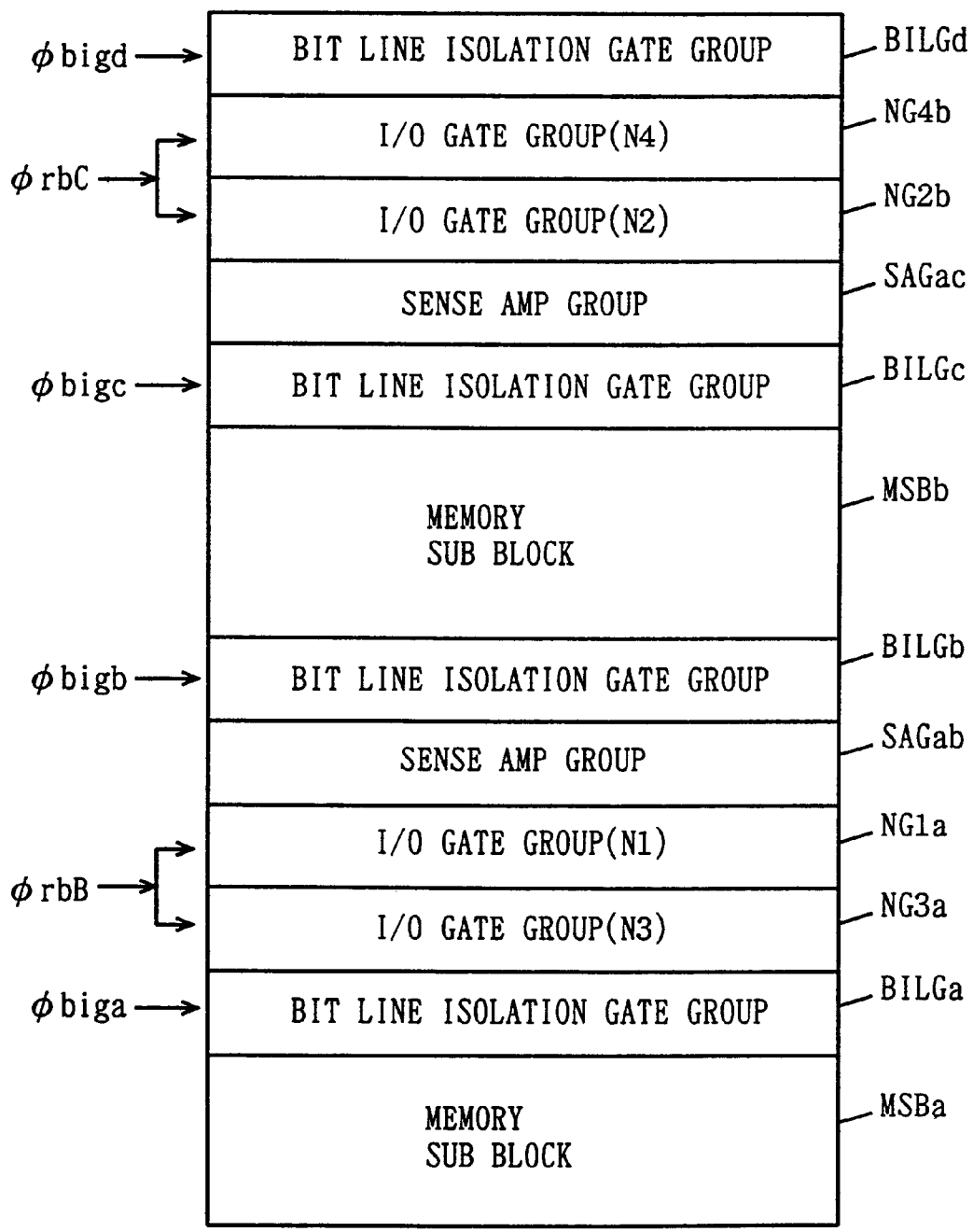
FIG. 10 shows a more detailed arrangement for the arrangement of FIG. 9.

FIG. 10 shows a detailed arrangement for the arrangement shown in FIG. 9. In FIG. 10, memory sub blocks MSBa and MSBb are representatively shown.

Referring to FIG. 10, bit line isolation gate group BILGa including bit line isolation gates is arranged between I/O gate group NG3a and memory sub block MSBa, and bit line isolation gate group BILGb is arranged between memory sub block MSBb and sense amplifier group BILGb. Bit line isolation gates in the bit line isolation gate group BILGa are provided for alternate bit line pairs of memory sub block MSBa, and bit line isolation gate group BILGb has bit line isolation gates arranged on alternate bit line pairs in memory sub block MSBb.

Bit line isolation gates in bit line isolation gate groups BILGa and BILGb are provided corresponding to sense amplifiers in sense amplifier group SAGab.

Bit line isolation gate group BILGc is arranged between sense amplifier group SAGac and memory sub block MSBb, and includes bit line isolation gates provided for alternate bit line pairs in memory sub block MSBb and corresponding to sense amplifiers in sense amplifier group SAGac. Bit line isolation gate group BILGd is arranged between I/O gate group NG4b and adjacent memory sub block MSBc (not shown in FIG. 10), and includes bit line isolation gates provided for alternate bit line pairs in memory sub block MSBc and corresponding to sense amplifiers in sense amplifier group SAGac.

In a standby state, bit line isolation control signals φbiga, φbigb, φbigc and φbigd are made inactive, and bit line isolation groups BILGa–BILGd are kept conductive, and memory sub blocks MSBb is coupled to sense amplifier groups SAGac and SAGab while memory sub block MSBa is coupled to sense amplifier group SAGab and to a not shown sense amplifier group.

In an active cycle for memory cell selection, when memory sub block MSBb is selected, bit line isolation control signals φbigb and φbigc are kept inactive, while bit line isolation control signals φbiga and φbigd are made active. Responsively, bit line isolation gate groups BILGa and BILGd are made non-conductive, so that memory sub block MSBa is disconnected from sense amplifier group SAGab and I/O gate groups NG1a and NG3a, and memory sub block MSBc (not shown) is disconnected from sense amplifier group SAGac and I/O gate groups NG2b and NG4b.

Data of selected memory cells in memory sub block MSBb are sensed, amplified and latched by sense amplifier groups SAGab and SAGac. Then, sense amplifiers in sense amplifier groups SAGab and SAGac are selected by I/O gate groups NG1a, NG3a, NG2b and NG4b in accordance with output signals of decoding circuits responsive to row selection signals φrbB and φrbC and I/O selection signals (not shown in FIG. 10). Thus, data of selected memory cells can be accurately read out without adverse affect of unselected adjacent memory sub blocks.

Figure 11:
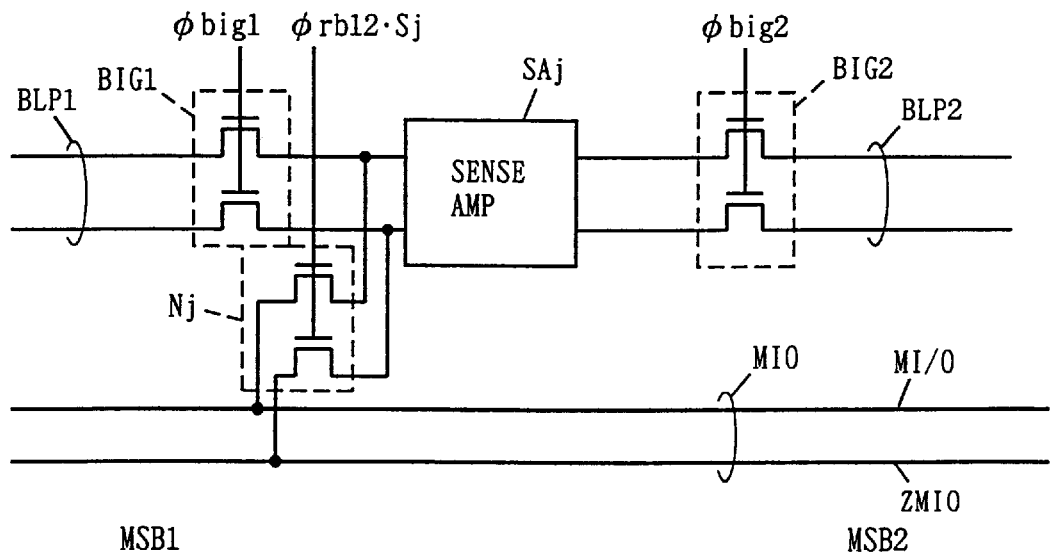
FIG. 11 shows an arrangement for a portion related to a sense amplifier in the arrangement of FIG. 10.

FIG. 11 shows an arrangement for a sense amplifier SAj shared between memory sub blocks MSB1 and MSB2. Referring to FIG. 11, sense amplifier SAj is coupled to a bit line pair BLP1 included in memory sub block MSB1 through a bit line isolation gate BIG1, and is also coupled to a bit line pair BLP2 included in memory sub block MSB2 through a bit line isolation gate BIG2. Bit line isolation gates BIG1 and BIG2 receive bit line control signals φbig1 and φbig2 at their respective gates.

Sense amplifier SAj is further coupled to a main I/O line pair MIO including I/O lines MI/O and ZMI/O through an I/O selection gate Nj (j=1) responsive to a product of row block selection signal φrb12 and a column selection signal Sj.

When memory block MSB1 is selected, bit line isolation control signal φbig2 is made active to cause bit line isolation gate BIG2 into non-conductive state, while bit line isolation gate BIG1 is kept conductive. Thus, sense amplifier SAj is coupled to bit line pair BLP1. An output signal φrb12·Sj from decoding circuit is made active to turn on I/O selection gate Nj, and data of sense amplifier SAj is read onto main I/O line pair MIO.

Figure 12:
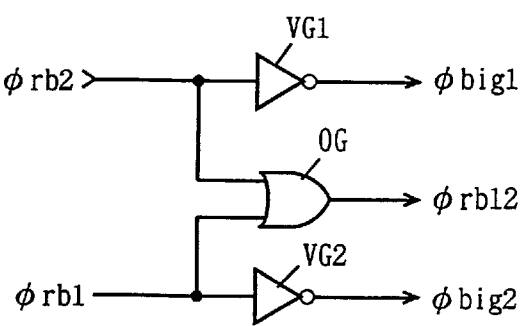
FIG. 12 shows a control circuit generating the control signals shown in FIG. 11.

FIG. 12 shows a configuration of a control circuit for controlling the connection between memory sub blocks and a sense amplifier group as shown in FIG. 11. Referring to FIG. 11, the control circuit includes an inverter VG1 for inverting a row block designating signal φrb2 designating a row block including memory sub block MSB2 to generate the bit line isolation control signal φbig1, an inverter VG2 for inverting a row block designation signal φrb1 designating a row block including memory sub block MSB1 to generate the bit line isolation control signal φbig2, and an OR circuit OG for receiving row block designating signals φrb1 and φrb2 to generate a row block specifying signal φrb12 enabling decoding circuits for I/O line selection.

In the arrangement of FIG. 12, when row block designation signal φrb1 is activated (H level), bit line isolation control signal φbig2 is made active to isolate memory sub block MSB2 from sense amplifier SAj, and row block specifying signal φrb12 is also activated to enable decoding circuits for I/O line selection. Row block designation signal φrb2 is kept inactive and bit line isolation control signal φbig1 is kept inactive to continuously couple bit line pair BLP1 to sense amplifier SAj. If memory sub block MSB2 is selected, row block designation signal φrb2 is activated to activate row block specifying signal φrb12 and bit line isolation control signal φbig while keeping bit line isolation control φbig2 inactive.

Third Embodiment

Figure 13:
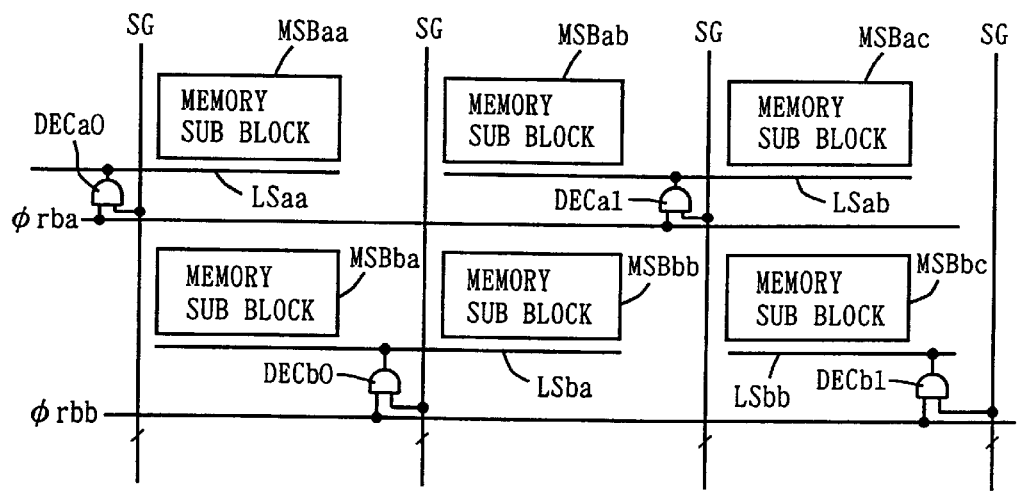
FIG. 13 is a diagram schematically showing an arrangement of a main portion of a semiconductor memory device in accordance with a third embodiment of the present invention.

FIG. 13 representatively shows memory sub blocks MSBaa to MSBac and MSBba to MSBbc arranged in two rows and three columns. Main column selection lines SG (multiple-bit) are arranged in the column direction in inter-memory sub-block regions. A decoder receiving a row block selection signal and a column selection signal on a column selection line is shared by two memory sub blocks.

A decoding circuit DECa0 is provided for memory sub block MSBaa and a decoding circuit DECa1 is provided for memory sub blocks MSBab and MSBac. A decoding circuit DECb0 is shared by memory sub blocks MSBba and MSBbb. A decoding circuit DECb1 is provided for memory sub block MSBbc and a memory cell block which is not shown in the drawing. A local column selection signal LSaa, which is output from decoding circuit DECa0, is applied to memory sub block MSBaa and a memory sub block which is not shown. A local column selection signal LSab output from decoding circuit DECa1 is applied to memory sub blocks MSBab and MSBac. A local column selection signal LSba output from decoding circuit DECb0 is applied to memory sub blocks MSBba and MSBbb. A local column selection signal LSbb output from decoding circuit DECb1 is applied to memory sub block MSBac and a memory cell block which is not shown.

Each of decoding circuits DECa1, DECa0, DECb0 and DECb1 produces a multiple-bit column selection signal. In the column direction, a decoding circuit is provided for two memory sub blocks. Row block selection signals φrba and φrbb respectively select memory cell blocks of the corresponding row blocks. As the decoding circuit is shared by the two memory sub blocks, reduction in the number of decoding circuits can be achieved and area occupied by the decoding circuits can be reduced. By providing the decoding circuits in every other sense amplifier band region and also in every other inter-block region, the layout pitches between the decoding circuits in the row and column directions can be reduced (as the decoders of the decoding circuits can be distributed in the row and column directions).

First Modification

Figure 14:
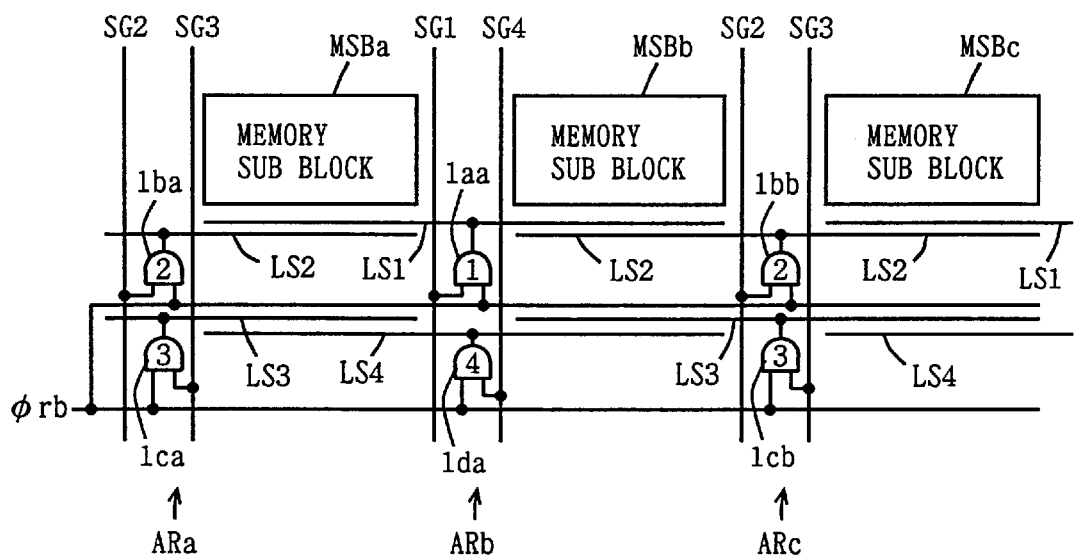
FIG. 14 is a diagram schematically showing an arrangement of a modification of the semiconductor memory device in accordance with the third embodiment of the present invention.

FIG. 14 representatively shows three memory sub blocks MSBa to MSBc aligned in the row direction. An inter-block region ARa includes: a decoder 1ba receiving a row block selection signal φrb and a column selection signal on a main column selection line' SG2 for producing a local column selection signal LS2 for a memory sub block; and a decoder 1ca receiving row block selection signal φrb and a column selection signal on a main column selection line SG3 for producing a local column selection signal LS3 and applying it to a memory sub block MSBa and a memory sub block which is not shown in the drawing.

An inter-block region ARb includes: a decoder 1aa receiving a column selection signal on a main column selection line SG1 and row block selection signal φrb for producing a local column selection signal LS1 for memory sub blocks MSBa and MSBb; and a decoder 1da receiving row block selection signal φrb and a column selection signal on a main column selection line SG4 for producing a local column selection signal LS4 for memory sub blocks MSBa and MSBb.

An inter-block region ARc includes: a decoder 1bb receiving a column selection signal on main column selection line SG2 and row block selection signal φrb for producing local column selection signal LS2 for memory sub blocks MSBb and MSBc; and a decoder 1cb receiving row block selection signal φrb and a column selection signal on main column selection line SG3 for producing local column selection signal LS3 for memory sub blocks MSBb and MSBc. Local column selection signals LS1 and LS4 from decoders (not shown) are applied to memory sub block MSBc.

As shown in FIG. 14, the memory sub block to be selected differs in accordance with a set of local column selection signals, so that the number of decoders arranged in inter-block region AR (ARa to ARc) can be reduced. Thus, a pitch condition between the decoders can be alleviated, thereby facilitating arrangement of the decoders.

As column selection operation is performed in memory sub blocks MSBa to MSBc when row block selection signal φrb is driven into a non-selection state, even with a different combination of memory sub blocks to which the local column selection signal output from the decoder is transmitted, the group of sense amplifiers which has been designated in each memory sub block is selected and correctly connected to main I/O line pairs.

Second Modification

Figure 15:
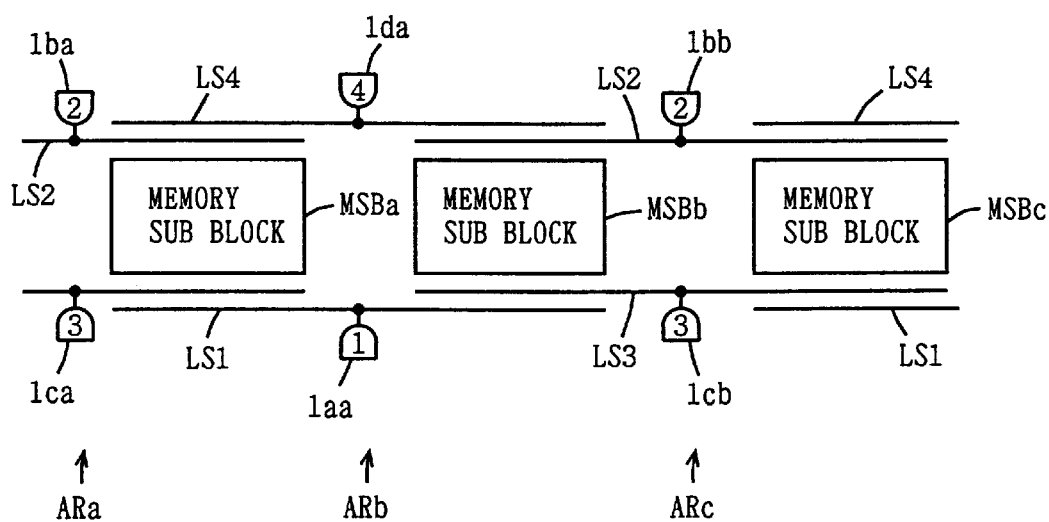
FIG. 15 is a diagram schematically showing an arrangement of a second modification of the semiconductor memory device in accordance with the third embodiment of the present invention.

Referring to FIG. 15, decoders 1ba, 1da and 1bb are arranged on the upper side in the column direction of memory sub blocks MSBa to MSBc. Except that the decoders are distributed, the arrangement shown in FIG. 15 is the same as that shown in FIG. 14 and the corresponding portions are denoted by the same reference characters.

In the arrangement shown in FIG. 15, decoders are distributed on both upper and lower sides in the column direction of the memory sub blocks. Therefore, the pitch condition between the decoders can be further alleviated and the decoders can be arranged in a sufficient space. Thus, increase in the size of the sense amplifier band region in the column direction as well as that in array area can be prevented.

It is needless to say that the memory sub block can be divided into two, eight or sixteen groups rather than four groups. The number of decoders changes with the number of division of the memory sub block. Even when the number of decoders increases, the arrangements shown in FIGS. 14 and 15 allows the decoders to be arranged in a sufficient space.

Third Modification

Figure 16:
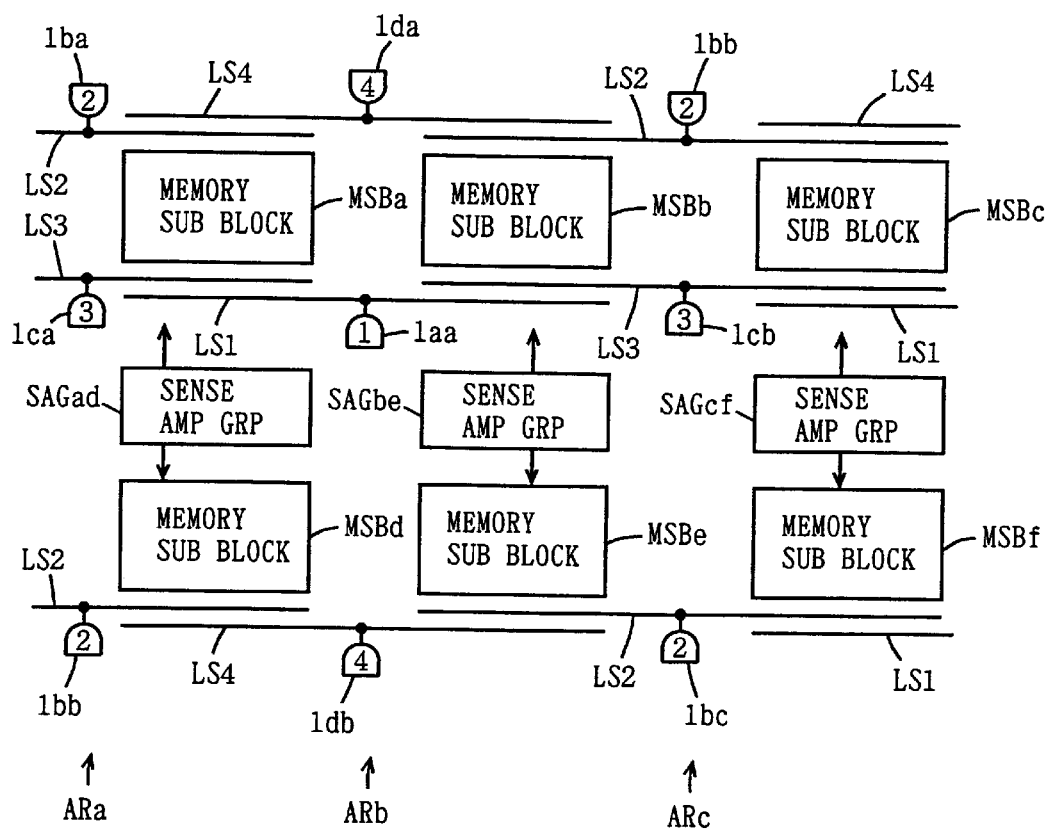
FIG. 16 shows a modification of the arrangement of FIG. 15.

FIG. 16 shows an arrangement of decoding circuits according to a third modification of the third embodiment. Referring to FIG. 16, memory sub blocks MSBa–MSBc are arranged alignedly in the row direction, and memory sub blocks MSBd–MSBf are arranged alignedly in the row direction.

Sense amplifier group SAGad is arranged and shared between memory sub blocks MSBa and MSBd, sense amplifier group SAGbe is arranged and shared between memory sub blocks MSBb and MSBe, and sense amplifier group SAGcf is arranged and shared between memory sub blocks MSBc and MSBf. That is, sense amplifier groups SAGad, SAGbe and SAGcf are configured into an alternately arranged shared sense amplifier configuration as shown in FIGS. 8–11.

Decoding circuits 1*ba*, 1*da* and 1*bb* are arranged at an upper side in the column direction of memory sub blocks MSBa, MSBb and MSBc in inter-block regions ARa, ARb and ARc, respectively.

Decoding circuit 1*ba* generates a local column selection signal LS2 for memory sub blocks MSBa, MSBd and not-shown memory sub blocks adjacent in the row direction when selected. Decoding circuit 1*da* generates a local column selection signal LS4 for memory sub blocks MSBa and MSBb and not-shown memory sub blocks adjacent in the column direction when selected. Decoding circuit 1*bb* generates a local column selection signal LS2 for memory sub blocks MSBb and MSBc and not-shown memory sub blocks adjacent in the column direction.

Decoding circuits 1*ca*, 1*aa* and 1*cb* are arranged between memory sub blocks MSBa–MSBc and memory sub blocks MSBd–MSBf in inter-block regions ARa, ARb and ARc, respectively. Decoding circuit lca generates a local column selection signal LS3 for memory sub blocks MSBa and MSBd and memory sub blocks adjacent in the column direction (not shown) when selected. Decoding circuit 1*aa* generates a local column selection signal LS1 for memory sub blocks MSBa, MSBb, MSBd and MSBe when selected. Decoding circuit 1*cb* generates a local column selection signal LS3 for memory sub blocks MSBb, MSBc, MSBe and MSBf when selected. Sense amplifiers included in sense amplifier groups SAGad, SAGbe, and SAGcf are selected by decoding circuits 1*ca*, 1*aa* and 1*cb*.

Further, memory sub blocks MSBd, MSBe and MsBf are provided with decoding circuits 1*bb*, 1*db*, and 1*bc* in inter-block regions ARa, ARb and ARc, respectively. Decoding circuit 1*bb* generates a local column selection signal LS2 for memory sub block MSBd, decoding circuit 1*db* generates a local column selection signal LS4 for memory sub blocks MSBd and MSBe, and decoding circuit 1*bc* generates a local column selection signal LS2 for memory sub blocks MSBe and MSBf Decoding circuits 1*bb*, 1*db* an 1*bc* select sense amplifiers in sense amplifier groups shared between memory sub blocks MSBd–MSBf and not-shown memory sub blocks adjacent in the column direction.

When a row block including memory sub blocks MSBa, MSBb and MSBc is selected, decoding circuits 1*ba*, 1*da*, 1*bb*, 1*ca*, 1*aa* and 1*cb* are enabled. When a row block including memory sub blocks MSBd–MSBf is selected, decoding circuits 1*ca*, 1*aa*, 1*cb*, 1*bb*, 1*db* and 1*bc* are enabled.

In the arrangement of FIG. 16, sense amplifiers are shared between memory blocks adjacent in the column direction, the area occupied by sense amplifier band can be reduced.

As in the foregoing, according to the third embodiment of the present invention, the decoders producing local column selection signals are shared by the adjacent memory sub blocks, and therefore the pitch condition between the decoding circuits can be alleviated and the decoders included in the decoder circuits can be arranged in a sufficient space.

Fourth Embodiment

Figure 17:
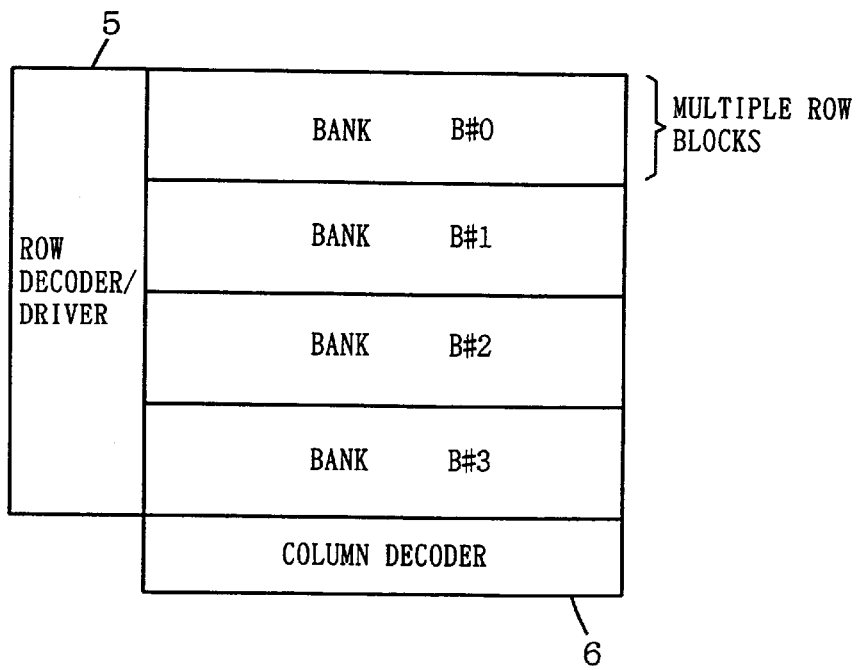
FIG. 17 is a diagram schematically showing an overall arrangement of a semiconductor memory device in accordance with a fourth embodiment of the present invention.

Referring to FIG. 17, a semiconductor memory device includes a plurality of banks B#0 to B#3 each having a plurality of row blocks. A row decoder/driver 5 and a column decoder 6 are provided to be shared by banks B#0 to B#3. Each of banks B#0 to B#3 can independently drive a word line into a selected/non-selected state. A main column selection line from column decoder 6 extends in the column direction and is shared by banks B#0 to B#3. A main I/O line pair MIO extends in the column direction and is also shared by these banks B#0 to B#3. Therefore, when a plurality of banks are driven into the selected state, a bank must be selected such that column selection operation is performed for the row block included in that bank.

Figure 18A:
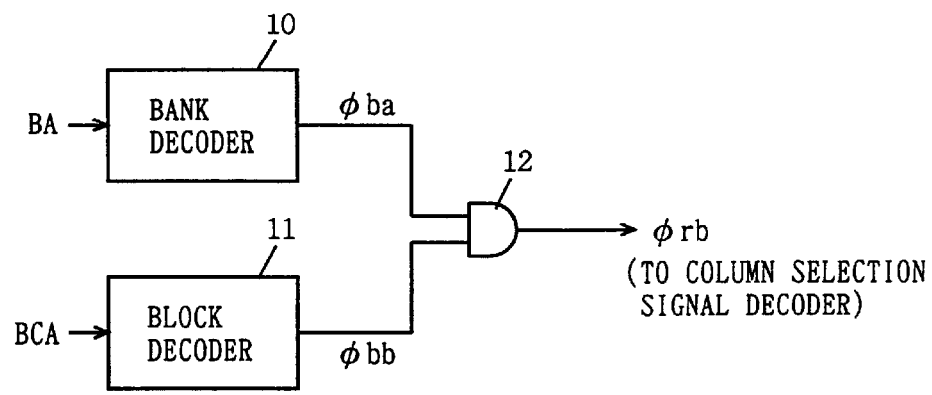
FIG. 18A is a diagram schematically showing an arrangement of a row block selection signal generating portion of the semiconductor memory device shown in FIG. 17.

Referring to FIG. 18A, a row block selection signal generating portion includes: a bank decoder 10 decoding an externally applied bank address BA for producing a bank designation signal $\phi$ba; a block decoder 11 decoding an externally applied block address BCA for producing a block designation signal $\phi$bb; and a decoding circuit 12 generating a row block selection signal $\phi$rb in accordance with bank designation signal $\phi$ba from bank decoder 10 and block designation signal $\phi$bb from block decoder 11. Decoding circuit 12 is formed, for example, of an AND circuit.

Figure 18B:
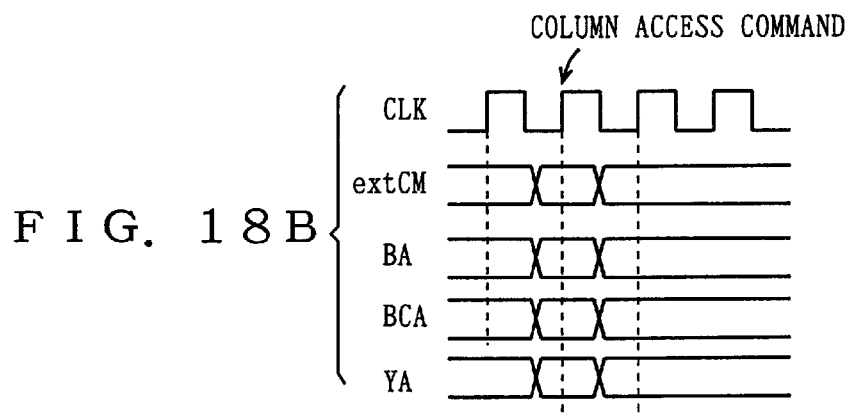
FIG. 18B is a timing chart representing an operation of a circuit shown in FIG. 18A.

FIG. 18B is a diagram showing an address application manner shown in FIG. 18A. As shown in FIG. 18B, the semiconductor memory device incorporates an externally applied signal in synchronization with a clock signal CLK for internal operation. At the rising edge of clock signal CLK, an externally applied command extCM is set in a prescribed state and a column access command (a command designating reading or writing of data) is applied. At the time, a bank address BA, a block address BCA and a column selection address YA are also applied.

At the rising edge of clock signal CLK, these addresses BA, BCA and YA are incorporated. Bank and block addresses BA and BCA are respectively applied to bank and block decoders 10 and 11 shown in FIG. 18A. A Y address YA is applied to column decoder 6 shown in FIG. 17. Therefore, even when the memory array is divided into a plurality of banks including a plurality of row blocks, a row block in an activated bank can be selected by simultaneously applying bank and block addresses at the time of column accessing. A column is designated by a block address BCA and column selection signal YA.

It is noted that in the case of a usual single bank structure, the row block including a selected word line is accessed, and therefore the row block selection signal may be applied with a row address, although not particularly described in the above first to third embodiments. The row block selection signal, which has been brought into an activate state before column selection, is applied to the selected row block, so that column selection operation can be performed at high speed in accordance with a column selection signal driven into an activate, selected state at the time of column selection.

Further, in the above described first to third embodiments, the row block selection signal can also be produced from the column address. That is, a column address can include an address designating a row block and an address designating a column. Alternatively, a block address may be applied in row and column accessing operation modes.

As described above, according to the fourth embodiment of the present invention, when the bank includes a plurality of row blocks in the multiple-bank semiconductor memory device, the row block selection signal is produced in accordance with the bank and block addresses, so that only a required row block is correctly connected to the main I/O line pairs.

It is noted that when a single bank includes one row block, the row block selection signal need not be produced in accordance with the bank and block designation signals. The row block selection signal can simply be produced in accordance with the bank designation signal applied with the column access command.

Modification

Figure 19:
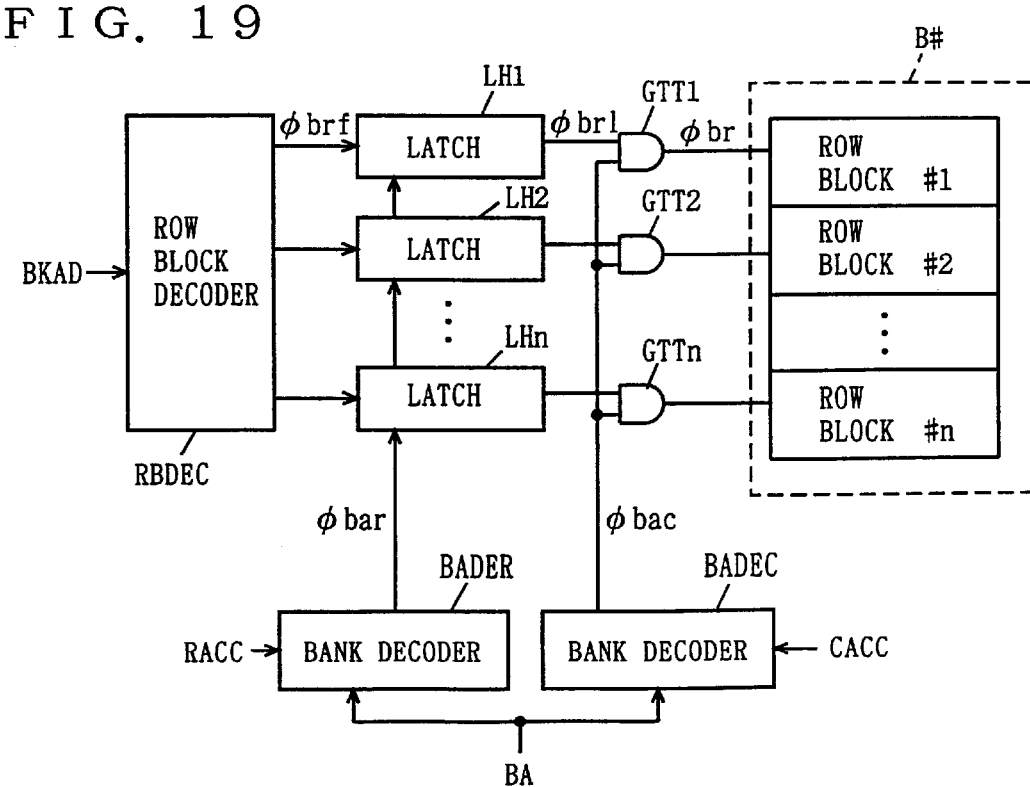
FIG. 19 shows a modification of the fourth embodiment.

FIG. 19 shows an arrangement for a bank according to a modification of the fourth embodiment. Referring to FIG. 19, a bank B# includes a plurality of row blocks #1–#n each including a plurality of word lines. In the memory array, such bank B# is provided in plurality in alignment in the column direction.

Latches LH1–LHn and gate circuits GTT1–GTTn are provided corresponding to row blocks #1–#n. Latches LH1–LHn latch row block designation signals φbrf1–φbrfn (φrf) from a row block decoder RBDEC in response to a row bank selection signal φbar from a bank decoder BADER.

Row block decoder RBDEC decodes a block address signal BKAD when an active command instructing a row access is applied. Bank decoder BADER decodes a bank address signal BA when activated in response to a row access instructing signal activated when the active command is applied.

Gate circuits GTT1–GTTn each receive an output signal φbrl (φbrl1–φbrln) from a corresponding latch LH (LH1–LHn) and a bank designation signal φbac from a bank decoder BADEC to generate a row block selection signal φbr (φbr1–φbrn) to a corresponding row block # (#1–#n). Row block # may or may not have a shared sense amplifier arrangement.

Bank decoder BADEC decodes a bank address signal BA to generate the bank designation signal φbac when activated in response to a column access instructing signal CACC activated when a read or write command instructing data reading or writing is applied.

Now, an operation of the arrangement of FIG. 19 will be described with reference to a timing chart of FIG. 20.

When an external command extCM designates an active command at the rising edge of the clock signal, currently applied bank address signal BA and an address signal AD including a row block address signal BKAD and a row address signal RA are taken in, and row block decoder RBDEC and bank decoder BADER are activated to decode the address signals BKAD and RA. Responsively, a row block designation signal φbrf for an addressed row block is activated, and latches LH1–LHn incorporate and latch the row block designation signals φbrfl–φbrfn in response to activation of bank designation signal φbar fiom bank decoder BADER. When bank designation signal φbar is deactivated, latches LH1–LHn enter the latching states.

Even when an active command for another bank is applied, the bank designation signal φbar for bank# is kept inactive, and latches LH1–LHn are kept in the latching states.

In this state, bank designation signal φbac is still in an inactive state, and row block designation signals φbr1–φbrn from gate circuits GTT1–GTTn are kept inactive.

When a read or write command is applied and a column access is designated, bank address signal BA and address signal AD are taken in. A row block is specified by a row-related block address signal BKAD, and no block address signal is applied in the column access designation cycle. Bank decoder BADEC is activated to generate or activate bank designation signal φbac. Responsively, gate circuits GTT1–GTTn are enabled and row block designation signals φbr (φbr1–φbrn) are generated and a row block is specified. A column decoder (not shown) decodes the column address signal CA to activate a column selection signal on a main column selection line. Thus, columns in the memory sub blocks in the specified row block are selected.

Even if a row block is specified by a row-related address signal applied simultaneously with an active command, accurate column selection can be performed in the column access cycle.

Figure 20:
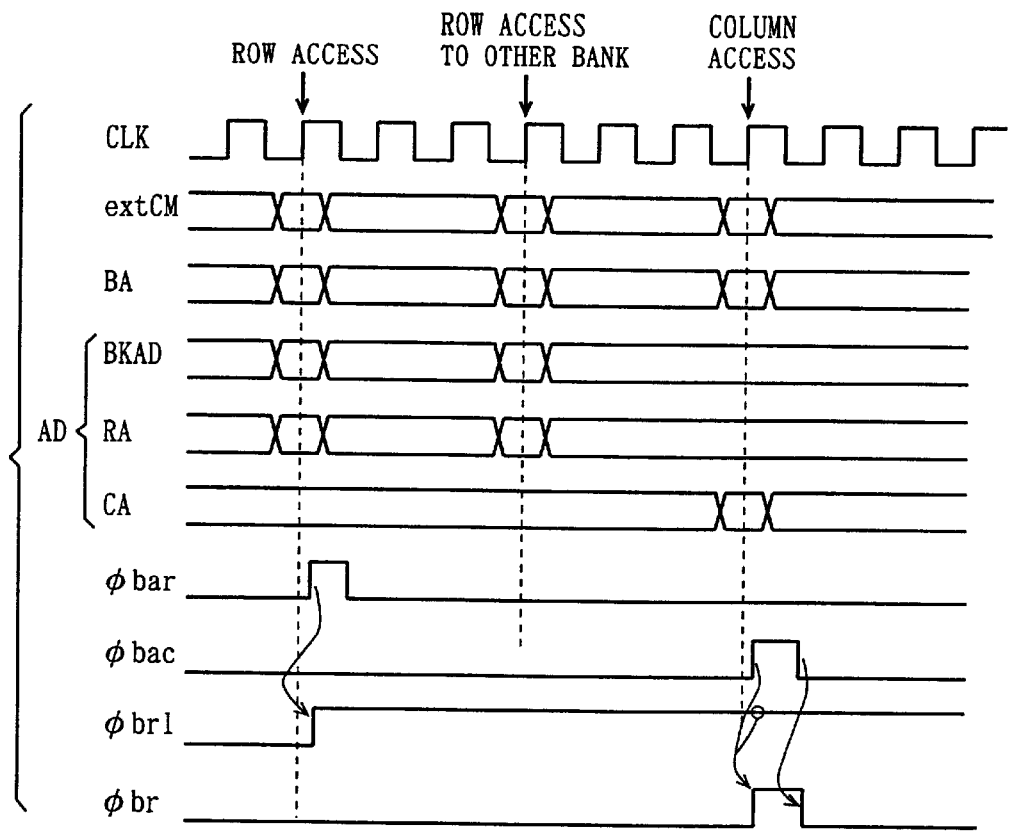
FIG. 20 is a timing chart representing an operation of the arrangement of FIG. 19.
Figure 21:
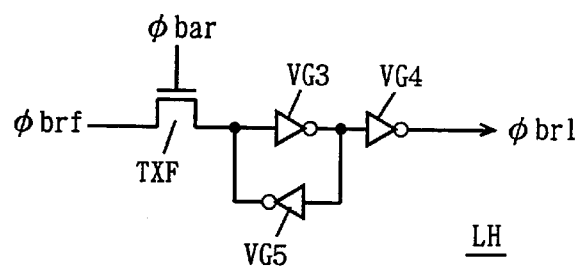
FIG. 21 shows a specific configuration of a latch shown in FIG. 19.

FIG. 21 shows an example of latch LH shown in FIG. 20. Referring to FIG. 21, latch LH includes a transfer gate TXF made conductive in response to bank designation signal φbar, to transfer an output signal φbrf of row block decoder, cascaded two stages of inverters VG3 and VG4 for buffering a signal received through transfer gate TXF to generate latched row block designation signal φbrl, and an inverter VG5 forming an inverter latch circuit with inverter VG5.

In the arrangement of FIG. 21, latch LH takes in the row block designation signal φbrf when the bank designation signal φbar is at H level (active), and enters the latching state when the bank designation signal φbar is at L level (inactive).

Figure 22:
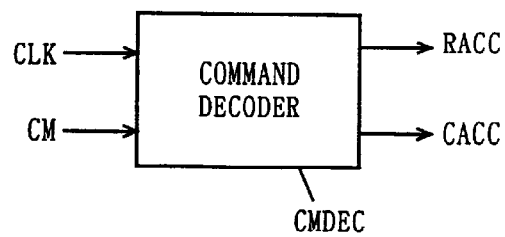
FIG. 22 shows a command decoder generating row and column access instructing signals.

FIG. 22 shows a command decoder CMDEC for generating row and column access instructing signals RACC and CACC. Command decoder CMDEC decodes an internal command CM applied at the rising edge of clock signal CLK. When a command CM is an active command, row access instructing signal RACC is activated. When command CM is a read or write command, column access instructing signal CACC is activated.

Figure 23:
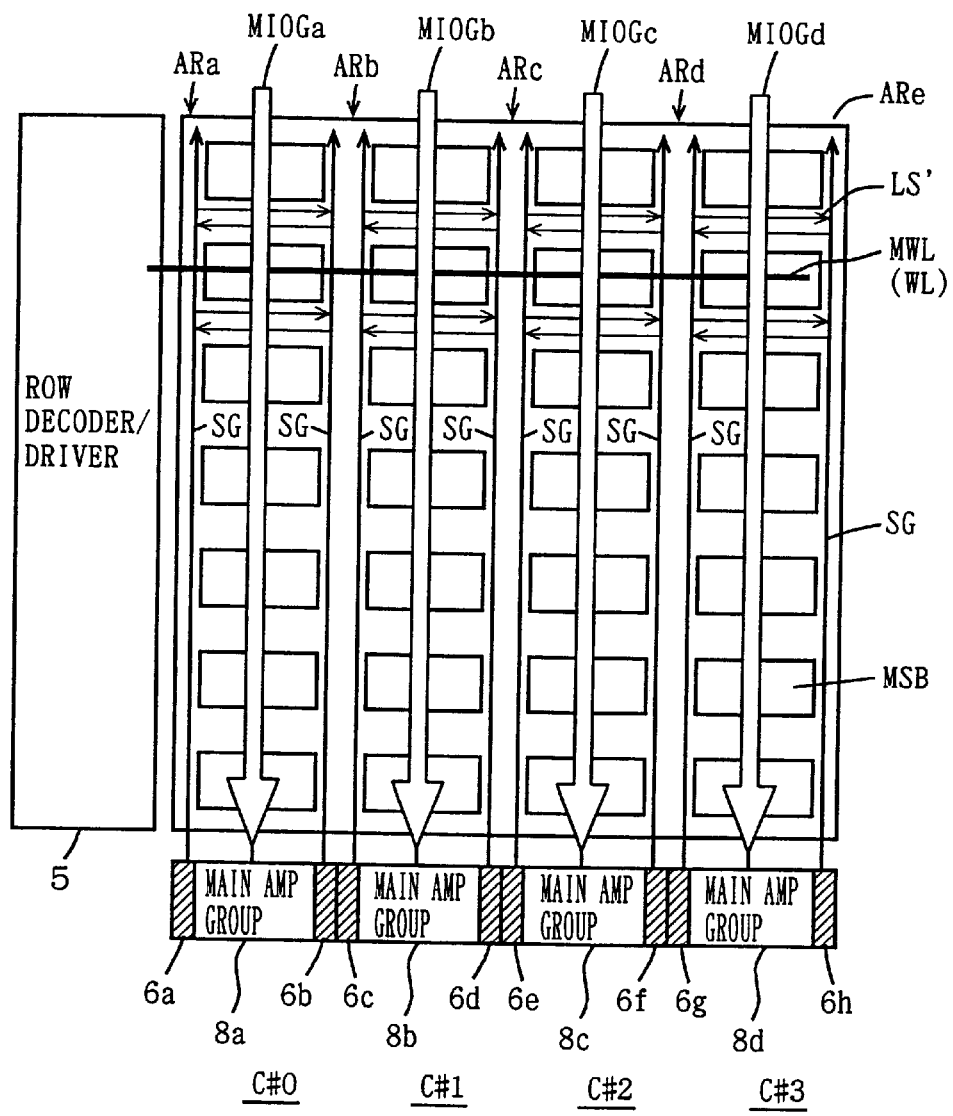
FIG. 23 is a diagram schematically showing an arrangement of a main portion of a semiconductor memory device in accordance with a fifth embodiment of the present invention.

Meanwhile, bank decoders BADER and BADEC may be combined into a common bank decoder with a selector for distributing bank designation signals φbar and φbac provided at the output thereof Fifth Embodiment FIG. 23 is a diagram schematically showing an overall arrangement of a semiconductor memory device in accordance with a fifth embodiment of the present invention. Referring to FIG. 23, the semiconductor memory device includes a plurality of memory sub blocks MSB aligned in the row and column directions as in the case of the above mentioned first to fourth embodiments. Main I/O line pair groups MIOGa, MIOGb, MIOGc and MIOGd are provided respectively corresponding to column blocks C#0, C#1, C#2 and C#3 of memory sub blocks MSB. Main I/O line pair groups MIOGa to MIOGd are respectively arranged in the column direction over memory sub blocks MSB included in the corresponding column blocks C#0 to C#3.

A main column selection line SG is provided in each of regions between blocks ARa to ARe in the column direction. Main column selection line SG is provided for each column block. Thus, the local column selection signal is applied to each of memory sub blocks MSB in accordance with a signal on the main column selection line in inter-block regions provided on each side of memory sub block MSB in the row direction.

A row decoder/driver 5 is arranged on one side of a memory array for driving a main word line MWL (or a word line WL) into a selected state. The row selection line shared by the row blocks may be main word line MWL or word line WL, depending on the arrangement of the array of the semiconductor memory device.

Main amplifier groups 8a to 8d are respectively arranged for column blocks C#0 to C#3, for amplifying data on the corresponding main I/O line pair groups MIOGa to MIOGd. Column decoding circuits 6a to 6h are arranged sandwiching main amplifier groups 8a to 8d and respectively corresponding to inter-block regions ARa to ARe. Main column selection line SG transmits a main column selection signal to a decoding circuit provided neighboring to each memory sub block. Only decoding operation of ¼, ⅛, 1/16 or the like is performed in memory sub block MSB, and the number of main column selection lines is about 1, 8 or 16. Accordingly, column decoding circuits 6a to 6h can be arranged in inter-block regions ARa to ARe with a sufficient margin because of their small structures.

Figure 24:
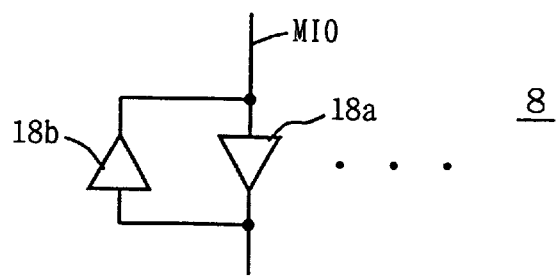
FIG. 24 is a diagram schematically showing an arrangement of a portion related to one bit of a main amplifier group shown in FIG. 23.

FIG. 24 is a diagram schematically showing an arrangement of the main amplifier group shown in FIG. 23. Referring to FIG. 24, main amplifier group 8 (8a to 8d) includes a main amplifier circuit 18a and a write driver 18b provided corresponding to main I/O line pair MIO. Main amplifier circuit 18a is activated at the time of data reading for amplifying data on main I/O line pair MIO. Write driver 18b is activated at the time of data writing for transmitting write data onto main I/O line pair MIO.

As described above, according to the fifth embodiment of the present invention, by providing the column decoding circuits in the inter-block regions and providing the main amplifier group for each of the column blocks, efficient arrangement of these main amplifier group and column decoders can be achieved. In addition, the main column selection line and the main I/O line are linearly extended to be connected to the column decoder and the main amplifier group, thereby minimizing the length of interconnection line.

Sixth Embodiment

Figure 25:
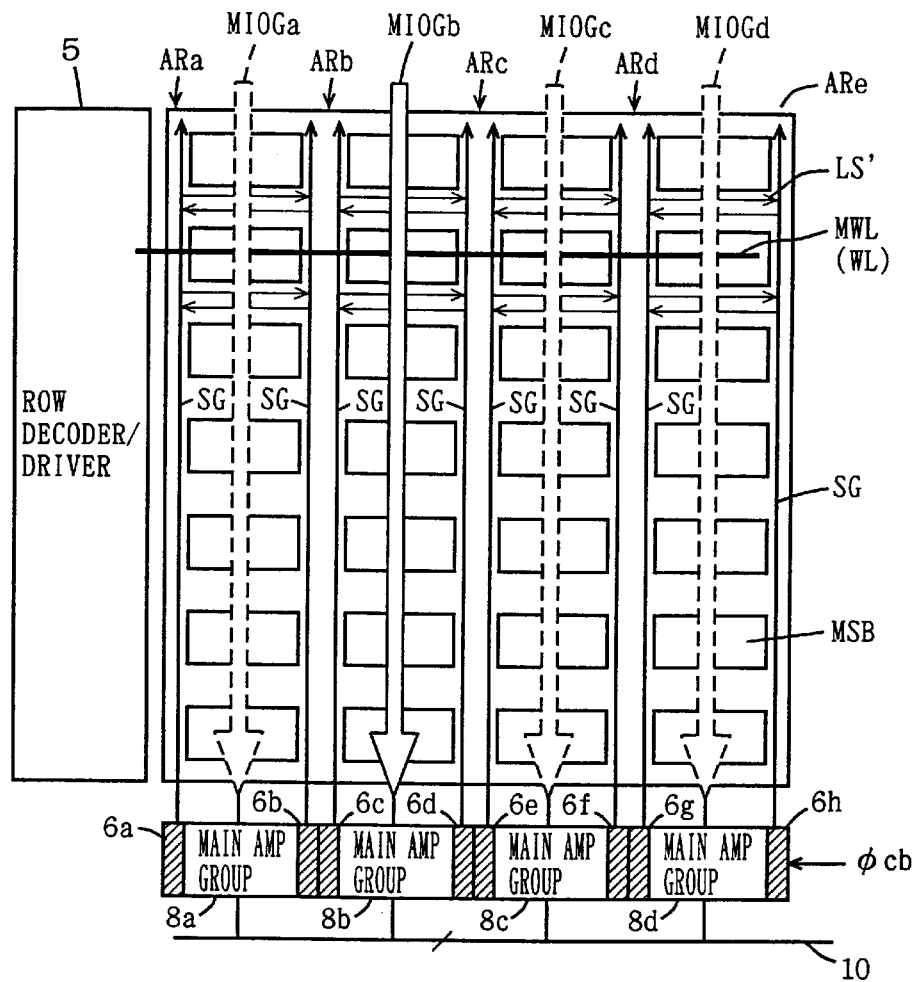
FIG. 25 is a diagram schematically showing an overall arrangement of a semiconductor memory device in accordance with a sixth embodiment of the present invention.

In an arrangement of a semiconductor memory device shown in FIG. 25, column decoding circuits 6a to 6h and main amplifier groups 8a to 8d are selectively activated in accordance with a column block designation signal φcb. In other words, only the main amplifier group and the column decoding circuit provided corresponding to the column block designated by column block designation signal φcb are activated for performing column selection and data reading/writing operations. In FIG. 25, main amplifier group 2b and column decoding circuits bc and bd are activated. Other parts of the structure are the same as those shown in FIG. 23.

As memory capacity increases, a memory mat also becomes larger in size. In this case, the number of sense amplifiers operating at a time and bit number of the data latched by the sense amplifiers increase. In a 256-M bit DRAM, for example, 4-K bit data is latched at the sense amplifiers by one row access (row selection). If ¼ selection is performed by the decoding circuit, 1-K bit data is selected. For the 1-K bit data (128 byte word), when such data is too large in width, the column decoding circuit and main amplifier group are activated in a column block unit in accordance with a required data bit width. By connecting main amplifier groups 8a to 8d commonly to a global data bus 10, data with an optimum bit width can be transferred. Thus, the scale register circuits for prefetching data is optimized and current consumption is reduced as the number of registers and main amplifiers simultaneously operating is optimized.

Figure 26:
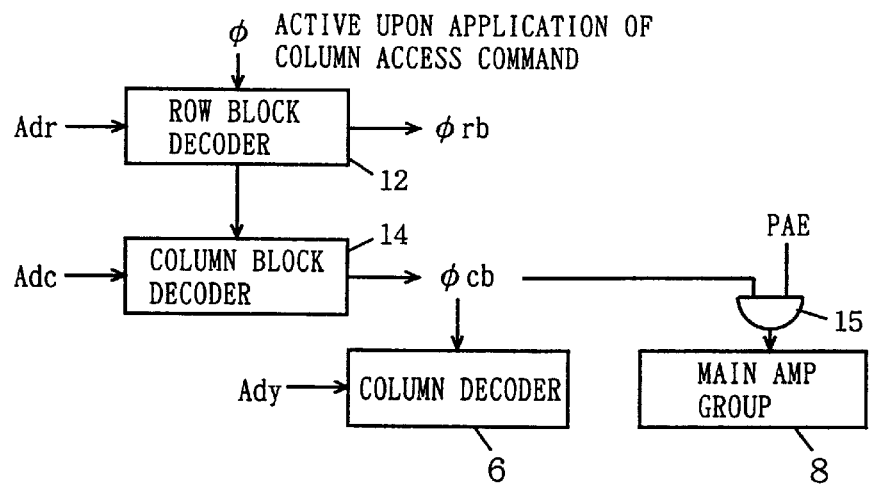
FIG. 26 is a diagram schematically showing an arrangement of a control signal generating portion of the semiconductor memory device shown in FIG. 25.

FIG. 26 is a diagram schematically showing an arrangement of a row block selection signal and column block designation signal generating portion. Referring to FIG. 26, the block designation signal generating portion includes: a row block decoder 12 responsive to activation of a column access activation signal φ for decoding an applied address signal Adr to produce a row block selection signal φrb; and a column block decoder 14 responsive to activation of column access activation signal φ for decoding an applied address signal Adc to produce a column block designation signal φcb. Column access activation signal φ is activated when a column access command for instructing data writing or reading is applied.

A column block designation signal φcb from a column block decoder 14 is applied to a column decoder 6. A column decoding circuit included in column decoder 6 decodes an applied address signal Ady to produce a column selection signal on the corresponding main column selection line when column block designation signal φcb is activated and designating a corresponding column block. Column selection is performed on a column block unit, and main I/O line pair group provided for nonselected column block is kept at a standby state and causes no current flow for data reading. Thus, current consumption can be reduced.

Main amplifier groups 8 (8a to 8d) receives a control signal through a gate circuit 15 receiving a main amplifier activation signal PAE and column block designation signal φcb. Main amplifier group 8 performs amplification operation of data on a corresponding main I/O line pair group when an output signal from gate circuit 15 is in an active state.

Row block selection signal φrb from row block decoder 12 is applied to a decoding circuit provided in each memory sub block. Data access is made for the memory sub block arranged corresponding to an intersecting portion of the row block designated by row block selection signal φrb and the column block designated by column block designation signal φcb.

In the arrangement of FIG. 25, column decoding circuits 6a–6h and main amplifier groups 8a–8d are activated on a column block unit.

Figure 27:
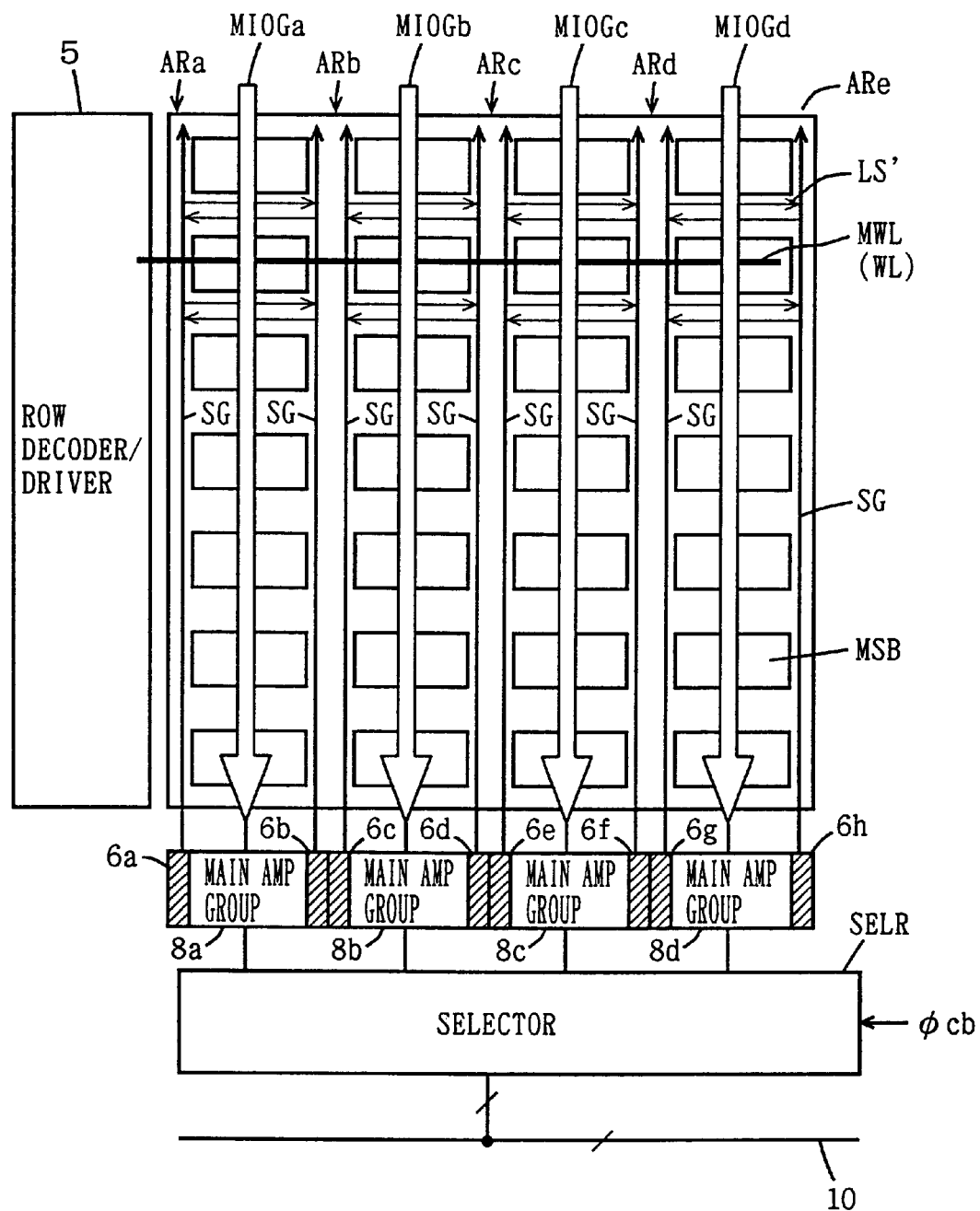
FIG. 27 shows a modification of the arrangement of FIG. 25.

Alternatively, as shown in FIG. 27 a selector SELR responsive to a column block designation signal φcb may be provided between main amplifier groups 8a–8d and a global data bus 10. Although main I/O line pair groups MIOGa––MIOGd all receive memory cell data by column decoding circuits 6a–6h, main amplifier groups 8a–8d are selected on a column block basis by selector for connection to global data bus 10. Thus, the width of global data bus 10 can be modified by a step of a column block size. If selector SELR has a function of changing a connection path between main amplifier groups 8a–8d and global data bus 10 in accordance with data bit width transferred on global data bus 10, the global data bus 10 can cope with a plurality of kinds of data bit width.

As in the foregoing, according to the sixth embodiment of the present invention, column selection and data access are performed in a specific number of column blocks of a plurality of column blocks, so that data with an optimum bit width can be transferred and the scale of internal circuitry and current consumption are optimized.

Seventh Embodiment

Figure 28:
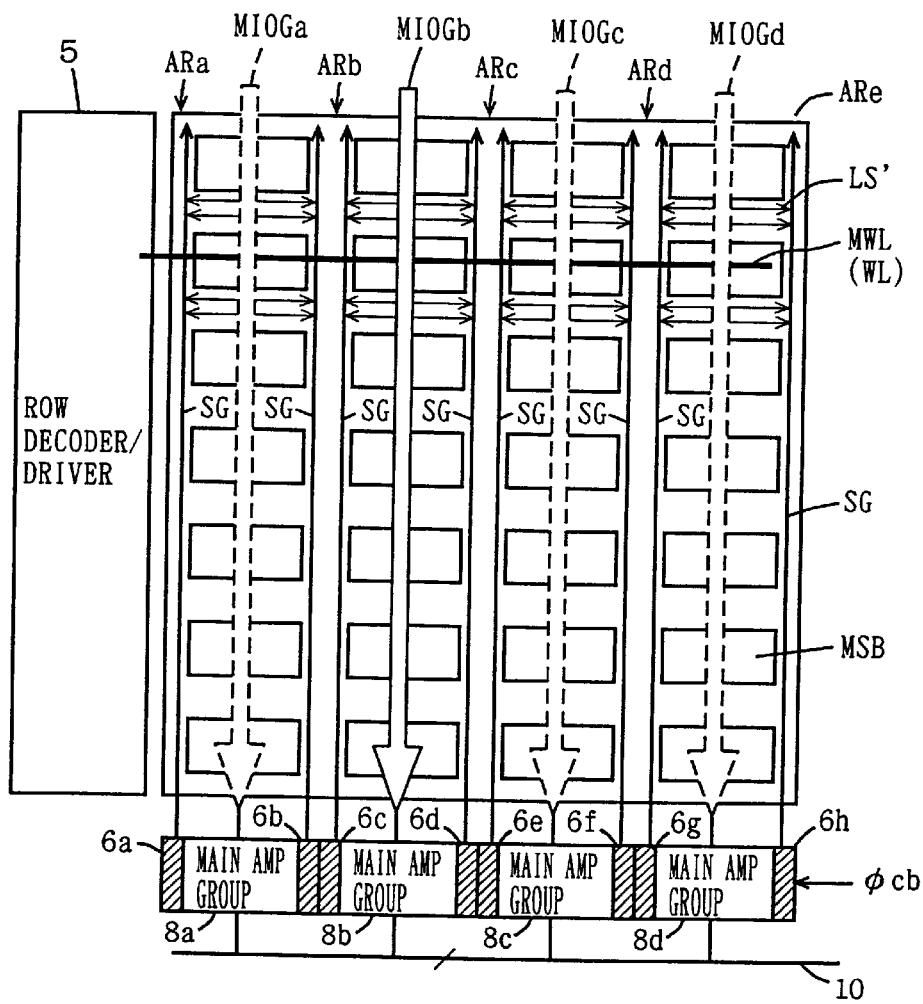
FIG. 28 is a diagram schematically showing an overall arrangement of a semiconductor memory device in accordance with a seventh embodiment of the present invention.

In an arrangement shown in FIG. 28, decoding circuitry (block decoding circuits) provided for each memory sub block drives the same local column selection signal line from either side thereof in the row direction. Thus, even when there is an increase in the size in the row direction as the number of division of the memory sub blocks decreases or capacity of memory sub block increases, the local column selection line can be driven into a selected state at high speed. Other parts of the structure are the same as those for the structure shown in FIG. 25.

Figure 29:
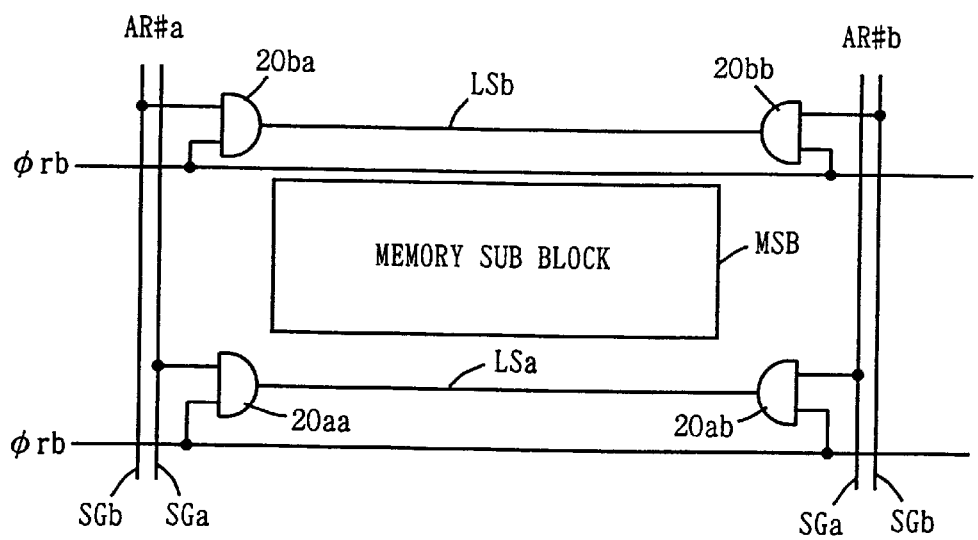
FIG. 29 is a diagram schematically showing an arrangement of a portion related to one memory sub block of the semiconductor memory device shown in FIG. 28.

FIG. 29 is a diagram showing an arrangement of a portion related to one memory sub block. Referring to FIG. 29, sets of main column selection lines SGa and SGb are respectively arranged on either side of memory sub block MSB in the row direction. The region on the lower side in the column direction of memory cell block MSB includes: a decoding circuit 20aa receiving a column selection signal on main column selection line SGa and a row block selection signal φrb; and a decoding circuit 20ab receiving a selection signal on main column selection line SGa provided in an inter-block region AR#b and row block selection signal φrb.

These decoding circuits 20*aa* and 20*ab* both produce a common local column selection signal LSa.

The region on the upper side in the column direction of memory sub block MSB includes: a decoding circuit 20*ba* receiving a column selection signal on main column selection line SGb arranged in an inter-block region AR#a and row block selection signal φrb; and a decoding circuit 20*bb* receiving a column selection signal on main column selection line SGb arranged in inter-block region AR#b and row block selection signal φrb. Decoding circuits 20*ba* and 20*bb* both produce a common local column selection signal LSb.

Even when memory sub block MSB is increased in size in the row direction and the length of the local column selection line transmitting local column selection signals LSa and LSb increases, local column selection signals LSa and LSb are driven into the selected state at high speed by driving decoding circuits on either side of the local column selection line.

It is noted that main column selection signal lines SGa and SGb may be multiple-bit signal lines in the arrangement shown FIG. 29. In the arrangement of FIG. 28, a selector as shown in FIG. 27 may be employed.

As described above, according to the seventh embodiment of the present invention, as the common local column selection line is driven from either side of the memory sub block, even when the memory sub block is increased in size, the local column selection line can be driven at high speed.

It is noted that, in this case, although the number of main column selection lines arranged in an inter-block region doubles, if the main column selection line is shared by the adjacent memory sub blocks, increase in the number of signal lines can be prevented.

Eighth Embodiment

Figure 30:
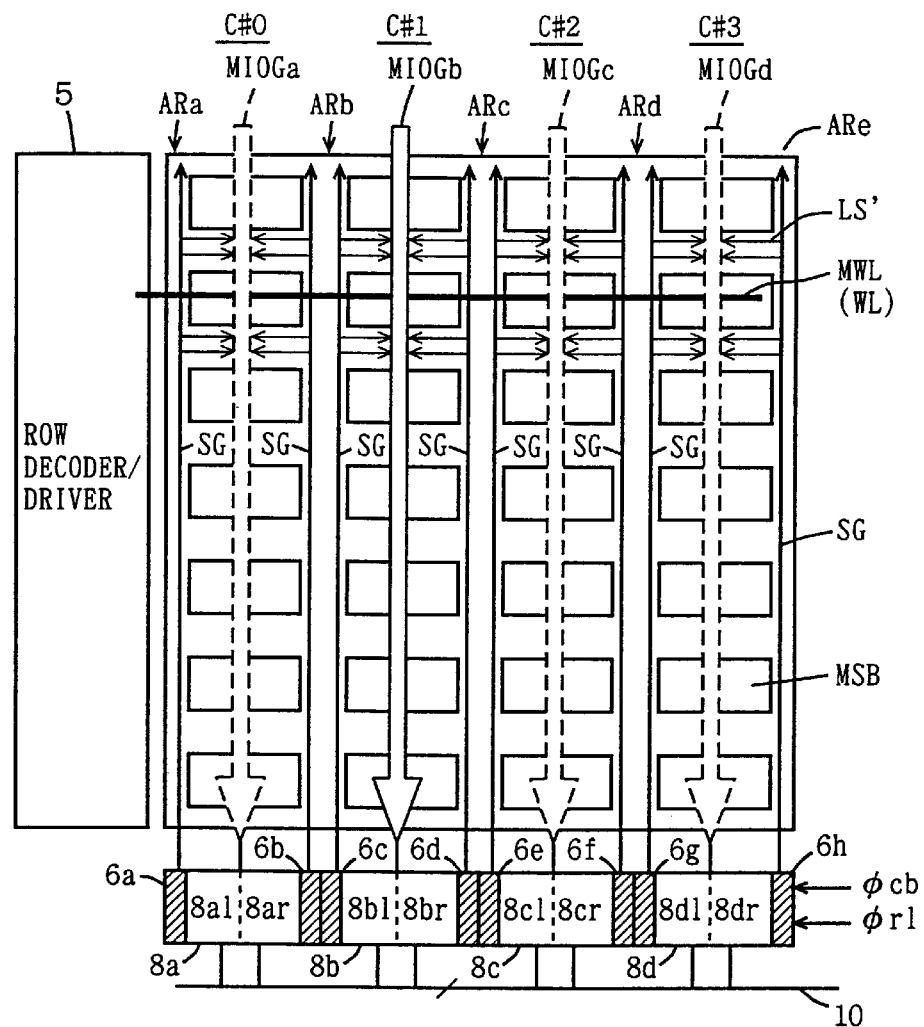
FIG. 30 is a diagram schematically showing an overall arrangement of a semiconductor memory device in accordance with an eighth embodiment of the present invention.

Referring to FIG. 30, main amplifier groups 8*a* to 8*d* are divided into left-side main amplifier groups 8*al* to 8*dl* and right-side main amplifier groups 8*ar* to 8*dr*. A column decoding circuit selects a column group on either left or right side of the corresponding column block. In other words, a column decoding circuit 6*a* selects a column group in the region on the left side in the row direction of a column block C#0, and a column decoding circuit 6*b* selects a column group on the right side of column block C#0. In the remaining column decoding circuits 6*c* to 6*h*, selection operation is similarly performed for the left or right side columns in the respective column blocks C#1 to C#3 when selected.

To select the columns on either half side of a memory sub block, a left/right selection signal φrl is applied to column decoding circuits 6*a* to 6*h* and to main amplifier groups 8*a* to 8*d*. In the column block designated by a column block designation signal φcb, the column decoding circuit and the main amplifier group are activated which are provided for the region designated by left/right designation signal φrl. When the memory sub block is increased in size in the row direction, required number of data bits are selected. Thus, the number of main amplifiers simultaneously operating in main amplifier groups 8*a* to 8*d* is reduced to prevent power supply noise caused by locally intensive current consumption due to the operation of locally arranged main amplifiers.

Figure 31:
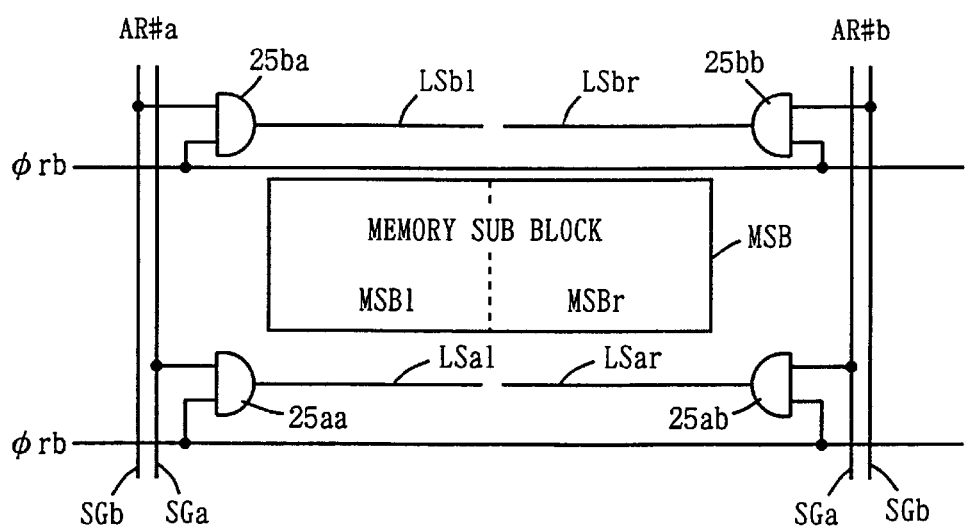
FIG. 31 is a diagram schematically showing an arrangement of a portion related to one memory sub block of the semiconductor memory device shown in FIG. 30.

FIG. 31 is a diagram schematically showing an arrangement of portion corresponding to one memory sub block. Referring to FIG. 31, a memory sub block MSB is divided into a memory sub block MSBl on the left side and a memory sub block MSBr on the right side. At the time of row selection, memory cells for a row are simultaneously selected in memory sub block MSB and data corresponding to one row is latched at sense amplifiers not shown in the drawing.

In the region on the left side in the row direction of memory sub block MSB there are provided a decoding circuit 25*aa* receiving a column selection signal on a main column selection line SGa and a row block selection signal φrb, and a decoding circuit 25*ba* receiving row block selection signal φrb and a column selection signal on a main column selection line SGb. Decoding circuits 25*aa* and 25*ba* produce column selection signals LSal and LSbl for a region MSBl on the left side of memory sub block MSB.

In an inter-block region AR#b on the light side in the row direction of memory sub block MSB, there are provided a decoding circuit 25*ab* receiving a column selection signal on main column selection line SGa and row block selection signal φrb, and a decoding circuit 25*bb* receiving a column selection signal on main column selection line SGb and row block selection signal φrb. Column selection signals LSar and LSbr from decoding circuits 25*ab* and 25*bb* are applied to a block MSBbr on the right side of memory sub block MSB.

Main column selection lines SGa and SGb in an inter-block region AR#a and main column selection lines SGa and SGb in inter-block region AR#b are selectively driven into an active state in accordance with a left/right designation signal φrl shown in FIG. 30. Thus, the columns of one of blocks MSBl and MSBr in memory sub block MSB are selected and connected to main I/O line pairs not shown in the drawing.

It is noted that the memory sub block is divided into two blocks in the row direction in the arrangement shown in FIGS. 30 and 31. However, the memory sub block may be divided into four blocks. In this case, the column decoding circuits and main amplifier groups are simply divided into four groups.

In addition, a selector as shown in FIG. 27 may be employed.

As described above, according to the eighth embodiment of the present invention, the memory sub block is divided into a plurality of groups so that the column decoders and main amplifier groups are activated in a group unit. Thus, the number of main amplifiers simultaneously operating is reduced and generation of power supply noise due to locally intensive current consumption is prevented, so that stable data reading operation can be achieved. In addition, as the main amplifier groups are operated in accordance with a required minimum data bit number, reduction in current consumption can be achieved and data having a required bit width suitable for the internal structure can be selected.

Ninth Embodiment

Figure 32:
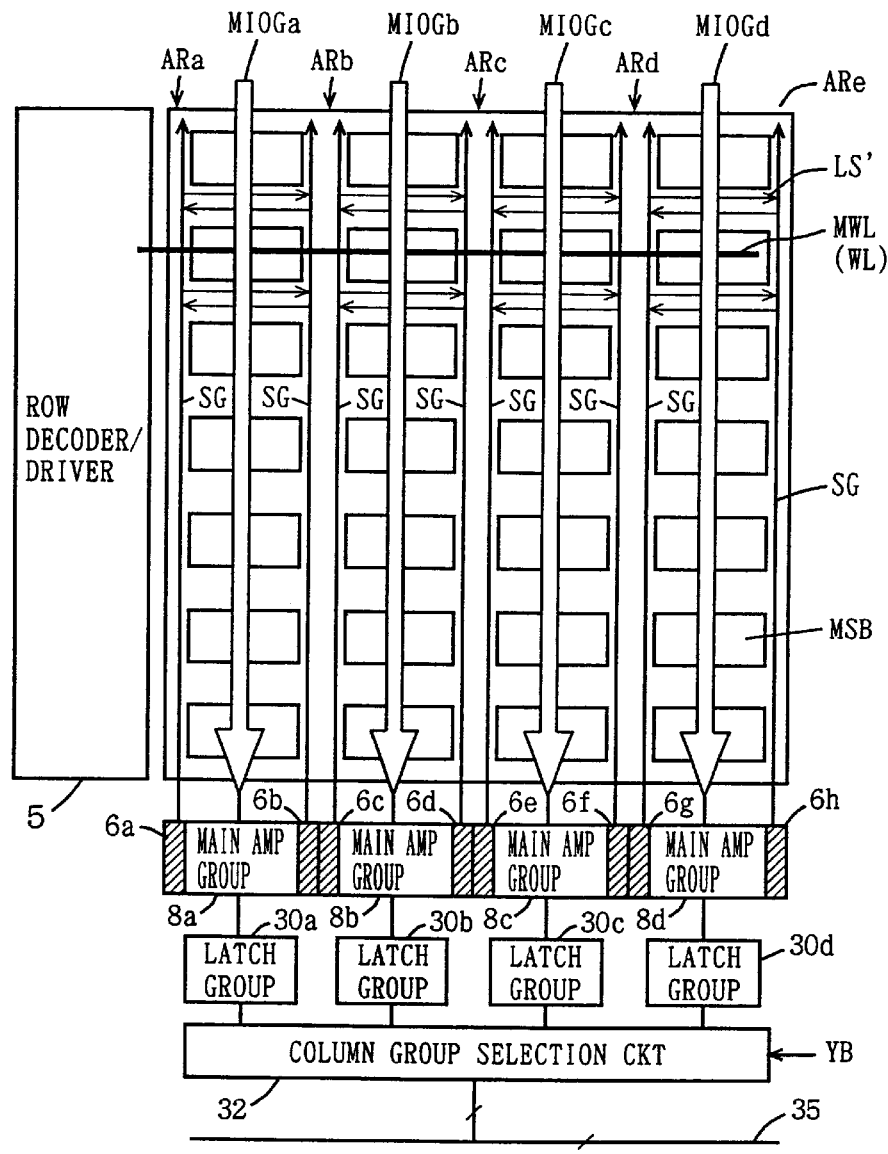
FIG. 32 is a diagram schematically showing an overall arrangement of a semiconductor memory device in accordance with a ninth embodiment of the present invention.

Referring to FIG. 32, latch groups 30*a* to 30*d* latching applied data are provided respectively corresponding to main amplifier groups 8*a* to 8*d*. A column group selection circuit 32 is provided for latch groups 30*a* to 30*d* and selects data with a prescribed number of bits in accordance with a column group selection signal (a data bit selection signal) YB for connection to a global data bus 35. Other parts of the structure are the same as those shown in FIG. 23.

In the arrangement shown in FIG. 32, data are read from all of the memory sub blocks in a row block as in the arrangement shown in FIG. 23. Thus, 1-K bit data are read in parallel and transmitted to main amplifier groups 8*a* to 8*d* for amplification, for example. Data amplified in main amplifier groups 8*a* to 8*d* are latched by the latches included in corresponding latch groups 30*a* to 30*d*. Column group selection circuit 32 selects data corresponding to a bit width of global data bus 35 in accordance with column group selection signal YB. Accordingly, by sequentially transferring 1-K bit data in accordance with a bus width of internal global data bus 35, data can be internally transferred in a pipelined manner so that high speed data transfer is achieved. In addition, data need not be sequentially transferred from the sense amplifiers as a number of data are simultaneously latched, thereby further increasing transfer speed. Data latched at latch groups are simply selected at the time of column selection, whereby the time required for transferring data from sense amplifiers to the global data bus through the main amplifier groups is eliminated and fast column access is achieved.

Figure 33A:
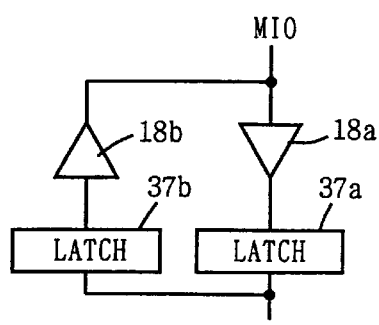
FIG. 33A is a diagram schematically showing an arrangement of a portion related to one bit of main amplifier and latch groups shown in FIG. 32.

Referring to FIG. 33A, a latch 37a is provided at an output of a main amplifier 18a and a latch 37b is provided at an input of a write driver 18b. Latches 37a and 37b are both connected to column group selection circuit 32. In the arrangement shown in FIG. 33A, latches 37a and 37b included in latch groups 30a to 30d can be used as register circuits for prefetching data.

Figure 33B:
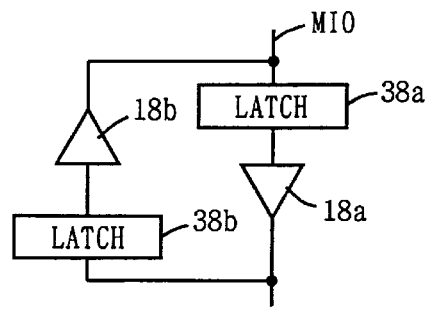
FIG. 33B is a diagram schematically showing another arrangement of the portion related to one bit of main amplifier and latch groups shown in FIG. 32.

FIG. 33B is a diagram showing another arrangement of main amplifier groups and latch groups. In the arrangement shown in FIG. 33B, a latch 38a is provided at an input of a main amplifier 18a and a latch 38b is provided at an input of a write driver 18b. Latch 38a latches data on a main I/O line pair MIO and latch 38b latches internal write data transferred at the time of data writing.

When latches 38a and 38b shown in FIG. 33B are in a latching state, the sense amplifiers of the memory array and these main amplifier and latch groups can be disconnected at the time of data reading/writing. Accordingly, high speed writing/reading can be achieved as the time required for driving the main I/O line pair and transmitting/receiving data to/from the sense amplifiers is eliminated.

Any of the arrangements shown in FIGS. 33A and 33B may be employed for the arrangement shown in FIG. 32.

Figure 34:
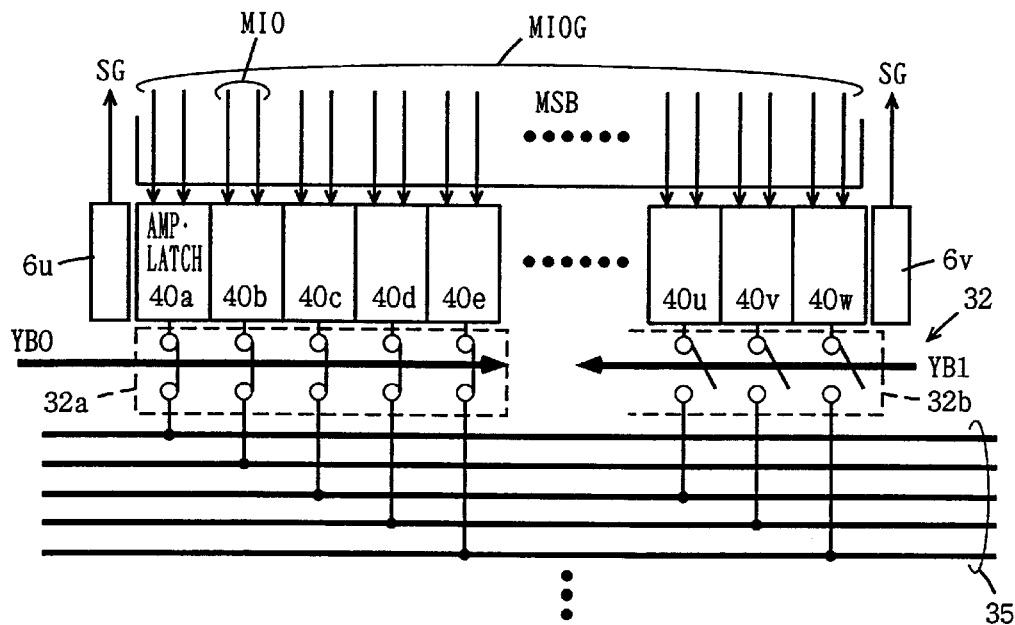
FIG. 34 is a diagram schematically showing an arrangement of a main portion of a modification of the semiconductor memory device in accordance with the ninth embodiment of the present invention.

FIG. 34 is a diagram schematically showing an arrangement of the reading portion corresponding to one memory sub block. Referring to FIG. 34, for each of main I/O line pairs MIO included in main I/O line pair group MIOG provided for a single memory sub block MSB, amp·latches 40a to 40w each including a main amplifier, a write driver and a latch shown in FIG. 33A or FIG. 33B are provided. Column decoders 6u and 6v are arranged on opposite sides of amp·latches 40a to 40w. Data selection gates 32a and 32b, which are rendered conductive respectively in accordance with column group selection signals YB0 and YB1, are provided between amp·latches 40a to 40w and a global data bus 35. Each of data selection gates 32a and 32b transmits data latched at the corresponding amp·latch onto a corresponding bus line of global data bus 35 when rendered conductive (at the time of data reading). The number of column group selection signals applied to memory sub block MSB may suitably be determined in accordance with a bit width of global data bus 35.

Alternatively, the data selection gates may be simultaneously rendered conductive in a plurality of column blocks to connect corresponding amp·latches to the global data bus in parallel.

Further, the amp·latches may be connected to the global data bus in only one column block. Therefore, the number of amp·latches to be connected to global data bus 35 is suitably determined by employing one of the arrangements of the above mentioned first to eighth embodiments. Any arrangement will do if amp·latches are further selected from amp·latches provided corresponding to a single memory sub block in accordance with column group selection signals YB0 to YB1 for connection to global data bus 35.

It is noted that each of amp·latches 40a to 40w has the arrangement shown in FIG. 33A or 33B.

Figure 35:
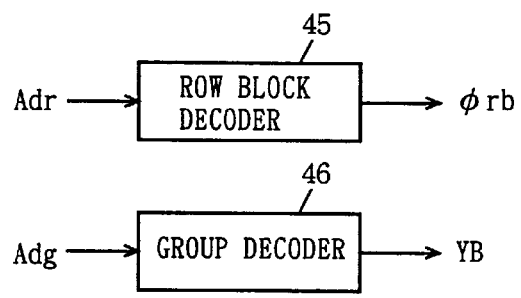
FIG. 35 is a diagram showing an arrangement of a row block selection signal and data bit selection signal generating portion of the semiconductor memory device shown in FIG. 34.

FIG. 35 is a diagram schematically showing an arrangement of a column related selection signal generating portion. In FIG. 35, there are shown; a row block decoder 45 decoding a row block address Adr for producing a row block selection signal φrb; and a group decoder 46 decoding a group address signal Adg for producing data (column) group selection signal YB. In the arrangement for generating a selection signal shown in FIG. 35, one row block is selected by row block decoder 45 and memory cell data corresponding to one row included in the selected row block is transferred to the main amplifier groups. Data bits of the group selected by group selection signal YB from the memory cell data corresponding to one row are selected in accordance with group selection signal YB from group decoder 46. In this case, a bulk of data bits may be selected from one column block or the data bits may be selected from a plurality of column blocks in the memory cell data corresponding to one row.

Figure 36:
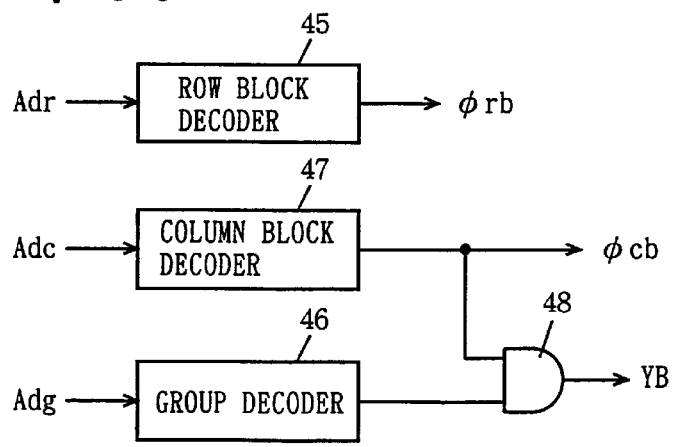
FIG. 36 is a diagram schematically showing another arrangement of a portion generating the row block, column block and data bit block selection signals of the semiconductor memory device shown in FIG. 34.

FIG. 36 is a diagram showing another arrangement of a control signal generating portion for data bit selection. In FIG. 36, there are provided: a row block decoder 45 decoding a row block address Adr for producing a row block selection signal φrb; a group decoder 46 decoding a group address Adg for producing a group identification signal; and a column block decoder 47 decoding a column block designation address Adc for producing a column block designation signal φcb. Column block designation signal φcb from column block decoder 47 is applied to a column decoder and a main amplifier group. A group selection signal YB is output from an AND circuit 48 receiving and decoding column block designation signal φcb and the group identification signal from group decoder 46.

In the arrangement shown in FIG. 36, a group of data bits designated by the group identification signal from group decoder 46 is selected from data bits read from a column block selected by column block designation signal φcb. The column decoder and main amplifier group provided for non-selected column block are maintained remain in a non-selected state (an inactive state). Any of the arrangement shown in FIGS. 35 and 36 may be employed.

It is noted that the arrangement of the path for transferring internal data from global data bus 35 and outputting the data outside the semiconductor memory device through an output buffer may suitably be determined in accordance with an internal pipelined structure of the semiconductor memory device. Alternatively, a register may further be provided in the pipelined structure and data of a plurality of words stored in the register may sequentially be selected. In any case, data is latched at a latch group, and the latch group has only to be accessed at the time of data accessing. Thus, a main I/O line needs not be driven and data word of a desired width can be transferred, thereby achieving high speed data transfer.

Tenth Embodiment

Figure 37:
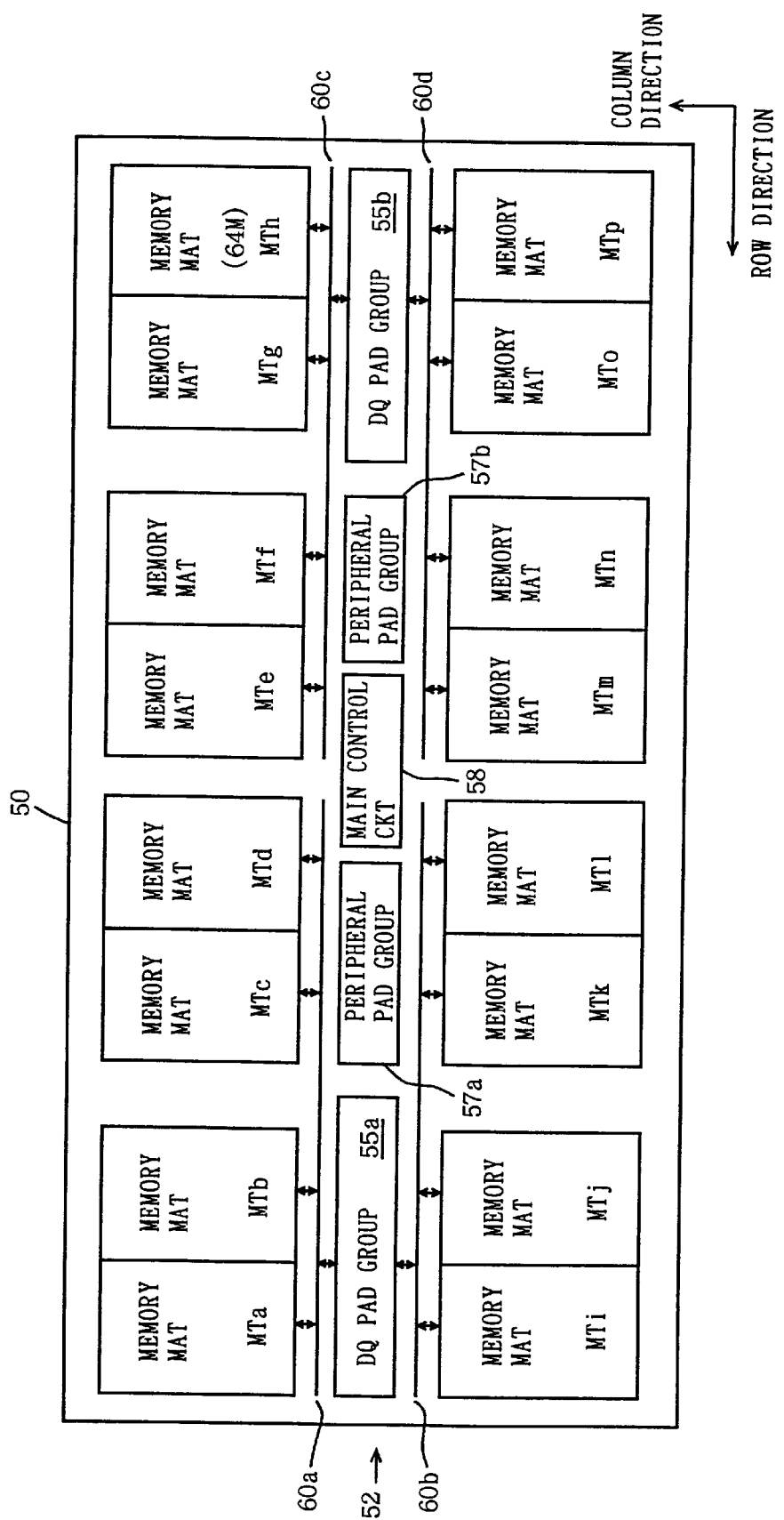
FIG. 37 is a diagram schematically showing an overall arrangement of a semiconductor memory device in accordance with a tenth embodiment of the present invention.

Referring to FIG. 37, a semiconductor memory device 50 includes: memory mats MTa to MTh aligned on one side of a central region 52 arranged extending in a row direction in a middle portion of a chip in a column direction; and memory mats MTi to MTp aligned in the row direction on the other side of central region 52. Memory mats MTa to MTp, whose arrangements will later be described, have a plurality of memory cells arranged in a matrix.

A main control circuit 58 is arranged in the middle portion of central region 52 in the row direction, and peripheral pad groups 57a and 57b are arranged on opposite sides of main control circuit 58 for externally receiving external address and control signals. The address and control signals applied to peripheral pad groups 57a and 57b are applied to main control circuit 58 and access operation for memory mats MTa to MTp is performed under the control of main control circuit 58.

In central region 52, DQ pad groups 55a and 55b each including a pad (a DQ pad) for data inputting/outputting and an input/output buffer circuit for data inputting/outputting are arranged on opposite sides of peripheral pad groups 57a and 57b. The arrangement in which DQ pad groups 55a and 55b are arranged on opposite sides of peripheral pad groups 57a and 57b is referred to as an ODIC (an Outer DQ·Inner Clock) structure. As peripheral pad groups 57a and 57b are arranged in the vicinity of main control circuit 58, a distance between main control circuit 58 and a buffer for receiving an external address signal and an external clock signal (a control signal) is reduced, so that these external signals can be transmitted at high speed. In addition, by arranging DQ pad groups 55a and 55b on the outer region in central region 52, a distance between the memory mats and the DQ pad groups is reduced, so that high speed data transfer can be achieved. Here, the DQ pad portion includes the DQ pad for data inputting/outputting and a data input/output buffer for buffering a signal.

In central region 52, global data buses 60a and 60b are arranged in the row direction and shared by memory mats MTa to MTd and MTi to MTl, respectively. These global data buses 60a and 60b are connected to DQ pad group 55a. Similarly global data buses 60c and 60d are arranged in the row direction and shared by memory mats MTe to MTh and MTm to MTp, respectively. Global data buses 60c and 60d are connected to DQ pad group 55b.

Each of DQ pad groups 55a and 55b performs data input/output operation in parallel at the time of data access. The number of memory mats simultaneously driven into a selected state is appropriately determined. A prescribed number of memory mats are simultaneously selected from memory mats MTa to MTd and MTi to MTl for inputting/outputting data to/from DQ pad group 55a. In addition, a prescribed number of memory mats are selected from memory mats MTe to MTh and MTm to MTp for inputting/outputting data to/from DQ pad group 55b.

Figure 38:
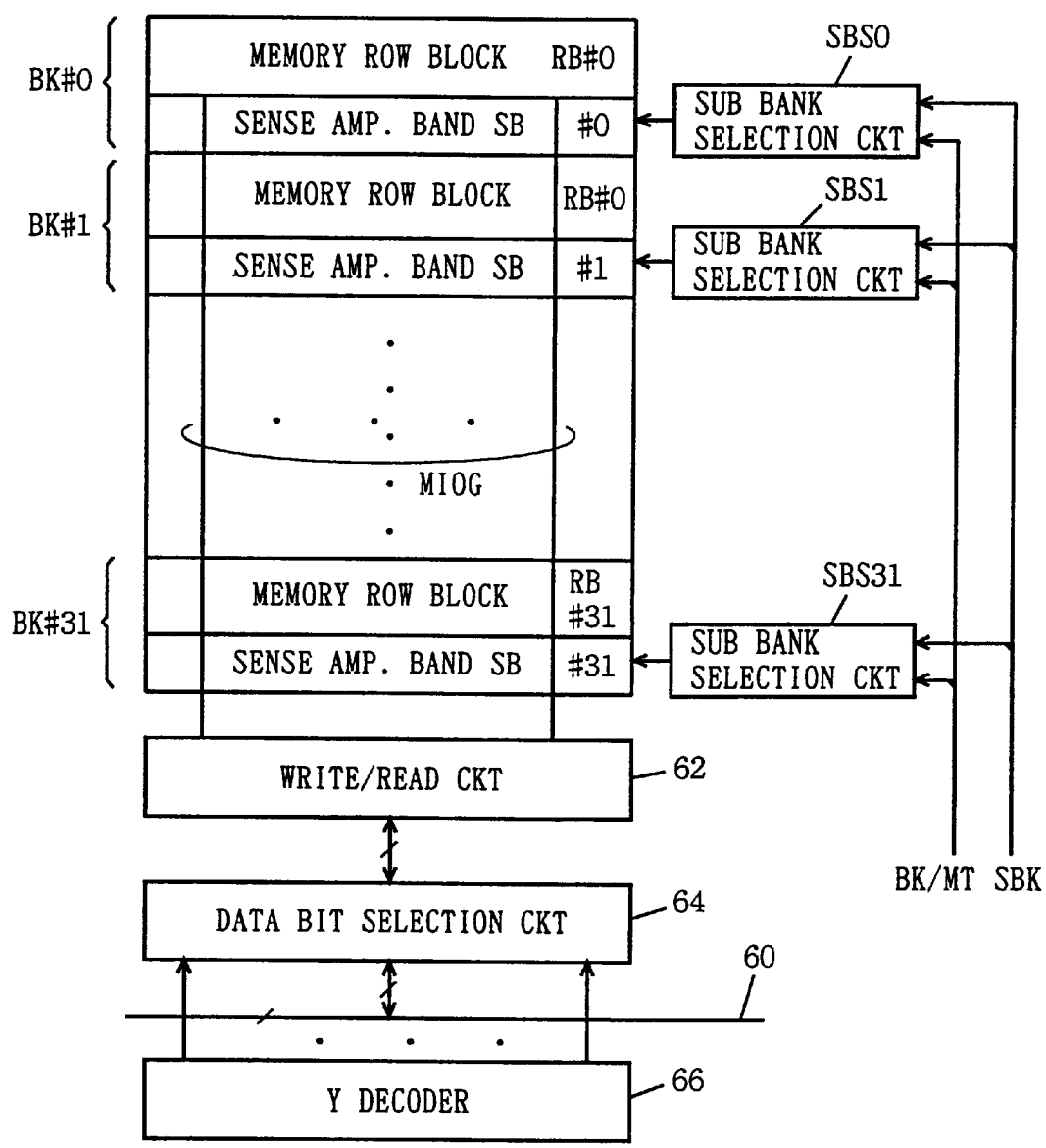
FIG. 38 is a diagram schematically showing an arrangement of a portion related to one memory mat of the semiconductor memory device shown in FIG. 37.

Referring to FIG. 38, a memory mat MT includes: a plurality of memory row blocks RB#0 to RB#31; and sense amplifier bands SB#0 to SB#31 corresponding to memory row blocks RB#0 to RB#31 respectively. Memory row block RB#i (i=0 to 31) and sense amplifier band SB#i (i=0 to 31) form a single bank BK#i. In the arrangement shown in FIG. 38, memory mat MT is divided into thirty-two banks BK#0 to BK#31. These banks BK#0 to BK#31 can each have a memory cell row (word lines) into the selected state or non-selection state independently from others.

Banks BK#0 to BK#31 are further divided into a plurality of sub banks, so that data access is performed every sub bank. For the arrangement of the sub banks, as in the arrangements of the above described first to ninth embodiments, each of sense amplifier bands SB#0 to SB#31 is divided into a plurality of groups each forming a sub bank.

Main I/O line pair group MIOG is provided in the column direction over sense amplifier bands SB#0 to SB#31 and memory row blocks RB#1 to RB#31.

Sub bank selection circuits SBS0 to SBS31 are provided corresponding to sense amplifier bands SB#0 to SB#31 respectively. Each of sub banks selection circuits SBS0 to SBS31 drives one sub bank into the selected state in the corresponding bank in accordance with a bank/mat designation signal SBK for identifying a bank/mat and a sub bank designation signal SBK. Each of sense amplifier bands SB#0 to SB#31 connects a sense amplifier included in the sub bank selected by the corresponding one of sub bank selection circuits SBS0 to SBS31 to a main I/O line pair included in main I/O line pair group MIOG.

Main I/O line group MIOG is connected to a write/read circuit 62 provided at one end of the memory mat. Write/read circuit 62 includes a set of a main amplifier and a write driver provided corresponding to the main I/O line pair included in main I/O line pair group MIOG.

A data bit selection circuit 64 connects the set of main amplifier/write driver included in write/read circuit 62 to global data bus 60 in accordance with a Y selection signal from a Y decoder 66. The number of bits simultaneously selected by data bit selection circuit 64 is suitably determined in accordance with the number of memory mats connected to global data bus 60 and a bit width of transfer circuitry employed in global data bus 60.

In memory mat MT, a plurality of banks can be simultaneously driven into the selected state and data can be latched at the corresponding sense amplifier bands. One sub bank is selected from the plurality of banks by the sub bank selection circuit and connected to main I/O line pair groups MIOG for data accessing. By sequentially switching banks, over-head at the time of page switching is eliminated, thereby enabling fast data access.

Figure 39:
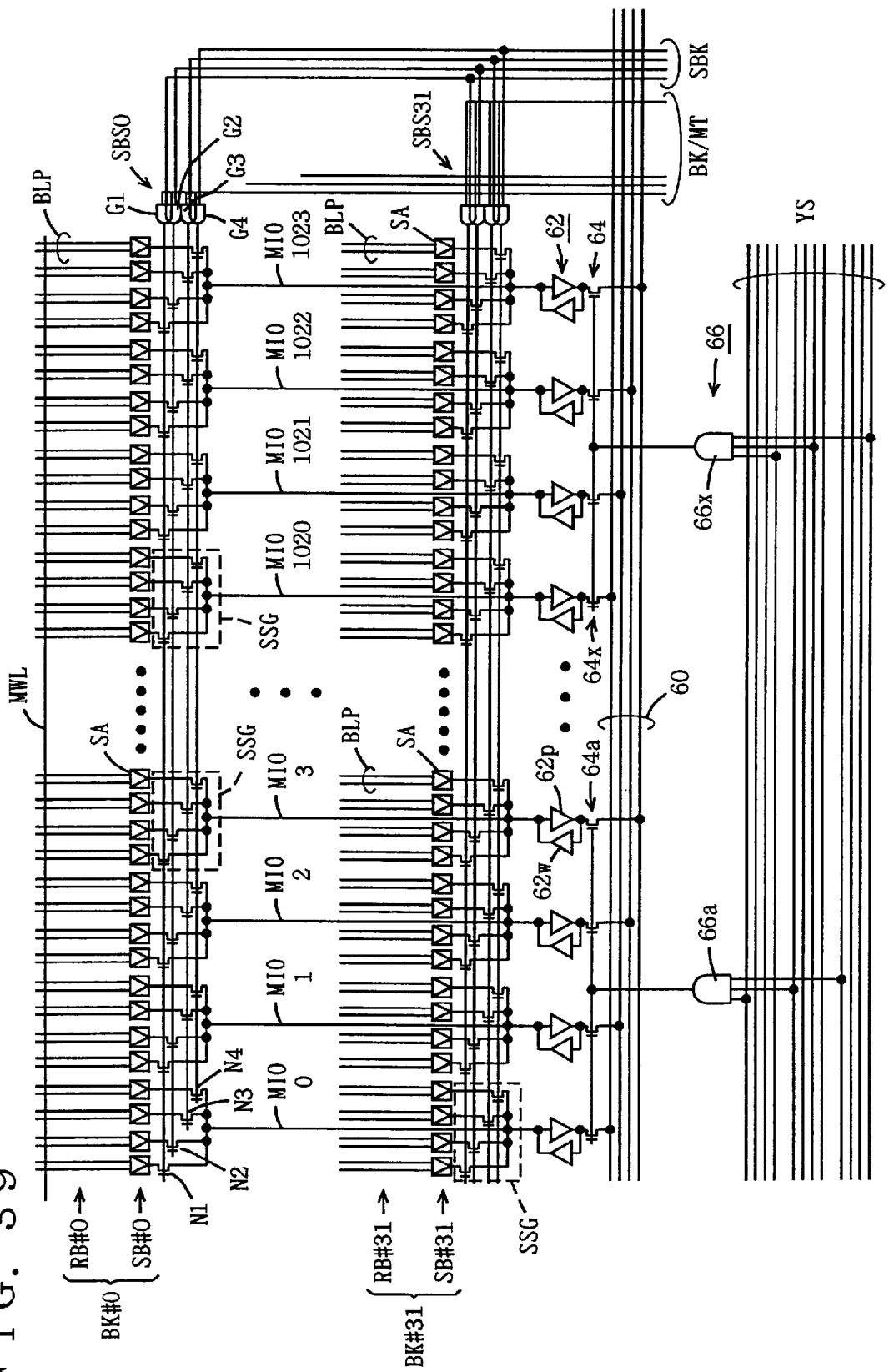
FIG. 39 is a diagram showing in further detail an arrangement of a main portion of the semiconductor memory device shown in FIG. 38.

FIG. 39 is a diagram showing in further detail an arrangement of the mat shown in FIG. 38. In FIG. 39, an arrangement of banks BK#0 and BK#31 and write/read circuit 62 is shown. In row block RB#0 included in bank BK#0, a main word line MWL is provided in the row direction and a plurality of bit line pairs BLP are arranged in the column direction. Main word line MWL is connected to a sub word line through a sub word line driver in an inter-block region, not shown. 4K bit line pairs BLP are provided, for example. A sense amplifier SA is provided for each of bit line pairs BLP. A sub bank selection gate SSG is provided for a set of four adjacent sense amplifiers SA.

In sense amplifier band SB#0, sense amplifiers SA and sub banks selection gates SSG are provided alignedly in a column. Main I/O line pairs MIO0 to MIO1023 are provided respectively corresponding to sub bank selection gates SSG. Sub bank selection gates SSG includes I/O selection gates N1, N2, N3 and N4 each connected to a different sense amplifier. I/O selection gates N1 to N4 included in one sub bank selection gate SSG are connected to the same main I/O line pair MIO.

To selectively driving these I/O selection gates N1 to N4 into a conductive state, four decoding circuits G1, G2, G3 and G4 are provided in a corresponding sub bank selection circuit SBS0. These decoding circuits G1 to G4 receive bank/mat designation signal BK/MT and sub bank designation signal SBK. In the bank designated by bank/mat designation signal BK/MT, the I/O selection gate provided corresponding to the sub bank designated by sub bank designation signal SBK is driven into the conductive state.

A similar arrangement is provided for bank BK#31. Sub bank selection gates SSG aligned in the column direction are connected to a common main I/O line pair MIO. Sub bank selection circuit SBS31 provided for bank BK#31 also includes sub bank decoding circuits G1, G2, G3 and G4 receiving bank/mat designation signal BK/MT and sub bank designation signal SBK. A bank/mat address signal differs for different sub bank selection circuits SBS0 to SBS31. 4-bit sub bank designation signal SBK is commonly applied to sub bank selection circuits SBS0 to SBS31 of banks BK#0 to BK#31.

Write/read circuit 62 includes a set of a main amplifier 62p and a write driver 62w provided for each of main I/O line pairs MIO0 to MIO1023. One of main amplifier 62p and write driver 62w is activated in accordance with data writing/reading mode.

Data bit selection circuit 64 includes data selection gates 64a to 64x each simultaneously selecting a prescribed number of sets of main amplifiers/write drivers. In FIG. 39, four main I/O line pairs are simultaneously selected and connected to global data bus 60. The number of the main I/O line pairs simultaneously selected is suitably determined in accordance with a bit width of global data bus 60 and the number of memory mats simultaneously selected.

Y decoding circuits 66a to 66x are provided respectively corresponding to data selection gates 64a to 64x for decoding a data bit selection address YS (a predecoded signal). A prescribed number of sets of main amplifier 62p and write drivers 62w are selected by data bit selection address (predecoded signal) YS and connected to global data bus 60.

Sense amplifiers SA and sub bank selection gates SSG are provided in each of banks BK#0 to BK#31. Thus, in each of banks BK#0 to BK#31, a row of memory cells can be independently driven into the selected state through main word line MWL. At the time of data access, bank/mat designation signal BK/MT and sub bank designation signal SBK are produced by bank/mat and sub bank addresses, and sense amplifier SA of the sub bank in the selected bank can be connected to main I/O line pairs MIO0 to MIO1023. Thereafter, main amplifier 62p or write driver 62w in write/read circuit 62 is activated for data reading/writing. Then, one of data bit selection gates 64a to 64x is rendered conductive in accordance with an output signal from Y decoding circuits 66a to 66x, and a set of main amplifiers/write drivers is connected to a global data bus 60. Now, an operation of the semiconductor memory device shown in FIGS. 38 and 39 will be described with reference to a timing chart shown in FIG. 40.

The semiconductor memory device is a clock synchronous semiconductor memory device for incorporating an external control signal (a command CMD), incorporating write data and outputting data in synchronization with an externally applied clock signal CLK.

Figure 40:
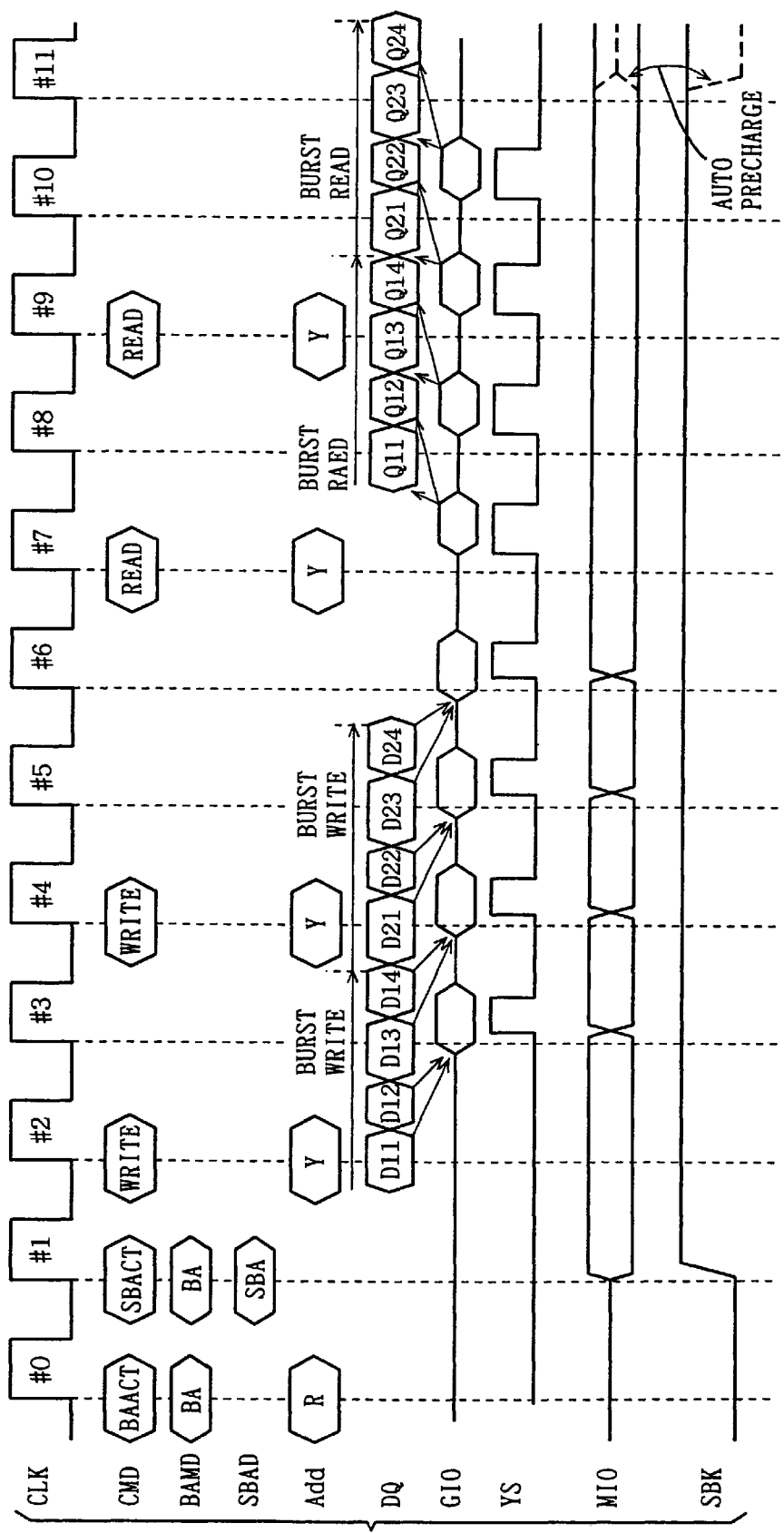
FIG. 40 is a timing chart representing an operation of the semiconductor memory device shown in FIGS. 38 and 39.

Referring to FIG. 40, first, in a clock cycle #0, a bank active command BAACT is applied for driving a bank into the selected state. Simultaneously with bank active command BAACT, a bank/mat address BAMD for designating a bank and a memory mat is applied and a row address R for designating a word line in the bank is also applied. The corresponding word line in the designated bank is selected in accordance with bank active command BAACT and addresses BA and R, and data of the memory cells arranged corresponding to the selected word line (main and sub word lines) is sensed, amplified and latched by sense amplifier SA. Row selection operation is performed in the bank of the mat designated by bank/mat address BAMD in accordance with the bank active command. The row selection operation of the memory cells in the designated bank does not affect the state of other banks.

In a clock cycle #1, a sub bank active command SBACT is applied. Sub bank active command SBACT is applied simultaneously with bank/mat and sub bank addresses BAMD and SBAD. When sub bank active command SBACT is applied, one of bank/mat designation signals BK/MT and one of sub bank designation signals SBK shown in FIG. 39 are driven into the selected state in accordance with bank/mat and sub bank addresses BA and SBA respectively applied as bank/mat and sub bank addresses BAMD and SBAD. Thus, sub bank selection gate SSG is selectively rendered conductive in the sub bank of the designated bank by sub bank active command SBACT, and sense amplifiers SA of the sub bank included in the designated bank are connected to main I/O line pairs MIO0 to MIO1023. Thus, voltage levels of main I/O line pairs MIO0 to MIO1023 are changed from a prescribed precharge level by the sense amplifiers of the respective designated sub bank. Main I/O line pairs MIO0 to MIO1023 are connected to main amplifiers 62p and write drivers 62w of write/read circuits 62.

At the time, even if other banks are in the selected state, all of gates N1 to N4 included in the corresponding sub bank selection gates SSG are in the non-conductive state, so that collision of data is prevented.

In a clock cycle #2, a write command for instructing data writing is applied as an external command CMD. Simultaneously with the write command, a Y address is applied as an address signal Add. At the same time, write data is externally applied. At the time of data writing, data is incorporated in synchronization with rising and falling edges of external clock signal CLK. The write data is transmitted to global data bus 60 (a GIO) shown in FIG. 39. At the time of data writing, the Y address is internally automatically produced using the Y address applied in clock cycle #2 as a leading address, and a data bit selection signal YS is produced. At the time of data writing, after two data (the data written at the rising and falling edges of the clock signal) are simultaneously transmitted to global data bus 60 (GIO) at the rising edge of clock signal CLK in a following clock cycle after they are sequentially stored in registers which will be described later.

In a clock cycle #3, data bit selection signal YS is driven into the selected state in accordance with the address Y and one of bit selection gates 64a to 64x included in the corresponding data bit selection circuit 64 is driven into the selected state. Further, at the time of data writing, write driver 62w is activated and the corresponding main I/O line pair is driven in accordance with the write data.

In the arrangement shown in FIG. 40, a burst length is four and four data D11 to D14 are sequentially incorporated at the rising and falling edges of clock signal CLK and transmitted to main I/O line pair MIO through the global data bus and data bit selection circuit at the rising edge of clock signal CLK in the cycle subsequent to the cycle in which the data are incorporated. At the time of data writing, write driver 62w is simply driven into the selected state and data is only transmitted to the corresponding main I/O line pair.

After write data are transmitted to the main I/O line pair in clock cycles #3 to #6, a read command instructing data reading is applied as command CMD with Y address in a clock cycle #7. When the read command is applied, it is only required that a potential of main I/O line pair MIO has only change in accordance with write data, and the corresponding sense amplifier SA needs not complete latching of write data.

Therefore, there is no need to delay the reading of data until the latched data in the sense amplifier is stabilized into a state corresponding to the write data and the read command can immediately be applied after a write command is applied and the data of burst length are written.

When the read command is applied, a data bit selection signal YS is produced in accordance with the simultaneously applied Y address, the selected bit selection gate (one of gates 66a to 66x) is rendered conductive and main amplifier 62p is connected to global data bus (GIO) 60. When main amplifiers 62p are activated in accordance with the read command, to amplify and transmit data already stabilized on the main I/O line pair onto global data bus (GIO) 60. The data on global data bus (GIO) 60 are stored in a latch circuit (or a register) which is not shown and, subsequently, sequentially output in synchronization with the rising and falling edges of clock signal CLK. Burst length (4) data Q11 to Q14 are read in accordance with the read command applied in clock cycle #7.

When the read command and Y address are again applied in a clock cycle #9, data bits are selected by gates 66a to 66x using the Y address as a leading address, outputs from corresponding main amplifiers 62p are transmitted to the global data bus through bit selection gates (64a to 64x), and next burst length data Q21 to Q24 are selected and output in synchronization with the rising and falling edges of clock signal CLK.

When the reading of burst length data is internally completed in a clock cycle #10 in the timing chart shown in FIG. 40, sub bank designation signal SBK may be driven into the non-selected state and main I/O line pair MIO is precharged to a prescribed potential, as shown by dotted lines.

Figure 41:
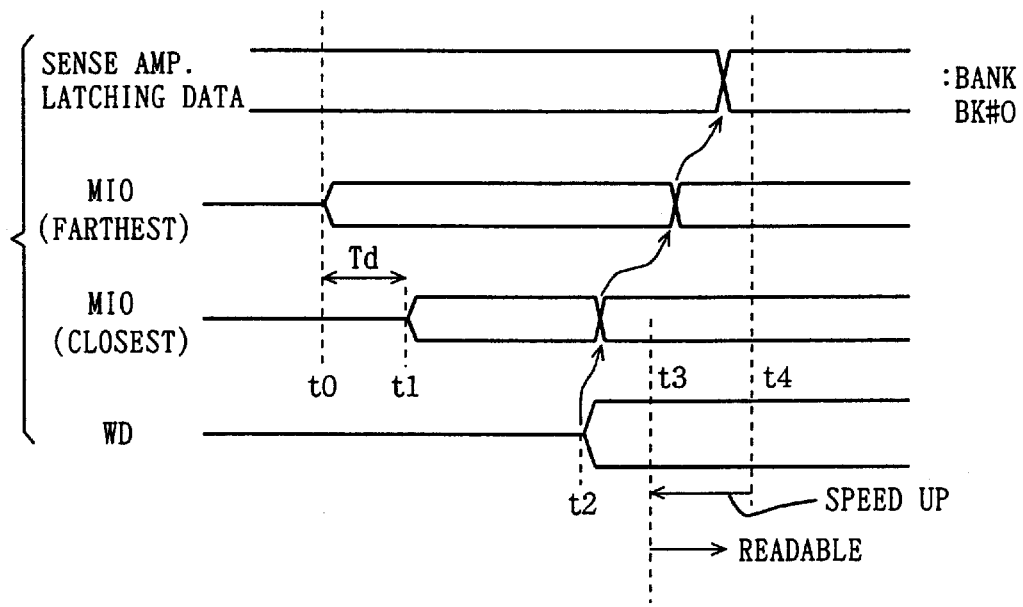
FIG. 41 is a diagram depicting the effect of the semiconductor memory device shown in FIGS. 38 and 39.

FIG. 41 is a diagram schematically showing data propagation of the main I/O line pair. FIG. 41 shows propagation of data for the sense amplifier arranged in bank BK#0 located farthest from write/read circuit 62.

When a sub bank active command is applied at time t0, the data latched at the sense amplifier is transmitted to main I/O line pair MIO through sub bank selection gate SSG. A potential of the main I/O line pair changes in accordance with the latched data of the sense amplifier in the portion closest to the sense amplifier (that is, the end portion farthest from the write/read circuit), and is transmitted to the end portion closest to the write/read circuit (the end portion closest to the MIO) after time Td and, data reaching the write driver and the preamplifier is definite at time t1. At time t1, data writing/reading can actually be performed.

When a write command is applied at the time t2, a potential of the end portion closest to the main I/O line pair is changed by the write driver in accordance with write data WD, data of the main I/O line pair is transmitted through the main I/O line pair to reach the end portion farthest from the write driver. The time required therefor corresponds to delay time Td. The data transmitted to the end portion farthest from the main I/O line pair is transmitted to the sense amplifier through sub bank selection gate SSG so that the latched data of the sense amplifier changes.

In this case, before time t4 at which the latched data of the sense amplifier is inverted, data can be read at time t3 at which the signal potential of the closest end portion of the main I/O line pair is made definite. Thus, data can be read (the read command can be applied) before the latched data of the sense amplifier is made definite, thereby enabling high speed data reading. Especially, data can be read at high speed in transition from data writing to data reading operation for the same sub bank. This is because signal electric charges retained in the main I/O line pair are simply read and the time required for definition of the latching data of the sense amplifier in the memory sub block is not needed.

Figure 42:
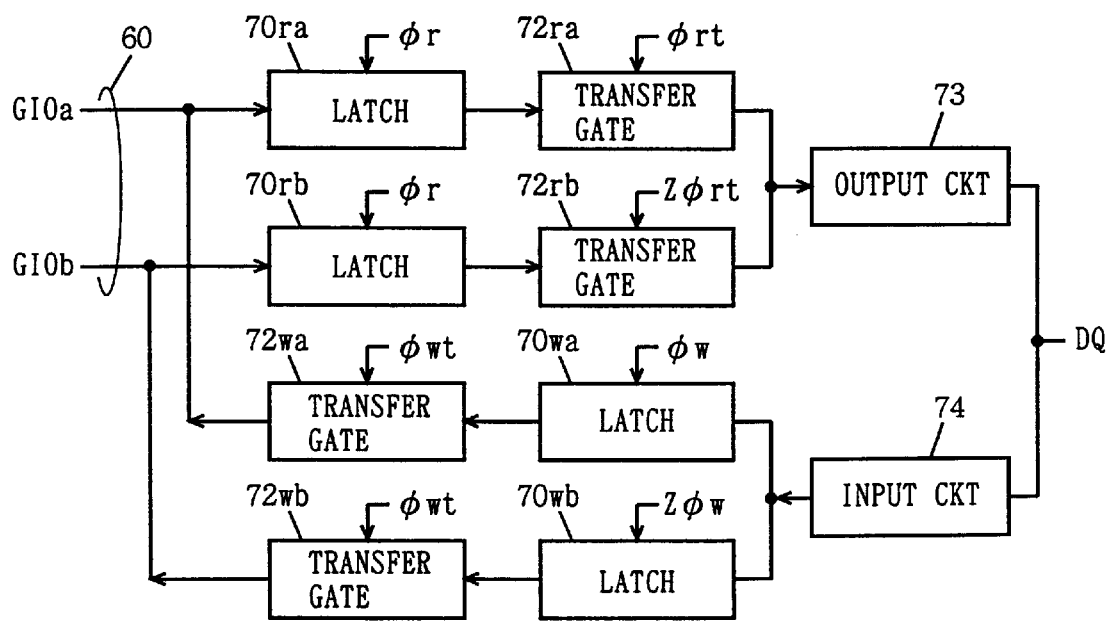
FIG. 42 is a diagram schematically showing an arrangement of an internal data transferring portion of the semiconductor memory device shown in FIGS. 38 and 39.

FIG. 42 is a diagram schematically showing an arrangement of a data inputting/outputting portion. In FIG. 42 there are provided: latches 70ra and 70rb responsive to a latch instruction signal $\phi r$ for latching data on sub global data buses GIOa and GIOb of an arbitrary bit width included in global data bus 60; a transfer gate 72ra transferring latched data of latch 70ra to an output circuit 73 in accordance with a transfer instruction signal $\phi rt$; and a transfer gate 70rb responsive to a transfer instruction signal $z\phi rt$ for transferring data latched at latch 70rb to output circuit 73. Transfer instruction signal $\phi rt$ and $z\phi rt$ are complementary dock signals. Transfer instruction signals $\phi rt$ and $z\phi rt$ are activated at the time of data reading in synchronization with clock signal CLK. Thus, as transfer gates 72ra and 72rb alternately perform transfer operation, data can be output through output circuit 73 in synchronization with the rising and falling edges of clock signal CLK.

The data inputting/outputting portion further includes: an input circuit 74 inputting external data at the time of data writing; a latch circuit 70wa responsive to a latch instruction signal $\phi w$ for latching data from input circuit 74; a latch circuit 70wb responsive to latch instruction signal $z\phi rw$ for latching data from input circuit 74; and transfer gates 72wa and 72wb responsive to transfer instruction signal $\phi wt$ for transferring data latched at latches 70wa and 70wb to sub global data buses GIOa and GIOb.

In the arrangement of the data inputting/outputting portion shown in FIG. 42, at the time of data reading, two data transferred onto global data bus 60 are latched at latches 70ra and 70rb and, subsequently, alternately transferred by transfer gates 72ra and 72rb in synchronization with the edges of the clock signal. On the other hand, at the time of data writing, internal write data from input circuit 74 are alternately latched at latches 70wa and 70wb and, subsequently, transferred onto global data bus 60 in parallel by transfer gates 70wa and 70wb. Thus, data inputting/outputting can be performed in synchronization with the rising and falling edges of clock signal CLK and the operation of the internal circuit can be performed responsive to one edge (rising edge) of clock signal CLK.

Figure 43:
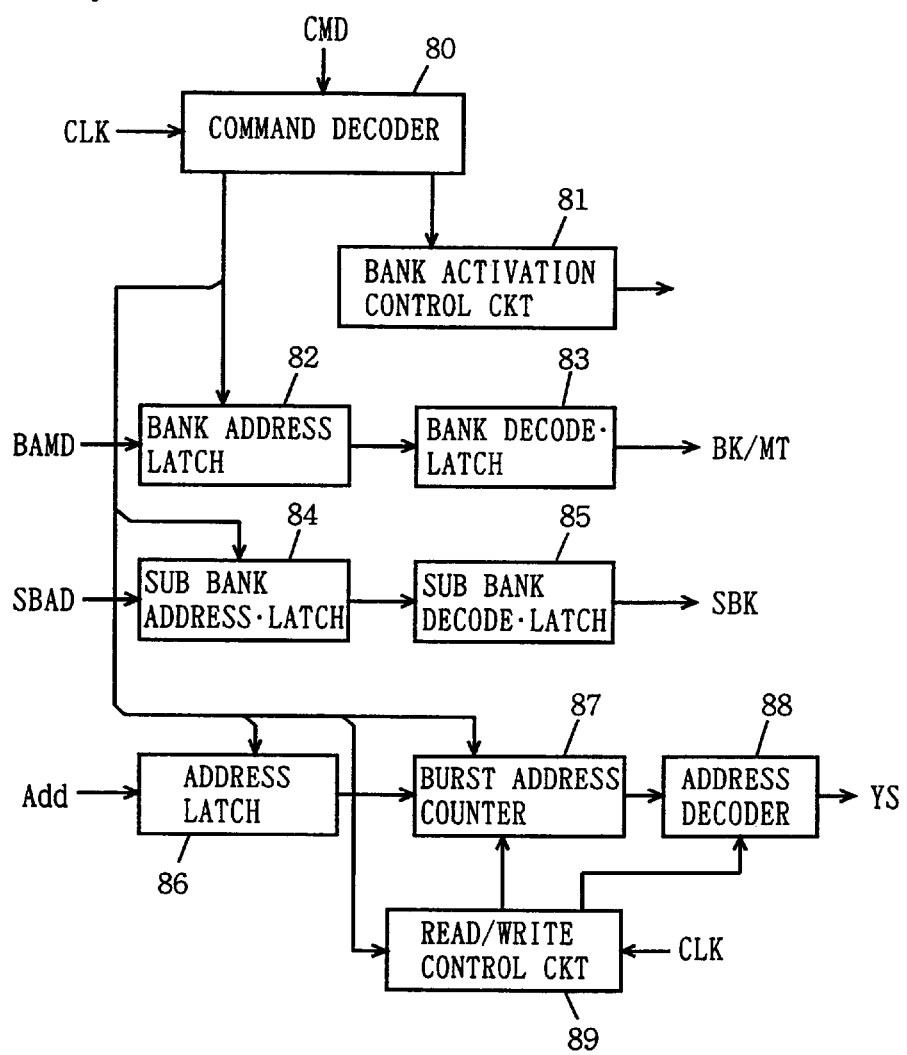
FIG. 43 is a diagram schematically showing an arrangement of an internal selection signal generating portion of the semiconductor memory device in accordance with the tenth embodiment of the present invention.

FIG. 43 is a diagram schematically showing an arrangement of a selection signal generating portion shown in FIGS. 38 and 39. Referring to FIG. 43, the selection signal generating portion includes: a command decoder 80 incorporating and decoding externally applied command CMD in synchronization with clock signal CLK for generating a designated operation mode instruction signal; a bank activation control circuit 81 activated in response to a bank activation instruction signal from command decoder 80 for generating a control signal for driving a bank into an active state; a bank address latch 82 responsive to bank and sub bank activation instruction signals from command decoder 80 for latching externally applied bank/mat address BAMD; a bank decoding-latch 83 decoding an output signal from bank address latch 82 for producing and latching bank/mat designation signal BK/MT; a sub bank address-latch 84 responsive to the sub bank activation instruction signal from command decoder 80 for incorporating and latching externally applied sub bank address SBAD; a sub bank decoding-latch 85 decoding the sub bank address latched at sub bank address-latch 84 for producing sub bank designation signal SBK; an address latch 86 responsive to the sub bank activation instruction signal and data writing/reading instruction signal from command decoder 80 for latching externally applied address signal Add; a burst address counter 87 responsive to data read/write instruction signal from command decoder 80 for incorporating the address of address latch 86 as a leading address and sequentially changing the address in a prescribed sequence; and an address decoder 88 decoding an output address from burst address counter 87 for producing data bit selection signal YS.

Burst address counter 87 and address decoder 88 operate in synchronization with clock signal CLK under the control of read/write control circuit 89 enabled in response to the read/write instruction signal from command decoder 80. Read/write control circuit 89 enables burst address counter 87 and address decoder 88 for a period of the burst length in synchronization with clock signal CLK. Read/write control circuit 89 also controls activation/inactivation of the main amplifier and write driver included in the write/read circuit and operation of the transferring portion shown in FIG. 42 for data writing/reading.

In the arrangement shown in FIG. 43, data bit selection signal YS from address decoder 88 is applied to each memory mat and combined with memory mat address through a logical product and data bit selection operation is performed in the selected memory mat. This is equivalent to activation/inactivation of only the main amplifier and write driver provided for the memory mat including a selected sub bank/bank in the control operation performed by read/write control circuit 89.

It is noted that the arrangement shown in FIG. 43 allows sub bank designation signal SBK to maintain the active state after sub bank address command SBACT is applied with reference to a signal waveform diagram shown in FIG. 40. Sub bank designation signal SBK may be brought into a reset state after the period of the burst length is elapsed from when a write or read command is applied, and the main I/O line pair may be precharged to a prescribed potential level.

It is noted that in the timing chart shown in FIG. 40, if the write and read commands have an auto-precharging function, the main I/O line pair may be precharged to the prescribed potential and bank designation signal SBK be driven into the non-selected state after writing/reading of the burst length data is completed. In this case, when the write or read command is applied every burst length, the auto-precharging is reset and the main I/O line pair is not precharged to the prescribed potential level.

The timing in the case where the read/write command has the auto-precharging function is shown by dotted lines for the main I/O line pair and sub bank designation signal SBK in FIG. 40.

Modification

Figure 44:
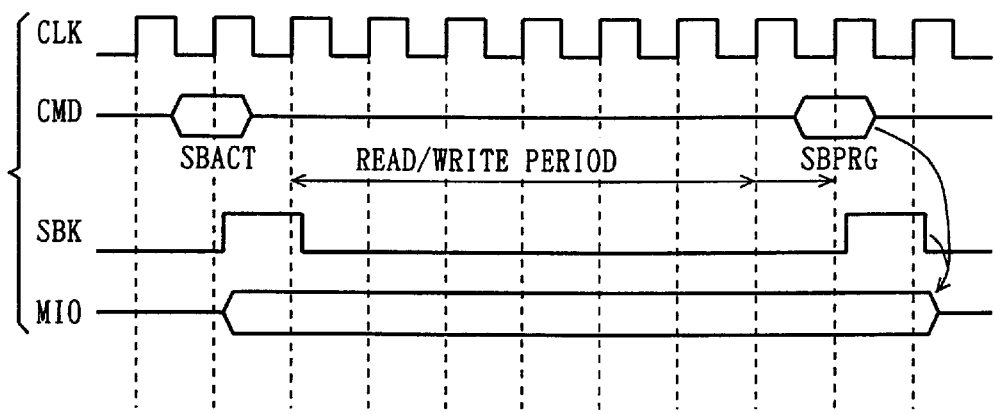
FIG. 44 is a diagram schematically showing an arrangement of a modification of the tenth embodiment of the present invention.

FIG. 44 is a diagram showing an operation sequence of a modification of the tenth embodiment of the present invention. Referring to FIG. 44, externally applied command CMD includes sub bank active command SBACT and a sub bank precharge command SBPRG. When sub bank active command SBACT is applied, sub bank designation signal SBK is driven into the selected state for a prescribed period and data latched by the sense amplifiers of the sub bank designated by sub bank active command SBACT are transmitted to main I/O line pairs MIO. After the prescribed period is elapsed and sub bank selection signal SBK is brought into the non-selected state, main I/O line pairs MIO are brought into a floating state and retains data transmitted from the selected sub bank. In this state, data writing/reading is performed. As the memory array portion is disconnected at the time of data writing/reading, data writing/reading is only performed for the main amplifiers and the write drivers. Because a path for performing data writing/reading for a memory cell through the main I/O line pair and the sense amplifier and causing the longest signal propagation delay is eliminated, data writing/reading can be performed at high speed.

When the data writing/reading and accessing the sub bank are completed, sub bank precharge command SBPRG is applied. Sub bank designation signal SBK is again driven into the selected state of H level for a prescribed period in accordance with sub bank precharge command SBPRG, the main I/O line pair and the sense amplifier of the designated sub bank are connected for the prescribed period and data is written back to the sense amplifier of the sub bank. This is because write data is transferred to and retained by the main I/O line pair at the time of data writing and the write data is not transferred to a sense amplifier. After sub bank precharge command SBPRG is applied and sub bank designation signal SBK is driven into the selected state for the prescribed period, main I/O line pair MIO is precharged to a prescribed potential.

Sub bank precharge command SBPRG must be applied at the time of sub bank switching, so that one clock cycle is required for the sub bank switching. If the sub bank switching is performed by switching the memory mat, however, over-head by the sub bank precharge command does not have any influence on external access. In addition, the bank remains in a selected state and the sub bank selection gate is merely activated/inactivated, so that the time required for precharging operation is short as compared with a usual bank precharge command for switching a word line from the selected state to non-selected state. Thus, less time is required as compared with the case where the bank is inactivated by a usual bank precharge command and over-head for the sub bank switching is sufficiently smaller than that for the bank switching, thereby maintaining fast access (when accessing is continuously performed in the same mat).

It is noted that, for the structure in FIG. 44 responsive to sub bank active and sub bank precharge commands SBACT and SBRPG for driving sub bank designation signal SBK into the active state for the prescribed period, the structure shown in FIG. 43 can simply be employed in which sub bank decoding·latch 85 is brought into the active state for the prescribed period in accordance with the output signal from command decoder 80. In this case, a main I/O line pair precharge circuit is configured to be brought into an inactive state when the sub bank active command is applied and into the active state when a prescribed period of time is elapsed after sub bank precharge command SBPRG is applied.

Figure 45:
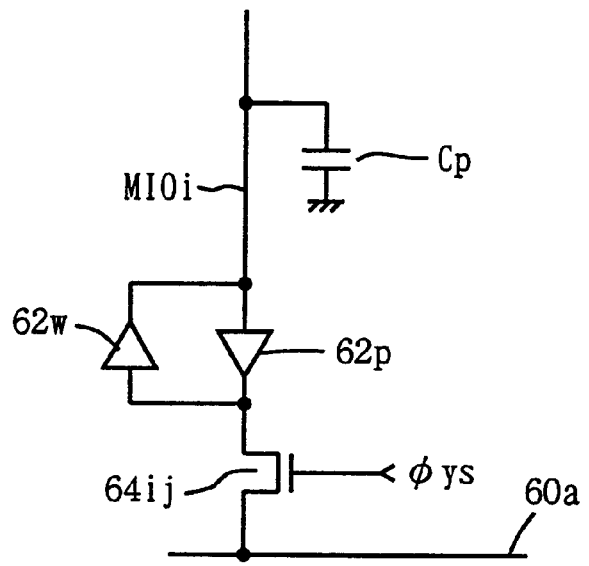
FIG. 45 is a diagram for explaining an operation of the modification of the tenth embodiment of the present invention.

FIG. 45 is a diagram schematically showing an arrangement for a main I/O line pair in data writing/reading in the arrangement of the modification of the tenth embodiment of the present invention. In FIG. 45, a main I/O line pair MIOi has a parasitic capacitance Cp. A main amplifier 62p and a write driver 62w are provided for main I/O line pair MIOi. Main amplifier 62p and write driver 62w are connected to a global data bus line 60a through a selection gate 64ij included in a data bit selection circuit 60. Selection gate 64ij receives at its gate a selection signal φYS produced by decoding a data bit selection signal YS.

When sub bank active command SBACT is applied as shown in FIG. 33, sub bank selection signal SBK is activated for a prescribed period of time and data is transmitted to main I/O line pair MIOi and data from a sense amplifier of the corresponding sub bank is stored in parasitic capacitance Cp. When sub bank selection signal SBK is driven into the non-selected state, main I/O line pair MIOi is brought into the floating state. When a write/read command is applied, write driver 62w or main amplifier 62p is activated. In this state, at the time of data reading, the data which has simply been stored in parasitic capacitance Cp is amplified by amplifier 62p and transmitted to global data bus line 60a through selection gate 64ij. At the time of data writing, write data on global data bus line 60a is applied to write driver 62w through selection gate 64ij. Write driver 62w amplifies the applied write data for storage in parasitic capacitance Cp. Thus, main I/O line pair MIOi needs not have the farthest end portion driven for inputting/outputting data to/from the corresponding sense amplifier, thereby enabling fast data access.

When data access is completed, main I/O line pair MIOi is again connected to the sub bank for data writing and precharged to a prescribed potential when the data writing is completed.

Figure 46:
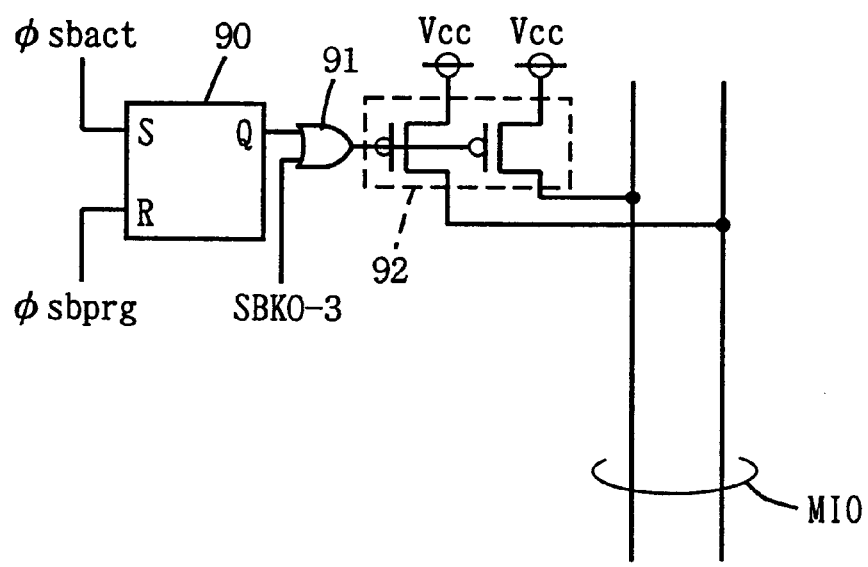
FIG. 46 is a diagram schematically showing an arrangement of a main I/O line pair precharging portion of the modification of the semiconductor memory device in accordance with the tenth embodiment of the present invention.

FIG. 46 is a diagram schematically showing an arrangement of a precharge circuit provided for one main I/O line pair and a controlling portion thereof. Referring to FIG. 46, a main I/O line pair precharge control circuit includes: a set/reset flip-flop 90 set and reset in response to a sub bank activation instruction signal φsbact and a sub bank precharge instruction signal φsbprg, respectively; and an OR circuit receiving a signal from an output Q of set/reset flip-flop 90 and sub bank selection signals SBK0 to SBK3 included in the sub bank designation signal. Precharge circuit 92 is formed of a p channel MOS transistor and precharges each I/O line of main I/O line pair MIO to the level of power supply voltage Vcc.

Sub bank activation instruction signal φsbact is driven into the active state for a prescribed period of time when sub bank active command SBACT is applied. Sub bank precharge instruction signal φsbprg is driven into the active state for the prescribed period of time when sub bank precharge command SBPRG is applied. Thus, when sub bank active command SBACT is supplied, set/reset flip-flop 90 is set, a precharge instruction signal from OR circuit 91 attains the H level and, responsively, precharge circuit 92 is brought into the inactive state. On the other hand, when sub bank precharge instruction signal φsbprg is brought into the active state, set/reset flip-flop 90 is reset. When all of sub bank selection signals SBK0 to SBK3 are brought into the inactive state at L level, an output signal from OR circuit 91 is brought into the inactive state, and precharge circuit 92 is activated for precharging each I/O line of main I/O line pair MIO to the level of power supply potential Vcc.

Thus, from the time at which a sub bank active command is applied to that at which a sub bank precharge command SBPRG is applied, each I/O line of the main I/O line pair is in the floating state and data access is performed for parasitic capacitance Cp (refer to FIG. 45).

As described above, according to the tenth embodiment of the present invention, in a plurality of banks and sub banks sharing a main I/O line pair, after data of a selected sub bank is transferred to the write/read circuit using the sub bank active command, data writing/reading is performed using the write/read command. Therefore, the data writing/reading needs only be performed for the write/read circuit including the main amplifier and the write driver, and the need for driving the main I/O line pair and the sense amplifiers is eliminated. As a result, the delay caused by the signal propagation path is eliminated, thereby enabling fast access. Especially, the switching from writing to reading operation for accessing the same sub bank is simply achieved by driving the main amplifier and the need for waiting until write data is written to the sense amplifier can be eliminated. Thus, high speed switching from writing to reading operations can be achieved.

Eleventh Embodiment

Figure 47:
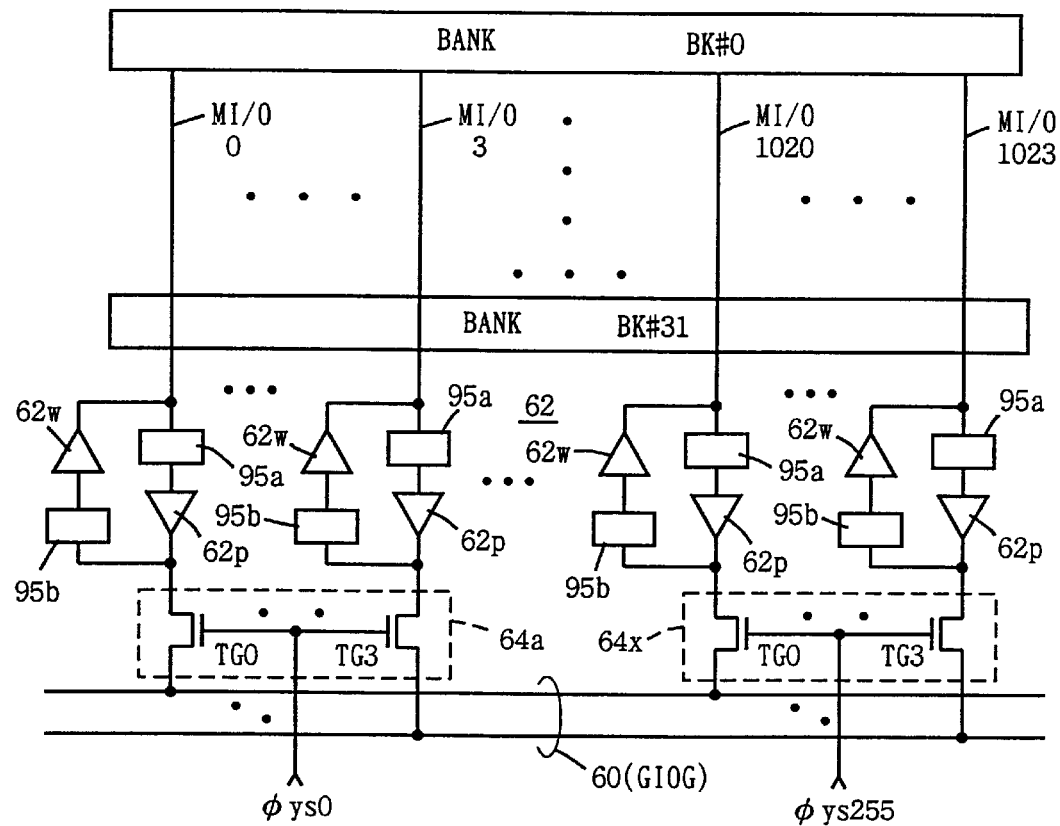
FIG. 47 is a diagram schematically showing an overall arrangement of a semiconductor memory device in accordance with an eleventh embodiment of the present invention.

FIG. 47 is a diagram schematically showing an arrangement of a main portion of a semiconductor memory device in accordance with an eleventh embodiment of the present invention. As shown in FIG. 47, main I/O line pairs MIO0 to MIO1023 are shared by banks BK#0 to BK#31. In a write/read circuit for inputting/outputting data to/from these main I/O line pairs MIO0 to MIO1023, a latch circuit 95a is provided in a preceding stage of a main amplifier 62p and a latch circuit 95b is provided in a preceding stage of a write driver 62w. Other parts of the structure are the same as those shown in FIG. 39 and the corresponding portions are denoted by the same reference characters. Here, in FIG. 36, data bit selection circuits 64a to 64x are shown including selection gates TG0 to TG3, respectively.

Latch circuit 95a incorporates and latches data read on main I/O line pairs MIO0 to MIO1023 when a sub bank is activated. At the time of data reading, data can be incorporated to latch 95a and main I/O line pairs MIO0 to MIO1023 can be brought back into the precharge state. On the other hand, at the time of data writing, write data can be latched at latch circuit 95b while maintaining main I/O line pairs MIO0 to MIO1023 in the precharge state. Thereafter, the sub bank is selected and data written to latch circuit 95b is written through write driver 62w. For externally inputting/outputting data, data transfer is performed between latch circuits 95a and 95b and a data input/output circuit not shown in the drawing (refer to FIG. 42). Thus, for transferring data to and from an external device, fast data access can be achieved as a path for transferring data between main I/O line pairs MIO0 to MIO1023 and the sense amplifiers can be eliminated, for which path the longest time is required for signal propagation.

Figure 48:
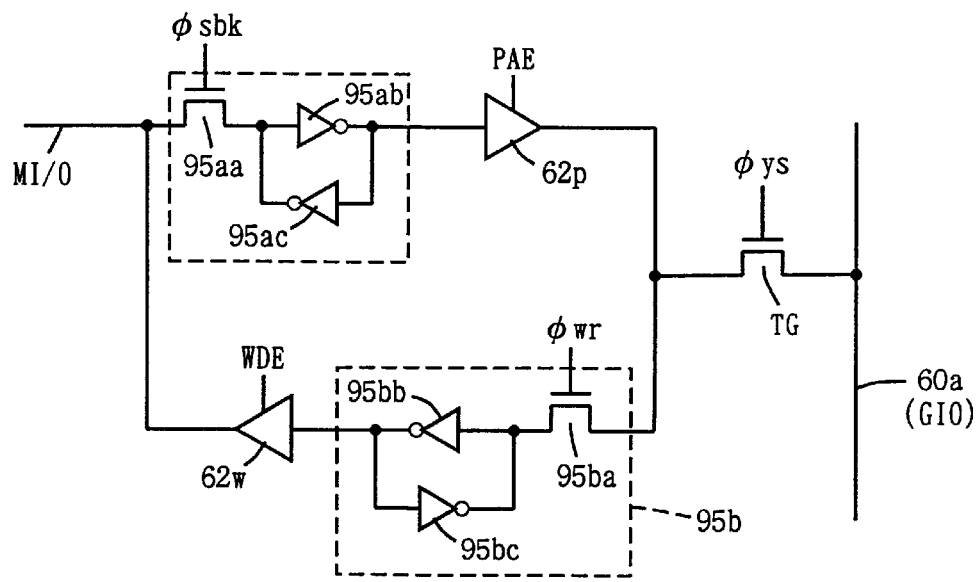
FIG. 48 is a diagram exemplifying an arrangement of a latch circuit shown in FIG. 47.

FIG. 48 is a diagram exemplifying an arrangement of a portion corresponding to 1-bit main I/O line pair MIO of the write/read circuit shown in FIG. 47. Referring to FIG. 48, latch circuit 95a includes: a transfer gate 95aa rendered conductive on activation of a sub bank selection instruction signal φsbk for transmitting a signal potential on main I/O line pair MIO; an inverter 95ab inverting a signal applied through transfer gate 95aa; and an inverter 95ac inverting an output signal from inverter 95ab for transmission to an input portion of inverter 95ab. Inverters 95ab and 95ac form an inverter latch. The latched data in latch circuit 95a is applied to main amplifier 62p.

Main amplifier 62p is activated upon activation of a main amplifier activation signal PAE and amplifies data applied from latch circuit 95a.

Latch circuit 95b includes: a transfer gate 95ba rendered conductive in response to a write activation instruction signal φwr activated at the time of data writing for transferring data applied from a global data bus line 60a (GIO) through a selection gate PG; and inverters 95bb and 95bc for latching data transmitted through transfer gate 95ba. Latched data in latch circuit 95b is applied to write driver 62w activated in response to a write driver enable signal WDE.

Thus, for data access by the external device through global data bus 60 (a bus line 60a), main I/O line pair MIO and global data bus 60 (bus line 60a) are disconnected for data inputting/outputting between latch circuit 95a or 95b and global data bus 60 (bus line 60a), thereby allowing fast data access. The operation of the semiconductor memory device shown in FIGS. 47 and 48 will now be described with reference to a timing chart shown in FIG. 49.

In a clock cycle #0, a bank active command BAACT is applied. Row selection operation is performed in the bank designated by an address BAa applied as a bank/mat address BAMD in accordance with a bank active command BAACT.

Thereafter, a write command instructing data writing is applied in a clock cycle #1. when the write command is applied, address BAa is also applied as bank/mat address BAMD and a data bit group Ya is designated by an address Y also applied at the time. A sub bank address SBAD is not required when a write command is applied. This is because data writing is simply performed for latch circuit 95b shown in FIG. 47. Write data D11, D12, D13 and D14 are applied in synchronization with rising and falling edges of clock signal CLK. Column selection operation is internally performed using address Ya as a leading address. Write data are transferred to an internal global data bus by two data in each clock cycle. In a clock cycle #2, a data bit selection signal φys is driven into a selected state in accordance with address Ya and data on a global data bus GIO (a bus 60) is stored in latch circuit 95b provided in a preceding stage of a selected write driver. At the time of writing operation, a write activation instruction signal φwr is activated and data applied through a transfer gate TG (shown in FIG. 48) is incorporated in latch circuit 95b.

In a clock cycle #3, data bit selection signal φysa is again driven into the selected state in accordance with a burst address and data on global data bus 60 (GIO) is transferred to and latched at latch circuit 95b included in a newly selected data bit selection circuit.

In clock cycle #3, simultaneously, a write back command WBACK is applied as a command CMD for instructing data writing. When write back command WBACK is applied, a sub bank SBAa designated by bank/mat address BAa and sub bank address SBAD which are simultaneously applied at the time is driven into the selected state, and sense amplifiers of the sub bank included in the designated bank are connected to main I/O line pairs MIO0 to MIO1023. At the time, write driver 62w is also activated in response to a write driver enable signal WDE for transmitting data latched at latch circuit 95b on the main I/O line pair. Thus, transfer data from write driver 62w is transferred to and latched at a sense amplifier of the selected sub bank through the main I/O line pair.

When data transfer operation is completed, a sub bank designation signal SBK is driven into the non-selected state and the main I/O line pair is again precharged to a prescribed potential. Although main I/O line pair MI/O is shown being precharged to an intermediate potential level in FIG. 49, it may be precharged to a power supply voltage Vcc level as shown in FIG. 46.

The write command is again applied in a clock cycle #4 and bank/mat column such operation is performed in accordance with addresses BAa and Yb applied respectively as current bank/mat address BAMD and Y address. In accordance with the write command, again, data D21, D22, D23 and D24 are transferred to and latched at latch circuit 95b in accordance with data bit selection signal φys produced in accordance with a burst address using address Yb as a leading address.

In a clock cycle #6, address BAa and sub bank address SBAb are applied respectively as bank/mat and sub bank addressed BAMD and SBAD. In this case, a different sub bank is selected in the same bank/mat. Therefore, newly written data D21 to D24 are transferred to and latched at the sense amplifiers of sub bank SBAb through the main I/O lines pair from the write drivers.

In a clock cycle #7, sub bank active command SBACT is applied. When sub bank active command SBACT is applied, a bank and sub bank are selected in accordance with current bank/mat and sub bank addresses BAb and SBAc, so that a sense amplifier of the selected sub bank is connected to main I/O line pair MI/O and data of the main I/O line pair changes in accordance with data transferred from the sense amplifier. At the time, sub bank selection activation signal φsbk is also activated and latch circuit 95a incorporates and latches data transferred onto a corresponding main I/O line pair MIO.

Thereafter, in a clock cycle #8, a read command instructing data reading is applied and, data bit selection is performed in accordance with current bank/mat and bit group addresses BAb and Yc, and amplified data from corresponding main amplifier 62p is transmitted onto the global data bus line pair. Subsequently, data are sequentially selected using address Yc as a leading address, so that data Q11 to Q14 selected in clock cycles #8 and #9 are sequentially output in synchronization with the rising and falling edges of clock signal CLK.

When sub bank active command SBACT is applied, sub bank selection operation activation signal φsbak and sub bank designation signal SBK are kept in the selected state only for a prescribed period. After data is transferred to latch circuit 95a from a sense amplifier, the selected sub bank is disconnected from the main I/O line pairs. Thus, after data is latched at latch circuit 95a, main I/O line pairs MI/O0 to MI/O1023 can be precharged to a prescribed voltage level.

Figure 49:
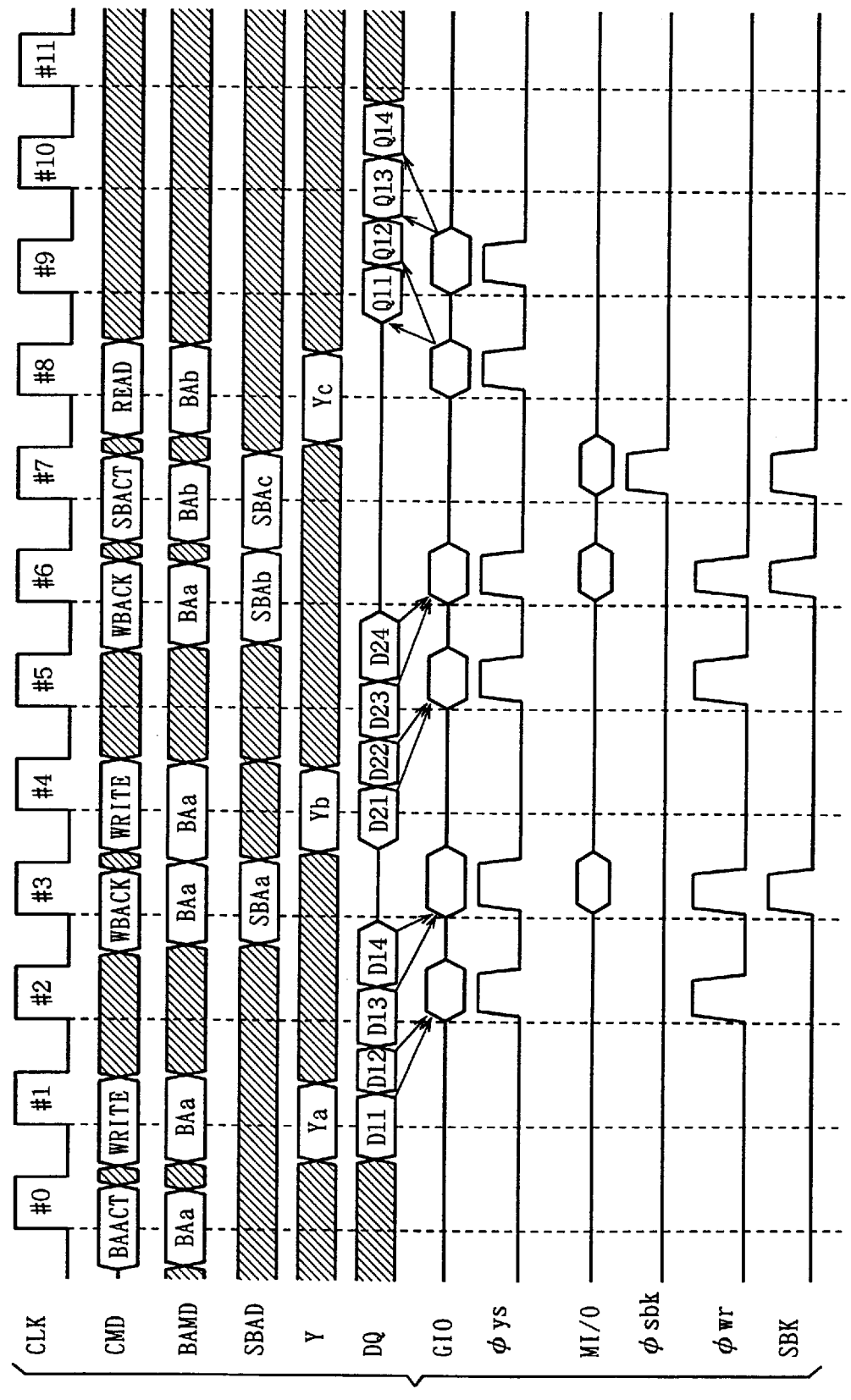
FIG. 49 is a timing chart representing an operation of the semiconductor memory device in accordance with the eleventh embodiment of the present invention.

As an operation sequence shown in FIG. 49, at the time of data writing, data must be written to the sub bank by a write back command WBACK. At the time of data reading, however, data can be successively read by applying sub bank active command SBACT. Data transfer through the global data bus line pair is simply performed between latch circuits 95a and 95b and an input/output circuit. The main I/O line pair which requires the longest time for signal propagation and the sense amplifier are disconnected when the internal data transfer (write/read operation) is performed. Thus, fast data access can be externally performed.

In transition from data writing to reading, write back command WBACK and sub bank active command SBACT are required. However, in switching the mode on the main I/O line pairs, the write back operation and data reading operation can be hidden by switching the mat. Also in switching the bank at the time of data writing, the period required for write back operation can be hidden by switching the mat. Similarly, at the time of data reading operation, the period during which sub bank active command SBACT is applied can be hidden from external access by accessing another memory mat when sub bank active command SBACT must be applied. Thereby, the path between the memory array and the main amplifier and write driver, requiring the longest time for data transfer, is open-circuited at the time of internal data transfer and external data writing/reading. Thus, the clock cycle is reduced, enabling fast access.

Figure 50:
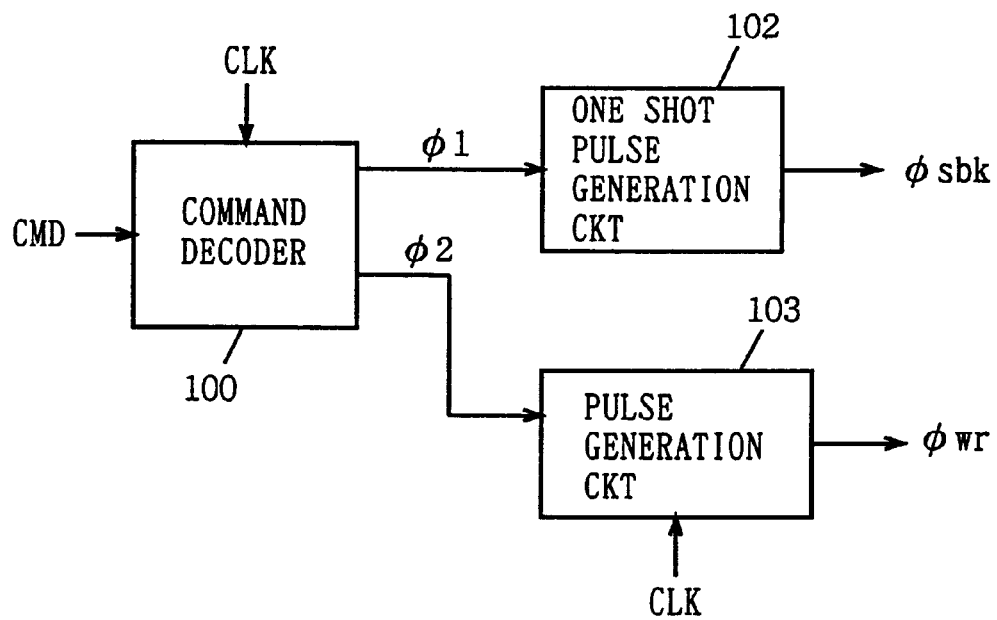
FIG. 50 is a diagram schematically showing an arrangement of an internal control signal generating portion of the semiconductor memory device in accordance with the eleventh embodiment of the present invention.

FIG. 50 is a diagram schematically showing an arrangement of a write/read circuit controlling portion. FIG. 50 includes: a one shot pulse generating circuit 102 responsive to a sub bank activation instruction signal φ1 from a command decoder 100 for generating a one-shot pulse signal having a prescribed time width; and a pulse generating circuit 103 responsive to a write operation mode instruction signal φ2 from command decoder 100 for generating one-shot pulse signal in each clock cycle for a period of a burst length when one clock cycle is elapsed after the write command is applied. Pulse generating circuit 103 includes a burst length counter which is not shown, and generates a pulse signal φwr having the prescribed time width in response to rising of clock signal CLK for the period of the burst length starting from the next clock cycle when write operation mode instruction signal φ2 is applied from command decoder 100. The structure described with reference to FIG. 43 in the above described tenth embodiment can be utilized for the portion generating selection signals φys and SBK in accordance with an address signal. As the kinds of commands increase (a write back command), the structure of the command decoder must slightly be changed accordingly. The overall structure is the same.

Figure 51:
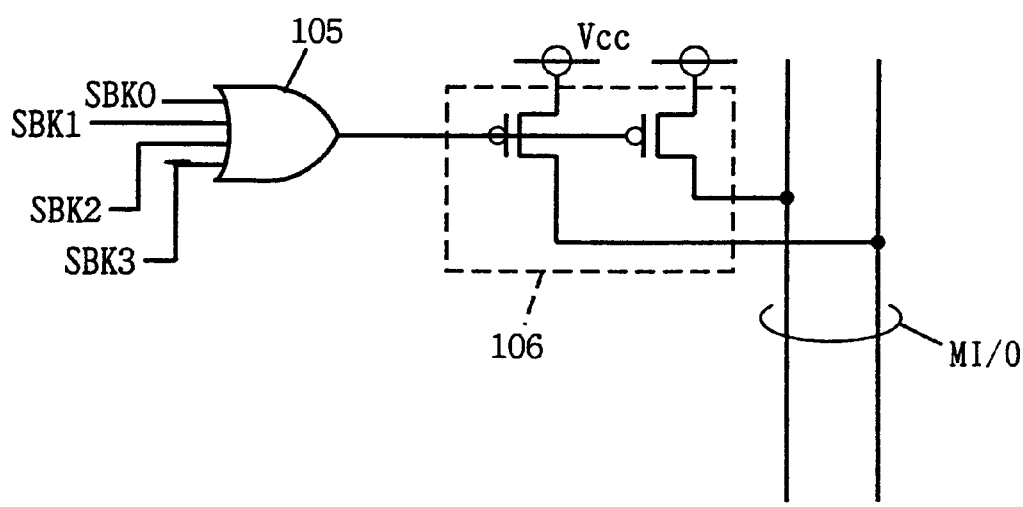
FIG. 51 is a diagram schematically showing an arrangement of a main I/O line pair precharging portion of the semiconductor memory device in accordance with the eleventh embodiment of the present invention.
Figure 52:
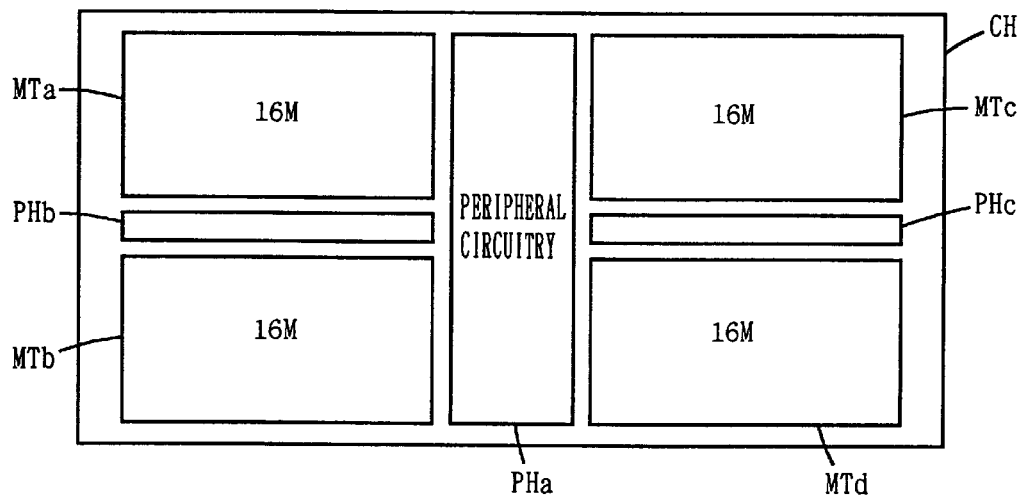
FIG. 52 is a diagram schematically showing an arrangement of an array of a conventional semiconductor memory device.
Figure 53:
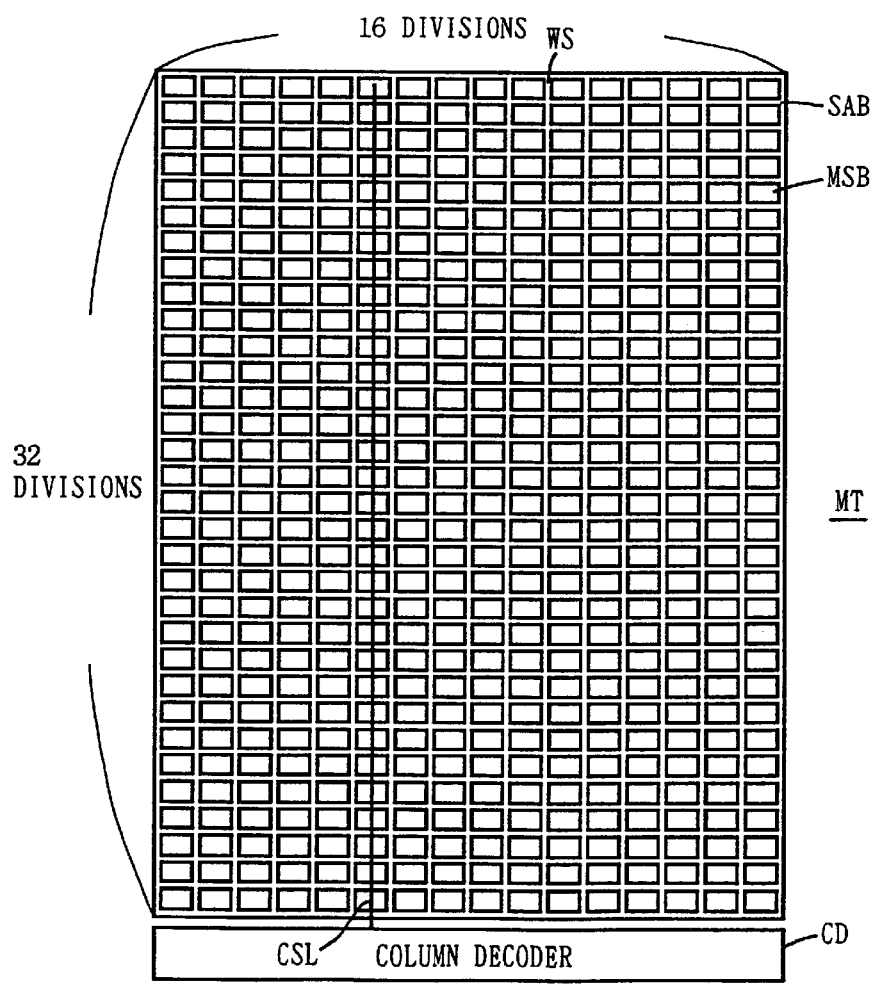
FIG. 53 is a diagram schematically showing in further detail a memory mat of the semiconductor memory device shown in FIG. 52.
Figure 54:
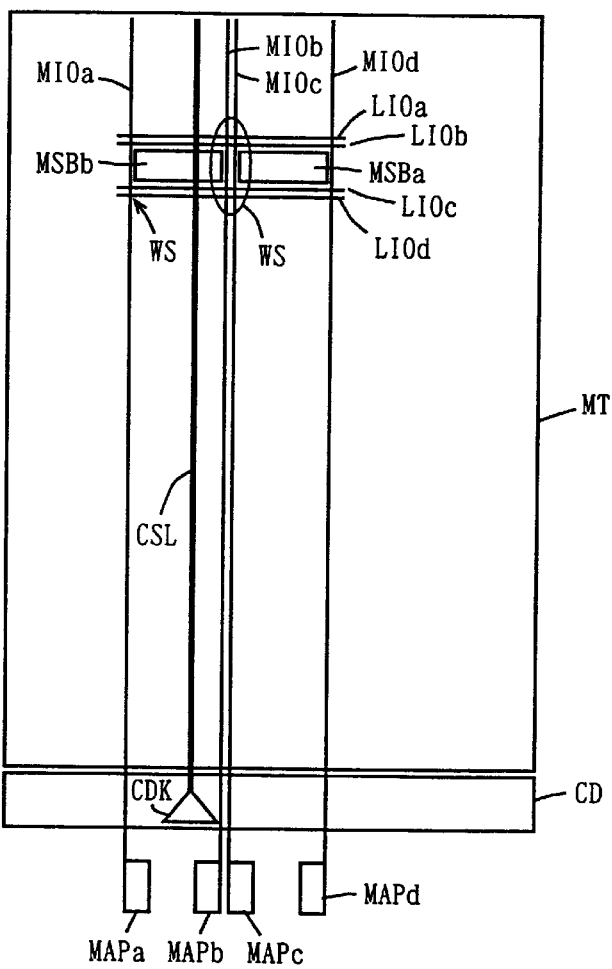
FIG. 54 is a diagram schematically showing an arrangement of an internal data line of the memory mat shown in FIG. 53.
Figure 55:
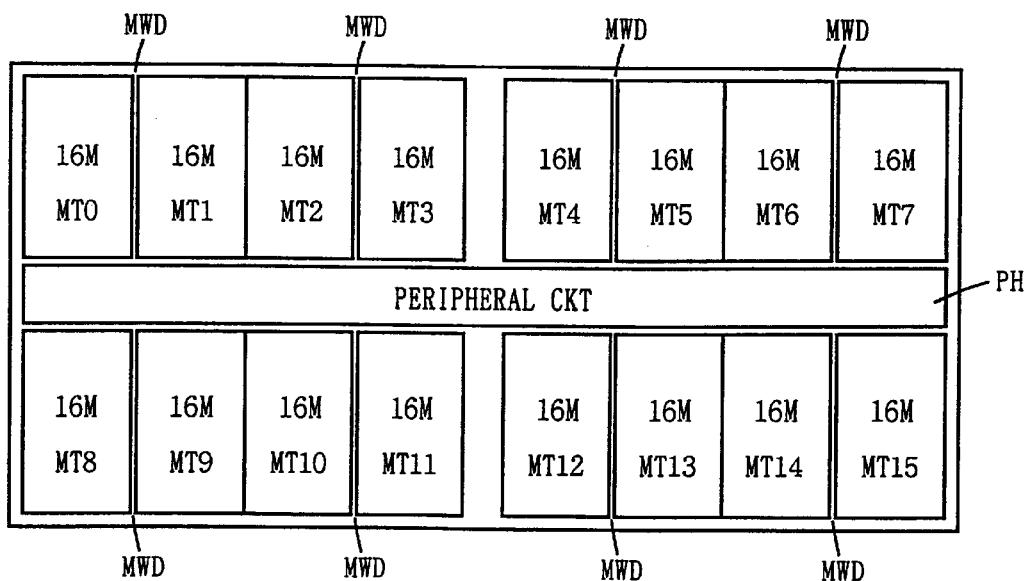
FIG. 55 is a diagram schematically showing an arrangement of another array of the conventional semiconductor memory device.
Figure 56:
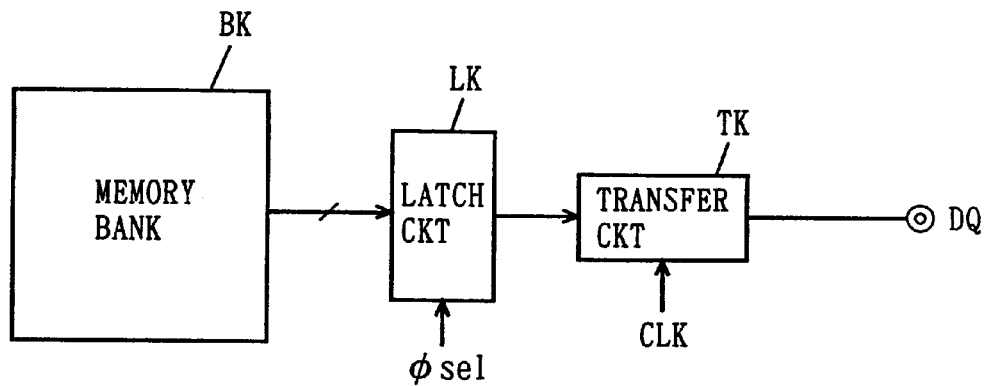
FIG. 56 is a diagram schematically showing an arrangement of an internal data transferring portion of the semiconductor memory device shown in FIG. 55.
Figure 57:
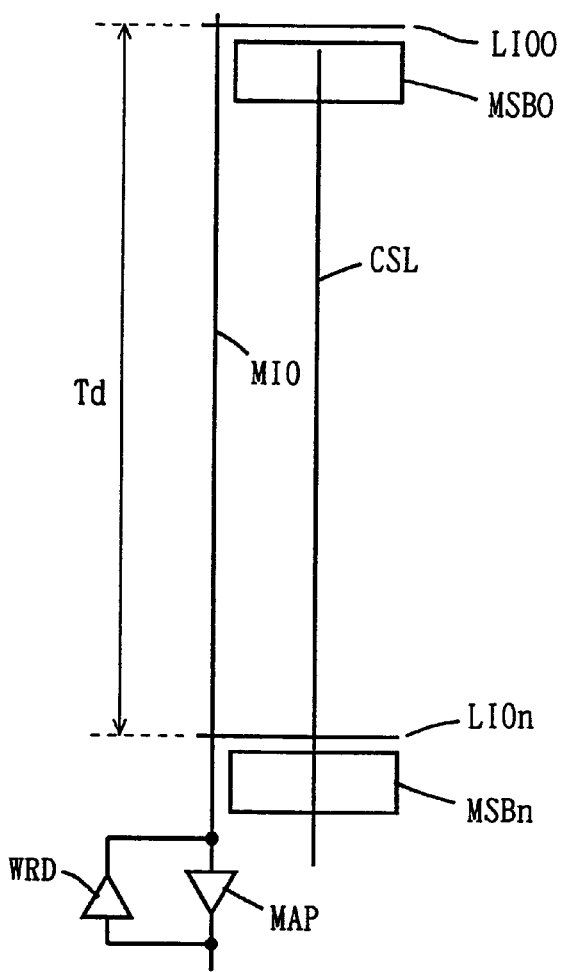
FIG. 57 is a diagram illustrating problem of the semiconductor memory device shown in FIG. 56.

In FIG. 51, an arrangement for precharging the main I/O line pair to the level of power supply voltage Vcc is shown. Referring to FIG. 51, a precharge circuit 106 precharging main I/O line pair MIO is controlled by an output signal from an OR circuit 105 receiving sub bank selection signals SBK0 to SBK3. OR circuit 105 outputs a signal at the H level for driving precharge circuit 106 into an inactive state and bringing main I/O line pair MIO into the floating state when one of sub bank selection signals SBK0 to SBK3 is in the selected state at the H level. On the other hand, when all of sub bank selection signals SBK0 to SBK3 are brought into the inactive state at the L level, the output signal from OR circuit 105 attains the L level, precharge circuit 106 is activated and each I/O line of main I/O line pair MI is precharged to the level of power supply voltage Vcc.

It is noted that an equalizing circuit may be further provided in the precharge circuit and the main I/O line pair may be precharged to the intermediate voltage level.

In the above described tenth and eleventh embodiments, an arrangement of the synchronous semiconductor memory device according to a so called 2-bit prefetch method is shown. In other words, 2-bit data is prefetched per one data input/output terminal and sequentially transferred in every clock cycle. However, alternatively, an arbitrary number of data can be simultaneously prefetched and sequentially transferred in synchronization with a clock signal, as shown in the above described first to ninth embodiments.

In addition, in the tenth and eleventh embodiments, an arrangement of a 256-M bit DRAM is exemplified. However, other storage capacity can be employed for the semiconductor memory device. Any arrangement can be employed if one memory mat is divided into a plurality of banks and a main I/O line pair is provided over a memory array and shared by the banks. In this case, the bank may differ every memory mat (a bank is comprised of a memory mat).

In addition, in the arrangement shown in the above mentioned FIGS. 49 and 50, the bank/mat address and sub bank selection signal are transmitted through a portion outside one side of the memory array. In the arrangement, however, a decoder may be arranged every memory sub block and a sense amplifier is selected by a corresponding decoding circuit in each of the sub blocks, as shown in the above described first to ninth embodiments.

Further, the arrangements of the tenth and the eleventh embodiments can be achieved by suitably combining the arrangement shown in the above described first to ninth embodiments.

As in the foregoing, according to the present invention, the decoding circuit is provided for each memory sub block and the sense amplifier is selected in each memory sub block so as to connect an array to a main I/O line pair provided in the column direction. Thus, an arbitrary number of data bits can be simultaneously selected without any increase in area occupied by the array. Further, as the decoding circuit is provided for each memory sub block, propagation delay of the data bit selection signal (the column selection signal) is reduced, thereby enabling fast column access.

Moreover, when the memory array is divided into a plurality of banks, the memory array and the internal bit line are isolated at the time of data access, thereby enabling fast data access.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device, comprising:
a memory array having a plurality of memory blocks each having a plurality of memory cells arranged in a matrix of rows and columns and aligned in row and column directions;
a plurality of column selection lines arranged in said column direction in each of a region outside said memory array and an inter-block region between adjacent memory blocks for transmitting column selection signals, each of said column selection signals designating a column in corresponding memory blocks aligned in the column direction along the column selection line when activated;
a plurality of internal data lines ranged extending in the column direction over said plurality of memory blocks and grouped into groups corresponding to column blocks each including memory blocks aligned in the column direction of said plurality of memory blocks; and
column selection circuits arranged corresponding to said memory blocks, each of the column selection circuits selecting a column of memory cells in a corresponding memory block for connection to one of the internal data lines of a corresponding group in accordance with the column selection signal on a corresponding column selection line, each of said column selection circuits including a decoding circuit arranged in said region outside the memory array or said inter-block region for generating a local column selection signal for a corresponding memory block in accordance with a row block designation signal designating the memory blocks aligned in the row direction and with the column selection signal on the column selection line arranged in a corresponding region.

2. The semiconductor memory device according to claim 1, wherein each of said decoding circuits is shared by the column selection circuits provided for the memory blocks arranged on opposite sides of the corresponding region in the row direction.

3. The semiconductor memory device according to claim 1, wherein said column selection circuits are arranged distributing on opposite sides of the corresponding memory blocks in the column direction.

4. The semiconductor memory device according to claim 1, wherein at least memory blocks aligned in said row direction form a bank, each of the banks having a row of the memory cells driven into a selected state independently of other banks, and
each of the column selection circuits performs a column selection operation upon activation of a bank designation signal designating a bank including a corresponding memory block.

5. The semiconductor memory device according to claim 1, further comprising a plurality of column decoding circuits arranged corresponding to said region outside the memory array and the inter-block regions on one side of said memory array in the column direction and activating the column selection signal on a corresponding column selection line addressed by a column address signal in accordance with an address signal.

6. The semiconductor memory device according to claim 5, wherein said plurality of column decoding circuits are grouped corresponding to the column blocks, each of said plurality of column decoding circuits activated in accordance with a column block designation signal designating a column block from said plurality of column blocks, for decoding the applied column address signal to produce the column selection signal.

7. The semiconductor memory device according to claim 1, wherein each of the decoding circuits is arranged on opposite sides of a corresponding memory block in the row direction and includes a plurality of decoders each transmitting the local column selection signal in opposite directions.

8. The semiconductor memory device according to claim 7, wherein said plurality of decoders each drive a common column selection line shared by the corresponding memory blocks.

9. The semiconductor memory device according to claim 7, wherein each of said plurality of memory blocks is divided into a plurality of groups in the row direction, and said plurality of decoders are provided corresponding to said plurality of groups and transmitting the local column selection signal for a corresponding group.

10. The semiconductor memory device according to claim 1, wherein the decoding circuit is arranged every prescribed number of memory blocks in an inter-block region in said column direction such that the decoding circuits are arranged in different positions in adjacent inter-block regions.

11. The semiconductor memory device according to claim 1, further comprising:

a plurality of read circuits provided corresponding to said column blocks, for amplifying data on internal data lines provided corresponding to the corresponding column blocks upon activation thereof, each of said read circuits including a plurality of read amplifiers provided corresponding to the internal data lines in a corresponding internal data line group; and a data selection circuit responsive to a data group identification signal identifying a group of the internal data lines for enabling the read amplifiers provided for the group designated by said data group identification signal for reading data onto a global data bus provided separately from the internal data lines.

12. The semiconductor memory device according to claim 1, further comprising a plurality of write/read circuits provided corresponding to said plurality of column blocks for transferring data with the internal data lines provided for corresponding column blocks upon activation, each of the write/read circuits including a plurality of read amplifiers and write drivers transmitting write data provided corresponding to the internal data lines of a corresponding group; and a data selection circuit responsive to a data group identification signal identifying a group of the internal data lines for enabling data communication between the write/read circuits provided for the group designated by said data group identification signal and a global data bus provided separately from said plurality of internal data lines.

13. The semiconductor memory device according to claim 2, further comprising a plurality of sense amplifier groups each including a plurality of sense amplifiers provided corresponding to the columns and arranged at least between memory blocks adjacent in the column direction, a sense amplifier group being shared between corresponding adjacent memory blocks.

14. The semiconductor memory device according to claim 3, further comprising a plurality of sense amplifier groups each including a plurality of sense amplifiers provided corresponding to the columns and arranged at least between memory blocks adjacent in the column direction, a sense amplifier group being shared between corresponding adjacent memory blocks.

* * * * *